(12) United States Patent
Kurokawa

(10) Patent No.: US 9,704,899 B2
(45) Date of Patent: Jul. 11, 2017

(54) IMAGING DEVICE AND ELECTRONIC DEVICE

(71) Applicant: Semiconductor Energy Laboratory Co., Ltd., Kanagawa-ken (JP)

(72) Inventor: Yoshiyuki Kurokawa, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 14/921,175

(22) Filed: Oct. 23, 2015

(65) Prior Publication Data

US 2016/0118425 A1 Apr. 28, 2016

(30) Foreign Application Priority Data

Oct. 24, 2014 (JP) .................... 2014-217221

(51) Int. Cl.
| | |
|---|---|
| *H01L 29/10* | (2006.01) |
| *H01L 27/146* | (2006.01) |
| *H01L 27/12* | (2006.01) |
| *H01L 29/24* | (2006.01) |
| *H01L 31/0272* | (2006.01) |

(52) U.S. Cl.
CPC .... *H01L 27/14616* (2013.01); *H01L 27/1225* (2013.01); *H01L 27/1233* (2013.01); *H01L 27/1255* (2013.01); *H01L 27/14632* (2013.01); *H01L 27/14634* (2013.01); *H01L 27/14641* (2013.01); *H01L 27/14645* (2013.01); *H01L 27/14667* (2013.01); *H01L 29/24* (2013.01); *H01L 31/0272* (2013.01)

(58) Field of Classification Search
CPC ........... H01L 27/14616; H01L 27/1225; H01L 27/1233; H01L 27/1255; H01L 27/14632; H01L 27/14634; H01L 27/14641; H01L 27/14645; H01L 27/14667; H01L 29/24; H01L 31/0272

See application file for complete search history.

(56) References Cited

U.S. PATENT DOCUMENTS

| | | | |
|---|---|---|---|
| 8,378,403 B2 | 2/2013 | Kato | |
| 8,654,231 B2 | 2/2014 | Kurokawa et al. | |
| 9,147,706 B2 | 9/2015 | Koyama et al. | |
| 2012/0161220 A1* | 6/2012 | Yamazaki | ........... H01L 27/1156 257/296 |
| 2013/0258746 A1 | 10/2013 | Kurokawa | |

(Continued)

FOREIGN PATENT DOCUMENTS

| | | |
|---|---|---|
| JP | 2007-096055 | 4/2007 |
| JP | 2007-096055 A | 4/2007 |

(Continued)

*Primary Examiner* — Victor A Mandala
*Assistant Examiner* — Colleen E Snow
(74) *Attorney, Agent, or Firm* — Husch Blackwell LLP

(57) ABSTRACT

An imaging device with excellent imaging performance is provided. In the imaging device, a first layer, a second layer, and a third layer have a region overlapping with one another, the first layer and the second layer each include transistors, and the third layer includes a photoelectric conversion element. Off-state currents of the transistors formed in the first layer are lower than those of the transistors formed in the second layer, and field-effect mobilities of the transistors formed in the second layer are higher than those of the transistors formed in the first layer.

22 Claims, 44 Drawing Sheets

(56) References Cited

U.S. PATENT DOCUMENTS

| | | |
|---|---|---|
| 2015/0255139 A1 | 9/2015 | Atsumi et al. |
| 2015/0263053 A1 | 9/2015 | Yamazaki et al. |
| 2015/0279884 A1 | 10/2015 | Kusumoto |
| 2015/0311245 A1 | 10/2015 | Yamazaki et al. |
| 2016/0071840 A1 | 3/2016 | Yamamoto et al. |

FOREIGN PATENT DOCUMENTS

| | | |
|---|---|---|
| JP | 2007-123861 | 5/2007 |
| JP | 2011-119711 | 6/2011 |
| JP | 2013-243355 | 12/2013 |

\* cited by examiner

FIG. 8A

| 1100 |
|---|
| 1200 |
| 1300 |

FIG. 8B

| 1200 |
|---|
| 1100 |
| 1300 |

FIG. 8C

| 1300 |
|---|
| 1100 |
| 1200 |
| 1400 |

FIG. 8D

| 1300 |
|---|
| 1200 |
| 1100 |
| 1400 |

FIG. 8E

| 1300 |
|---|
| 1100 |
| 1200 |
| 1500 |
| 1400 |

FIG. 8F

| 1300 |
|---|
| 1200 |
| 1100 |
| 1500 |
| 1400 |

FIG. 10A

| 1100 |
|---|
| 1200 |
| 1300 |
| 1600 |

FIG. 10B

| 1200 |
|---|
| 1100 |
| 1300 |
| 1600 |

FIG. 10C

| 1600 |
|---|
| 1300 |
| 1100 |
| 1200 |
| 1400 |

FIG. 10D

| 1600 |
|---|
| 1300 |
| 1200 |
| 1100 |
| 1400 |

FIG. 10E

| 1600 |
|---|
| 1300 |
| 1100 |
| 1200 |
| 1500 |
| 1400 |

FIG. 10F

| 1600 |
|---|
| 1300 |
| 1200 |
| 1100 |
| 1500 |
| 1400 |

FIG. 11A1
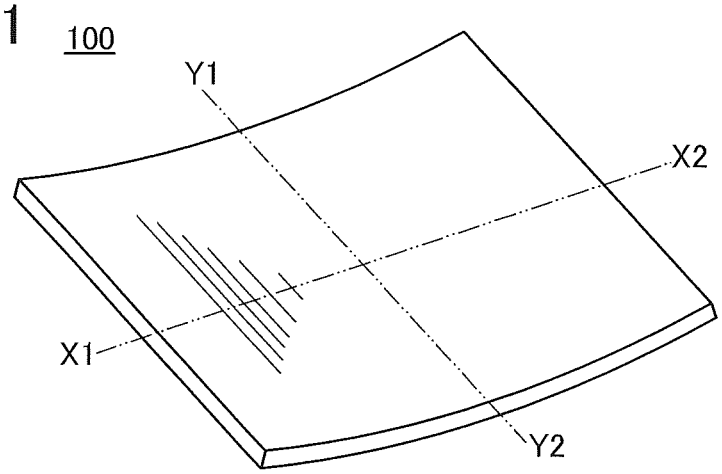
FIG. 11A2
FIG. 11A3
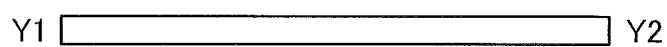
FIG. 11B1
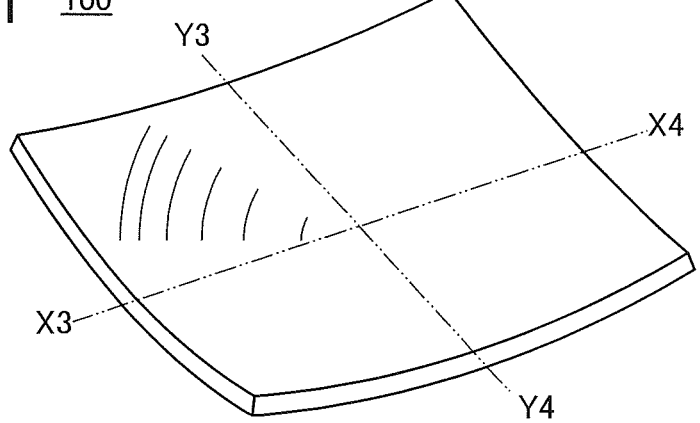
FIG. 11B2
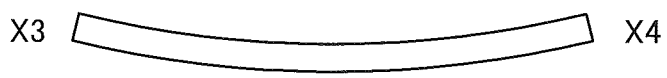
FIG. 11B3

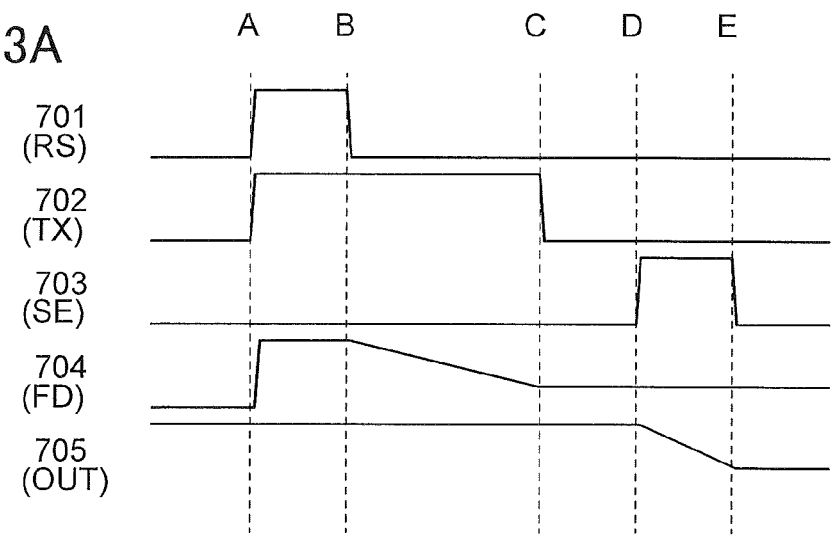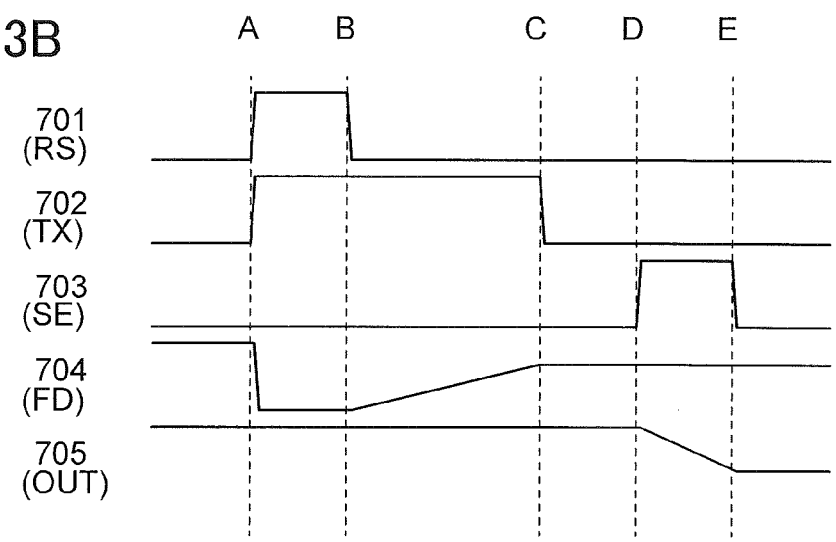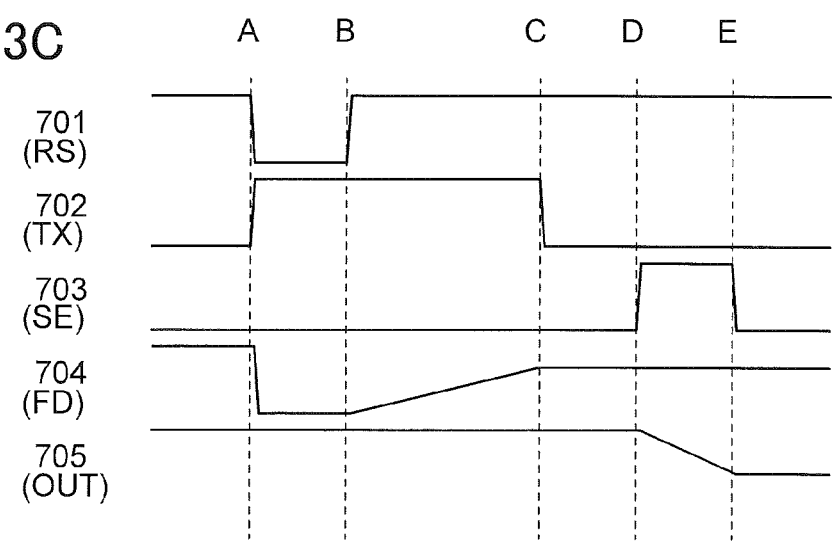

H1　　　　　　　　　　H2
　　120　173　107

I1　　　　　　　　　　I2
　　120　173　108

J1　　　　　　　　　　J2
　　120　173　109

K1　　　　　　　　　　K2
　　120　173　104

L1　　　　　　　　　　L2
　　120　173　105

M1　　　　　　　　　　M2
　　120　173　106

IMAGING DEVICE AND ELECTRONIC DEVICE

BACKGROUND OF THE INVENTION

1. Field of the Invention

One embodiment of the present invention relates to an imaging device including an oxide semiconductor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) and a display device. Although silicon-based semiconductors have been widely used as semiconductor materials which can be used for the transistors, oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

Patent Document 3 discloses an imaging device where a transistor including an oxide semiconductor with an extremely low off-state current is used in part of a pixel circuit and a transistor including silicon with which a complementary metal oxide semiconductor (CMOS) circuit can be formed is used in a peripheral circuit.

Patent Document 4 discloses an imaging device in which a transistor including silicon, a transistor including an oxide semiconductor, and a photodiode including a crystalline silicon layer are stacked.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119711
[Patent Document 4] Japanese Published Patent Application No. 2013-243355

SUMMARY OF THE INVENTION

Transistors are sometimes required to have different characteristics even in the same one circuit. For example, an amplifier transistor of a pixel in an image sensor preferably has high on-state current characteristics. In contrast, a transfer transistor connected to a photodiode preferably has low off-state current characteristics. Thus, to form a high-performance imaging device, it is desired to separately form transistors having required different characteristics.

In view of the above circumstances, an object of one embodiment of the present invention is to provide an imaging device with excellent imaging performance. Another object is to provide an imaging device including transistors that are formed using different materials. Another object is to provide an imaging device in which transistors that are formed using different materials are stacked. Another object is to provide an imaging device that is suitable for high-speed operation. Another object is to provide an imaging device with high resolution. Another object is to provide a highly integrated imaging device. Another object is to provide an imaging device with low power consumption. Another object is to provide an imaging device capable of taking an image under a low illuminance condition. Another object is to provide an imaging device with a wide dynamic range. Another object is to provide an imaging device which can be used in a wide temperature range. Another object is to provide an imaging device with a high aperture ratio. Another object is to provide an imaging device with high reliability. Another object is to provide a novel imaging device or the like. Another object is to provide a novel semiconductor device or the like.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention relates to an imaging device including transistors formed using oxide semiconductors.

One embodiment of the present invention is an imaging device including a first layer, a second layer, and a third layer. In the imaging device, the first layer, the second layer, and the third layer overlap with one another, the first layer includes a first transistor and a second transistor, the second layer includes a third transistor and a fourth transistor, each of active layers of the first transistor, the second transistor, the third transistor, and the fourth transistor includes an oxide semiconductor, and the third layer includes a photoelectric conversion element. One of a source and a drain of the first transistor is electrically connected to one of a source and a drain of the second transistor, the one of the source and the drain of the second transistor is electrically connected to a gate of the third transistor, one of a source and a drain of the third transistor is electrically connected to one of a source and a drain of the fourth transistor, and one electrode of the photoelectric conversion element is electrically connected to the other one of the source and the drain of the first transistor. Off-state currents of the first transistor and the second transistor are lower than those of the third transistor and the fourth transistor, and field-effect mobilities of the third transistor and the fourth transistor are higher than those of the first transistor and the second transistor.

In the above-described embodiment, the first layer, the second layer, and the third layer can be arranged in an order of the first layer, the second layer, and the third layer in a height direction or in an order of the second layer, the first layer, and the third layer in a height direction.

Another embodiment of the present invention is an imaging device including a stack that includes a first layer, a second layer, a third layer, and a fourth layer. In the imaging device, the first layer, the second layer, the third layer, and the fourth layer overlap with one another, the first layer includes a photoelectric conversion element, the second layer includes a first transistor and a second transistor, the third layer includes a third transistor and a fourth transistor, the fourth layer includes a fifth transistor, each of active layers of the first transistor, the second transistor, the third transistor, and the fourth transistor includes an oxide semiconductor, and an active region of the fifth transistor or an active layer of the fifth transistor includes silicon. The first transistor, the second transistor, the third transistor, and the fourth transistor form a first circuit, and the fifth transistor forms a second circuit. One of a source and a drain of the first transistor is electrically connected to one of a source and a drain of the second transistor, the one of the source and the drain of the second transistor is electrically connected to a gate of the third transistor, one of a source and a drain of the third transistor is electrically connected to one of a source and a drain of the fourth transistor, and one electrode of the photoelectric conversion element is electrically connected to the other one of the source and the drain of the first transistor. Off-state currents of the first transistor and the second transistor are lower than those of the third transistor and the fourth transistor, and field-effect mobilities of the third transistor and the fourth transistor are higher than those of the first transistor and the second transistor.

Another embodiment of the present invention is an imaging device including a stack that includes a first layer, a second layer, a third layer, and a fourth layer. In the imaging device, the first layer, the second layer, the third layer, and the fourth layer overlap with one another, the first layer includes a photoelectric conversion element, the second layer includes a first transistor and a second transistor, the third layer includes a third transistor, a fourth transistor, and a fifth transistor, the fourth layer includes a sixth transistor, each of active layers of the first transistor, the second transistor, the third transistor, the fourth transistor, and the fifth transistor includes an oxide semiconductor, and an active region of the sixth transistor or an active layer of the sixth transistor includes silicon. The first transistor, the second transistor, the third transistor, and the fourth transistor form a first circuit, and the fifth transistor and the sixth transistor form a second circuit. One of a source and a drain of the first transistor is electrically connected to one of a source and a drain of the second transistor, the one of the source and the drain of the second transistor is electrically connected to a gate of the third transistor, one of a source and a drain of the third transistor is electrically connected to one of a source and a drain of the fourth transistor, and one electrode of the photoelectric conversion element is electrically connected to the other one of the source and the drain of the first transistor. Off-state currents of the first transistor and the second transistor are lower than those of the third transistor, the fourth transistor, and the fifth transistor, and field-effect mobilities of the third transistor, the fourth transistor, and the fifth transistor are higher than those of the first transistor and the second transistor.

In the embodiment including the first to fourth layers, the first layer, the second layer, the third layer, and the fourth layer can be arranged in an order of the first layer, the second layer, the third layer, and the fourth layer in a height direction or in an order of the first layer, the third layer, the second layer, and the fourth layer in a height direction.

Furthermore, one of a source and a drain of the first transistor may be electrically connected to one electrode of a capacitor.

Furthermore, the oxide semiconductor preferably includes In, Zn, and M (M is Al, Ti, Ga, Sn, Y, Zr, La, Ce, Nd, or Hf).

Furthermore, the photoelectric conversion element may include a photoelectric conversion layer including selenium or a compound containing selenium.

Therefore, with one embodiment of the present invention, an imaging device with excellent imaging performance can be provided. An imaging device including transistors that are formed using different materials can be provided. An imaging device in which transistors that are formed using different materials are stacked can be provided. An imaging device that is suitable for high-speed operation can be provided. An imaging device with high resolution can be provided. A highly integrated imaging device can be provided. An imaging device with low power consumption can be provided. An imaging device capable of taking an image under a low illuminance condition can be provided. An imaging device with a wide dynamic range can be provided. An imaging device which can be used in a wide temperature range can be provided. An imaging device with a high aperture ratio can be provided. An imaging device with high reliability can be provided. A novel imaging device or the like can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 8A to 8F each illustrate a stacking state of an imaging device;

FIGS. 10A to 10F each illustrate a stacking state of an imaging device;

FIGS. 11A1, 11A2, 11A3, 11B1, 11B2, and 11B3 illustrate bent imaging devices;

FIGS. 13A to 13C are timing charts each illustrating the operation of a pixel circuit;

DETAILED DESCRIPTION OF THE INVENTION

Figure 1A:
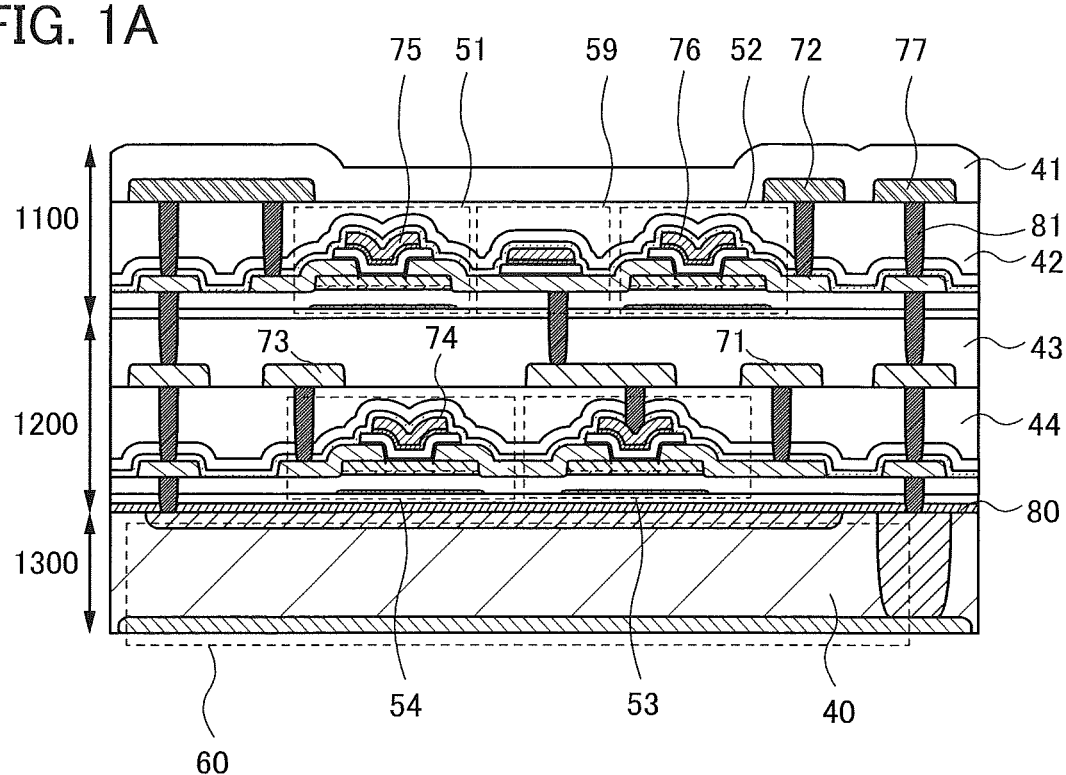
FIGS. 1A and 1B are a cross-sectional view and a circuit diagram illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, another connection relation is included in the drawings or the texts, without being limited to a predetermined connection relation, for example, the connection relation illustrated in the drawings and the texts.

Here, X and Y each denote an object (e.g., a device, an element, a circuit, a wiring, an electrode, a terminal, a conductive film, and a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, an imaging device that is one embodiment of the present invention is described with reference to drawings.

Figure 1B:
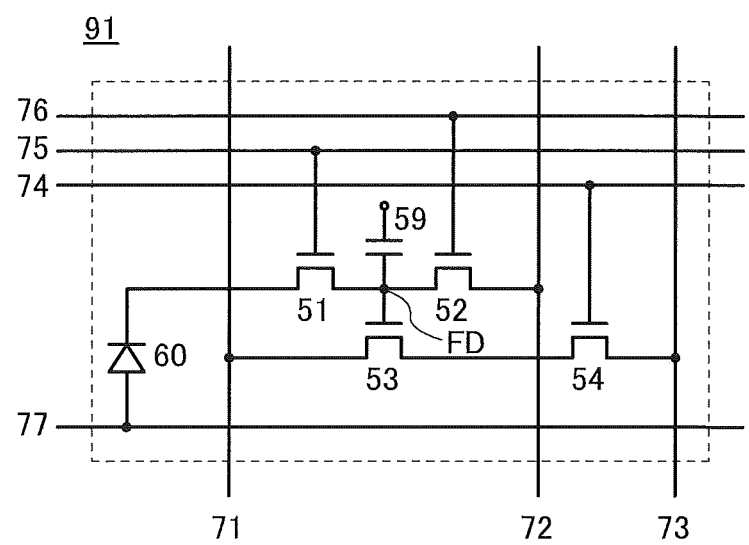

FIG. 1A is a cross-sectional view illustrating an example of a structure of a pixel in an imaging device of one embodiment of the present invention in a region where a circuit 91 illustrated in FIG. 1B is formed.

The imaging device includes a layer 1100 including a transistor 51, a transistor 52, and the like, a layer 1200 including a transistor 53, a transistor 54, and the like, and a layer 1300 including a photoelectric conversion element 60.

Although a photodiode formed using a silicon substrate 40 is illustrated as the photoelectric conversion element 60 in FIG. 1A as an example, photoelectric conversion elements having other structures to be described later may also be used.

The layer 1100, the layer 1200, and the layer 1300 can be arranged in this order in the height direction as illustrated in FIG. 1A and FIG. 8A. Alternatively, they can be arranged in an order of the layer 1200, the layer 1100, and the layer 1300 in the height direction as illustrated in FIG. 8B. Furthermore, another layer may be included in the stacked-layer structure. Furthermore, one or more of the layers in the stacked-layer structure may be omitted.

In the circuit 91, one of a source electrode and a drain electrode of the transistor 51 is electrically connected to one electrode of the photoelectric conversion element 60. The other of the source electrode and the drain electrode of the transistor 51 is electrically connected to a gate electrode of the transistor 53. The other of the source electrode and the drain electrode of the transistor 51 is electrically connected to one of a source electrode and a drain electrode of the transistor 52. One of a source electrode and a drain electrode of the transistor 53 is electrically connected to one of a source electrode and a drain electrode of the transistor 54. Although FIGS. 1A and 1B illustrate an example in which the other of the source electrode and the drain electrode of the transistor 51 is electrically connected to one electrode of a capacitor 59, a structure without the capacitor 59 is also possible. Note that the above-described electrical connection between the components is only one example.

Although wirings, electrodes, and conductors 81 are illustrated as independent components in the drawings in this embodiment, in the case where such components are electrically connected to each other, they may be provided as one component. Moreover, the structure in which the gate electrodes, the source electrodes, or the drain electrodes of the transistors are connected to wirings through the conductors 81 is only an example, and there is a case in which the gate electrodes, the source electrodes, and the drain electrodes of the transistors function as wirings. Furthermore, there are a case in which one or more of the wirings illustrated in the drawings are not provided and a case in which another wiring or transistor is included in any of the layers.

Insulating layers 41 to 44 and the like each functioning as a protective film, an interlayer insulating film, or a planarization film are provided over the components. For example, the insulating layers 41 to 44 and the like can be each formed using an inorganic insulating film such as a silicon oxide film or a silicon oxynitride film, an organic insulating film such as an acrylic resin film or a polyimide resin film, or the like. Top surfaces of the insulating layers 41 to 44 and the like are preferably subjected to planarization treatment as necessary by chemical mechanical polishing (CMP) or the like.

One of a wiring 71 and a wiring 73 can function as a power supply line, and the other can function as an output line. A wiring 72 can function as a power supply line. A wiring 77 can function as a power supply line (lower potential). Wirings 74, 75, and 76 can function as signal lines that control on/off of the transistors. The wiring 74 can function as a connection wiring.

The transistor 51 can function as a transfer transistor for controlling the potential of a charge storage portion (FD) in response to the output of the photoelectric conversion element 60. The transistor 52 can function as a reset transistor for initializing the potential of the charge storage portion (FD). The transistor 53 can function as an amplifier transistor configured to output a signal corresponding to the potential of the charge storage portion (FD). The transistor 54 can function as a selection transistor that selects a pixel.

Figure 42A:
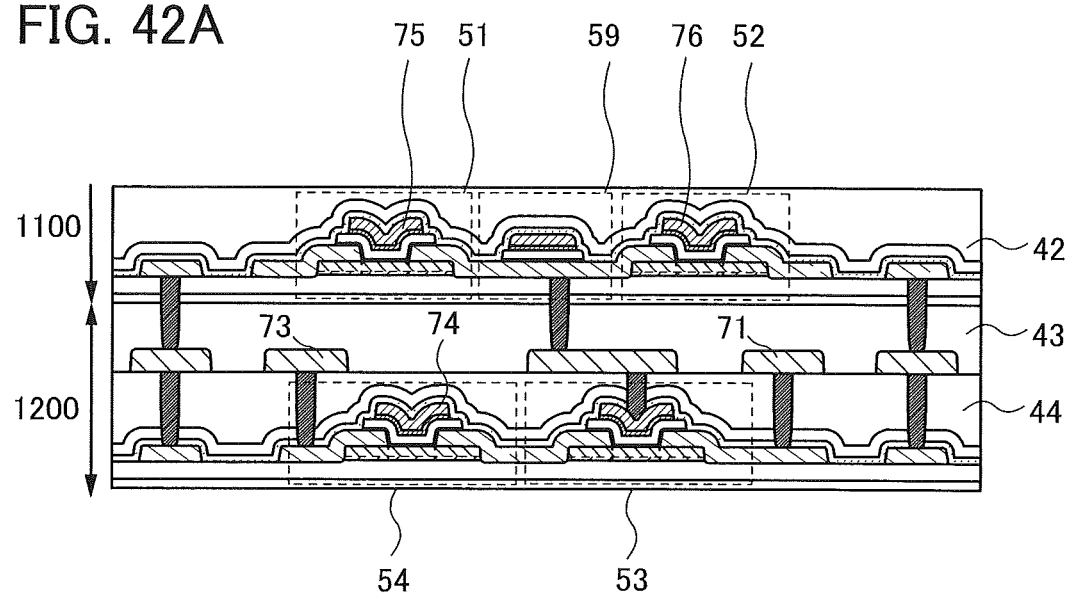
FIGS. 42A and 42B are cross-sectional views each illustrating a structure of a transistor.
Figure 42B:
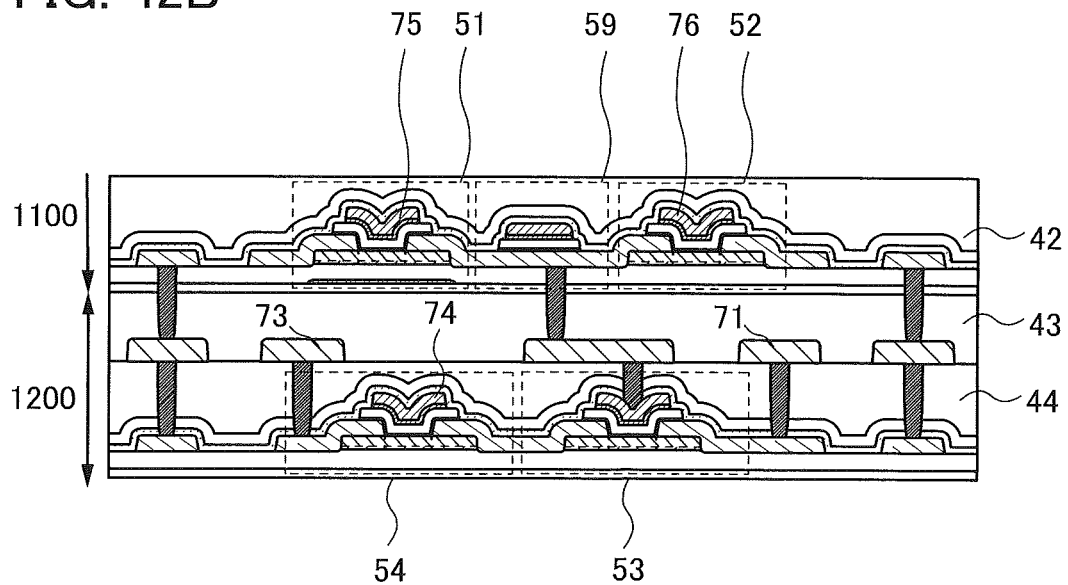

Although each transistor in FIG. 1A has a backgate, transistors not provided with backgates as illustrated in FIG. 42A may also be employed. Alternatively, as illustrated in FIG. 42B, some transistors, e.g., only the transistor 51, may be provided with a backgate. In some cases, a backgate of a transistor is electrically connected to a front gate of the transistor, which is provided to face the backgate. In some cases, a backgate is supplied with a fixed potential that is different from the potential supplied to a front gate of the transistor. Note that these descriptions on the existence of backgates can be applied to other imaging devices described in this embodiment.

Transistors including active layers formed of oxide semiconductors (hereinafter referred to as OS transistors) can be used as the transistors 51 to 54.

Extremely low off-state current characteristics of an OS transistor can widen the dynamic range of imaging. In the circuit configuration illustrated in FIG. 1B, an increase in the intensity of light entering the photoelectric conversion element 60 reduces the potential of the charge storage portion (FD). For example, even when the gate potential (the potential of the charge storage portion (FD)) is extremely low, the low off-state current characteristics of the transistor 53 allow accurate output of a current corresponding to the gate potential. Thus, the detection range of illuminance, i.e., the dynamic range can be widened.

Owing to the low off-state current characteristics of the transistors 51 and 52, a period during which charges can be retained in the charge storage portion (FD) can be extremely long. Therefore, a global shutter system, in which charge storage operation is performed in all the pixels at the same time, can be used without a complicated circuit configuration and operation method, and thus, an image with little distortion can be easily obtained even in the case of a moving object.

In addition, the OS transistor has lower temperature dependence of change in electrical characteristics than a transistor having a channel region formed of silicon (hereinafter referred to as a Si transistor), and thus can be used at an extremely wide range of temperatures. Therefore, an imaging device and a semiconductor device which include the OS transistors are suitable for use in automobiles, aircrafts, and spacecrafts.

Since the OS transistor has higher drain withstand voltage than the Si transistor, the imaging device can have high reliability.

Here, in order to further widen the dynamic range of the imaging device, it is preferable to use transistors having higher on-state current as the transistor 53 and the transistor 54 that is on the current path. Moreover, to further increase the period during which charges can be retained in the charge storage portion (FD), it is preferable to use transistors having lower off-state current as the transistors 51 and 52.

Therefore, it is preferable to separately form the transistors 51 and 52 and the transistors 53 and 54 so as to have their optimum electrical characteristics.

For this reason, in one embodiment of the present invention, those transistors are separately formed with the arrangement in which the layer 1100 including the transistors 51 and 52 and the layer 1200 including the transistors 53 and 54 have an overlapping region as illustrated in FIG. 1A.

Overall, it is preferable that transistors have electrical characteristics of both low off-state current and high on-state current. However, they are in a trade-off relationship; in general, a transistor with a low off-state current has a low on-state current, and a transistor with a high on-state current has a high off-state current. Note that the off-state current is a current that flows between a source and a drain when the transistor is in an off state, and the on-state current is a current that flows between a source and a drain when the transistor is in an on state.

In other words, in one embodiment of the present invention, the transistors 51 and 52 included in the layer 1100 have lower off-state current characteristics than the transistors 53 and 54 included in the layer 1200. Furthermore, the transistors 53 and 54 included in the layer 1200 have higher on-state current characteristics than the transistors 51 and 52 included in the layer 1100.

For example, in order to form a transistor with low off-state current, an In—Ga—Zn oxide having a relatively large bandgap with an atomic ratio of In:Ga:Zn=1:1:1, 1:3:2, or the like is preferably used as an oxide semiconductor in an active layer. Furthermore, a stacked-layer structure in which oxide semiconductors with atomic ratios of In:Ga:Zn=1:3:2, 1:1:1, and 1:3:2 are stacked in this order may be employed.

In this stacked-layer structure, the oxide semiconductor with an atomic ratio of 1:3:2 on the gate electrode side may be replaced by gallium oxide. The thickness of the oxide semiconductor is preferably small for the same reason for changing the channel width. Furthermore, it is preferable to set the thickness of the gate insulating film relatively large.

For example, in order to form a transistor with a high on-state current, an In—Ga—Zn oxide having a relatively small bandgap with an atomic ratio of In:Ga:Zn=3:1:2, 2:1:3, 4:1:4.1, or the like is preferably used as an oxide semiconductor in an active layer. Furthermore, a stacked-layer structure in which any of these oxide semiconductors is sandwiched between oxide semiconductors with an atomic ratio of In:Ga:Zn=1:3:2 or the like may be used. Alternatively, an oxide semiconductor such as zinc oxide or an In—Sn—Zn oxide may be used. The thickness of the oxide semiconductor is preferably large for the same reason for changing the channel width. Furthermore, it is preferable to set the thickness of the gate insulating film relatively small.

In summary, the following relative conditions are preferably satisfied: active layers of the transistors 51 and 52 included in the layer 1100 have larger bandgaps than active layers of the transistors 53 and 54 included in the layer 1200.

Furthermore, the following relative conditions are preferably satisfied: the active layers of the transistors 51 and 52 included in the layer 1100 are thinner than the active layers of the transistors 53 and 54 included in the layer 1200.

Furthermore, the following relative conditions are preferably satisfied: gate insulating films of the transistors 51 and 52 included in the layer 1100 are thicker than gate insulating films of the transistors 53 and 54 included in the layer 1200.

With these structures, the imaging device can have excellent imaging characteristics.

Figure 2A:
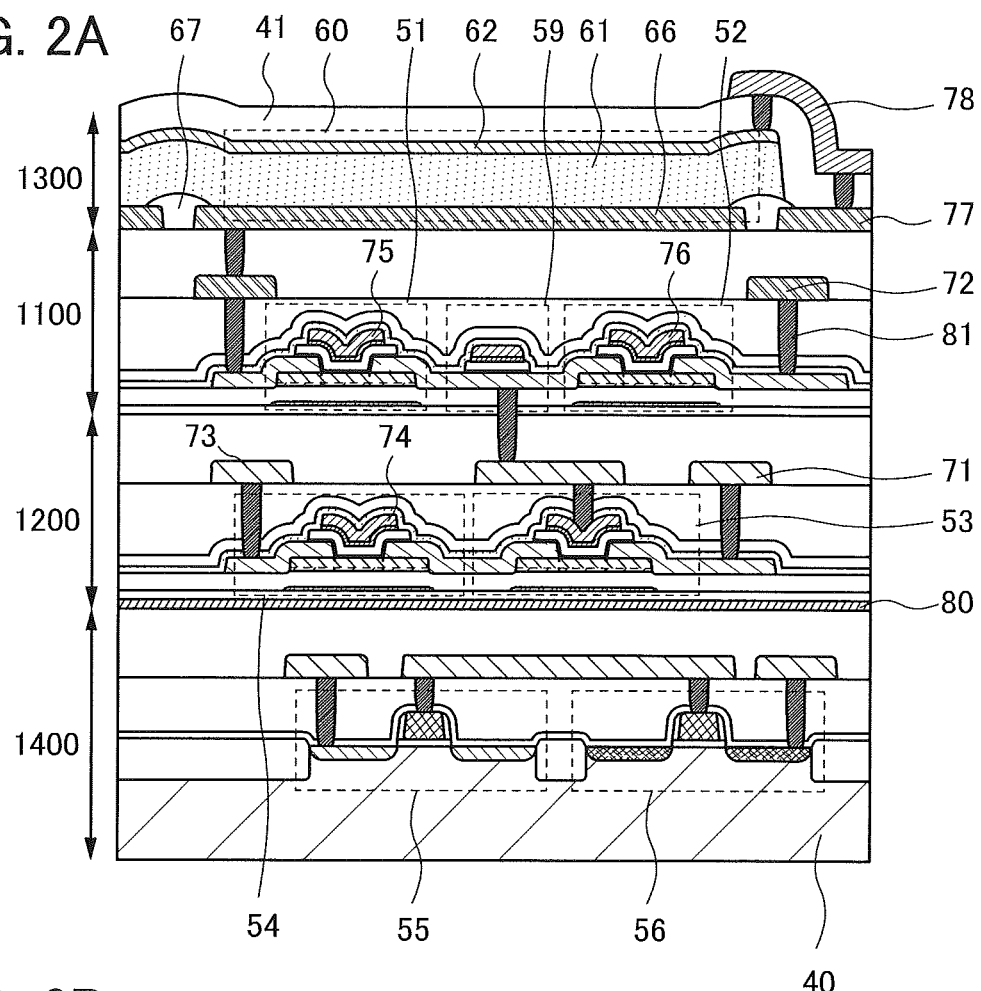
FIGS. 2A to 2C are cross-sectional views and a circuit diagram illustrating an imaging device.

The imaging device of one embodiment of the present invention can also have a structure illustrated in FIG. 2A.

The imaging device illustrated in FIG. 2A includes the layer 1100 including the transistor 51, the transistor 52, and the like, the layer 1200 including the transistor 53, the transistor 54, and the like, the layer 1300 including the photoelectric conversion element 60, and a layer 1400 including a transistor 55, a transistor 56, and the like provided on the silicon substrate 40. The transistors and the photoelectric conversion element 60 can have an electrical contact with wirings through the conductors 81 embedded in the insulating layers.

Although an element including selenium as a photoelectric conversion layer 61 is used as the photoelectric conversion element 60 provided in the layer 1300 in FIG. 2A, a photodiode formed using the silicon substrate illustrated in FIG. 1A can also be employed as well.

The photoelectric conversion element 60 including a selenium-based material in the photoelectric conversion layer 61 has high external quantum efficiency with respect to visible light. This photoelectric conversion element can be a highly sensitive photosensor having large amplification of electrons with respect to the amount of incident light by means of avalanche multiplication. That is, by using a selenium-based material in the photoelectric conversion layer 61, enough photocurrent can be obtained even when the pixel area is reduced. Furthermore, a photoelectric conversion element (PD) that uses a selenium-based material is suitable for imaging in a low illuminance environment because of its high photosensitivity. Furthermore, the selenium-based material has a high light-absorption coefficient, which leads to an advantage that the photoelectric conversion layer 61 can be formed thin easily.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than amorphous selenium.

Although the photoelectric conversion layer 61 is illustrated as a single layer, gallium oxide, cerium oxide, or the like as a layer that blocks injection of holes may be provided on the light reception side of the selenium-based material, and nickel oxide, antimony sulfide, or the like as an layer that blocks injection of electrons may be provided on the electrode 66 side.

Furthermore, the photoelectric conversion layer 61 may be a layer including a compound of copper, indium, and selenium (CIS). Alternatively, a layer including a compound of copper, indium, gallium, and selenium (CIGS) may be used. With the CIS or CIGS, a photoelectric conversion element that can utilize avalanche multiplication as in the case of using a single layer of selenium can be formed.

In the photoelectric conversion element 60 that uses the selenium-based material, for example, the photoelectric conversion layer 61 can be provided between a light-transmitting conductive layer 62 and the electrode 66 formed of a metal material or the like. Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain withstand voltage than the Si transistor, the application of a relatively high voltage to the photoelectric conversion element is easy. Thus, by combination of the OS transistor having high drain withstand voltage and the photoelectric conversion element including the selenium-based material in the photoelectric conversion layer, a highly sensitive and highly reliable imaging device can be obtained.

Figure 3A:
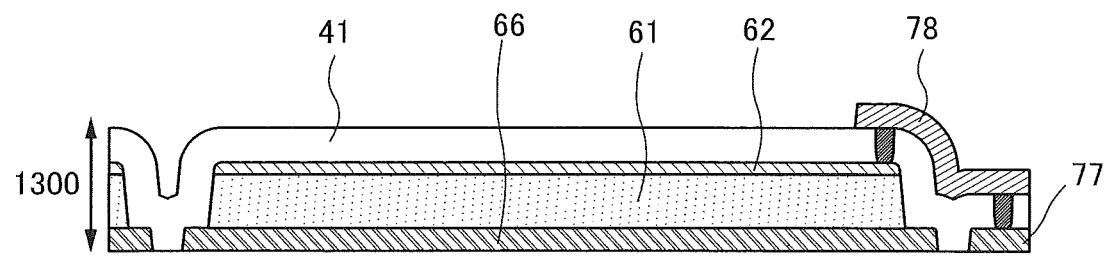
FIGS. 3A to 3D are cross-sectional views each illustrating a connection configuration of a photoelectric conversion element.
Figure 3B:
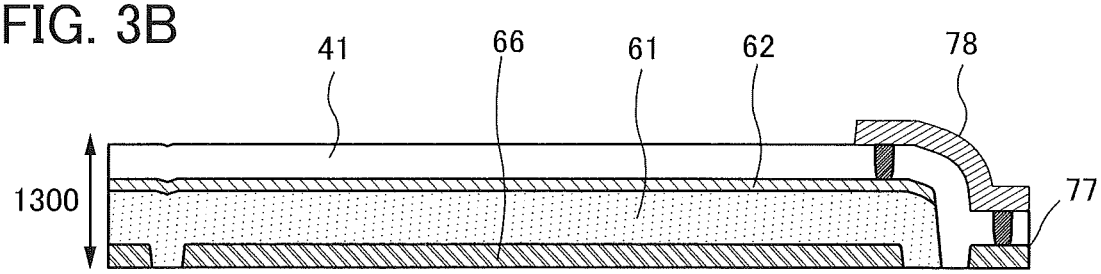
Figure 3C:
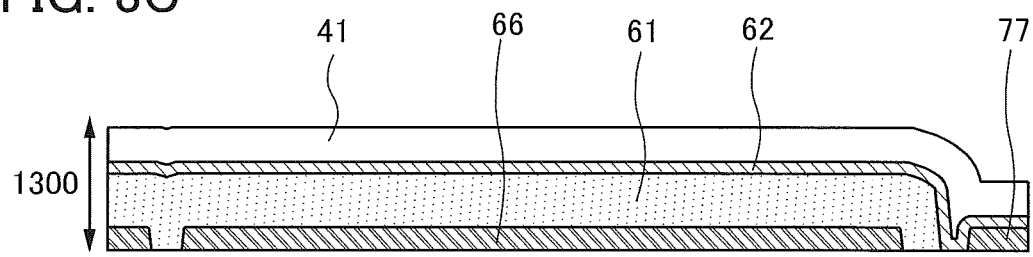
Figure 3D:
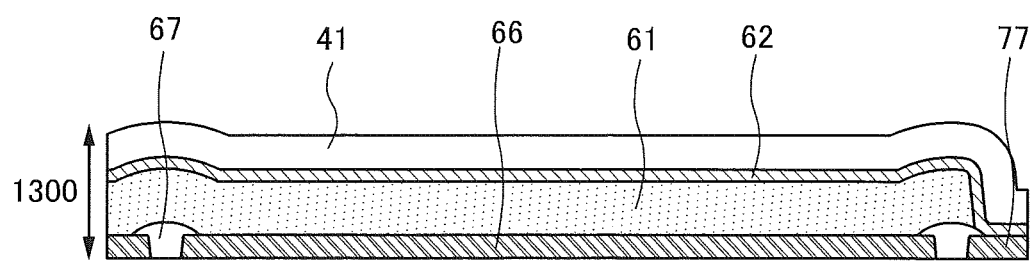

Although the photoelectric conversion layer 61 and the light-transmitting conductive layer 62 are not divided between pixel circuits in FIG. 2A, the photoelectric conversion layer 61 and the light-transmitting conductive layer 62 may be divided between pixel circuits as illustrated in FIG. 3A. Furthermore, a partition wall 67 formed of an insulator is preferably provided in a region between pixels where the electrode 66 is not provided in order to prevent generation of a crack in the photoelectric conversion layer 61 and the light-transmitting conductive layer 62; however, the configuration without the partition wall 67 as illustrated in FIG. 3B may also be employed. Alternatively, as illustrated in FIGS. 3C and 3D, the light-transmitting conductive layer 62 may be directly in contact with the wiring 77.

Figure 41A:
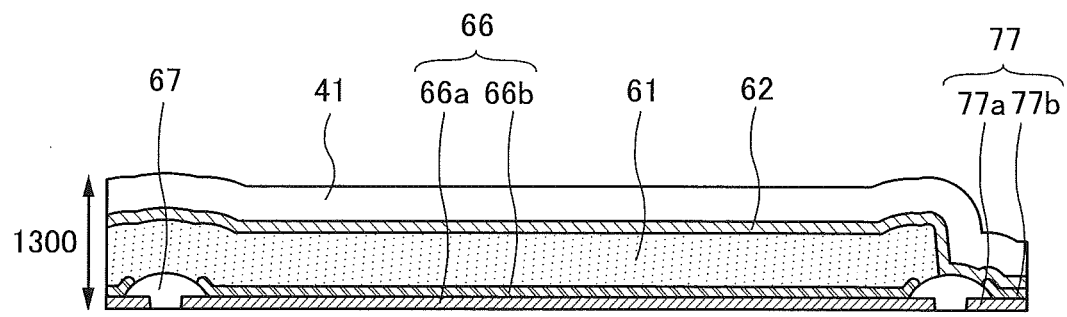
FIGS. 41A and 41B are cross-sectional views each illustrating a connection configuration of a photoelectric conversion element.

Furthermore, the electrode 66, the wiring 77, and the like may each have a multilayer structure. For example, as illustrated in FIG. 41A, the electrode 66 can be formed of two layers of conductive layers 66a and 66b, and the wiring 77 can be formed of two layers of conductive layers 77a and 77b. In the structure of FIG. 41A, it is preferable to form the conductive layers 66a and 77a from a low-resistance metal or the like and form the conductive layers 66b and 77b from a metal or the like having favorable contact characteristics with the photoelectric conversion layer 61. With this structure, electrical characteristics of the photoelectric conversion element can be improved. Note that some kinds of metals cause electrochemical corrosion by being in contact with the light-transmitting conductive layer 62. Even when such a metal is used in the conductive layer 77a, electrochemical corrosion can be prevented by the conductive layer 77b provided between the conductive layer 77a and the light-transmitting conductive layer 62.

The conductive layers 66b and 77b can be formed using molybdenum, tungsten, or the like, for example. Furthermore, the conductive layers 66a and 77a can be formed using aluminum, titanium, or stacked layers in which an aluminum layer is sandwiched between titanium layers, for example.

Figure 41B:
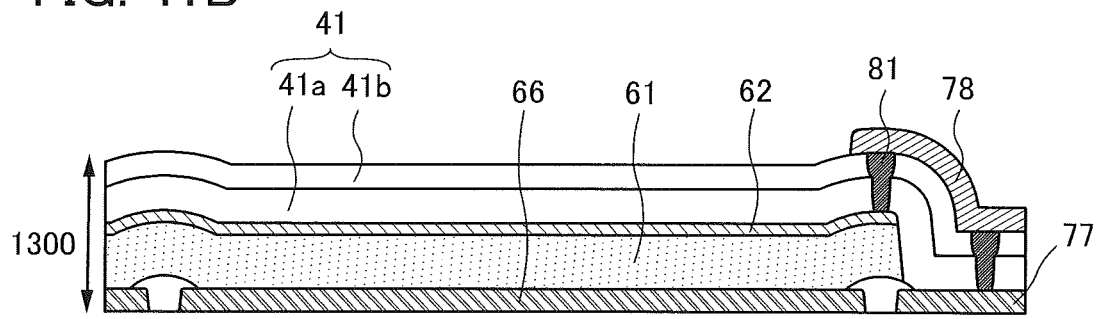

Moreover, the insulating layer 41 may have a multilayer structure. For example, as illustrated in FIG. 41B, the insulating layer 41 may be formed of insulating layers 41a and 41b; in the case where the etching rate or the like is different between the insulating layers 41a and 41b, the conductor 81 has a step. Similarly, in the case where the other insulating layers such as interlayer insulating films and planarization films have a multilayer structure, the conductors 81 also have a step. Although the insulating layer 41 has two layers in this example, the insulating layer 41 and the other insulating layers may have a structure of three or more layers.

Alternatively, a PIN diode element formed using an amorphous silicon film, a microcrystalline silicon film, or the like may be used as the photoelectric conversion element 60.

Figure 4:
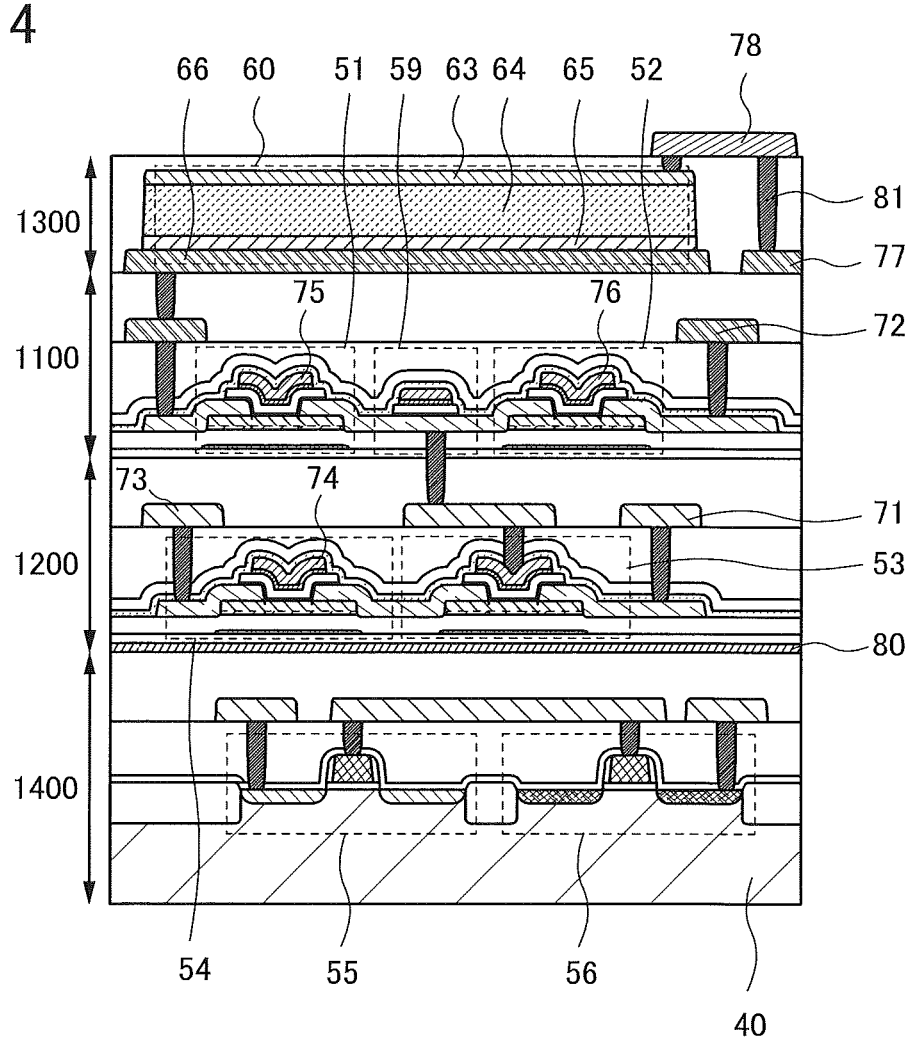
FIG. 4 is a cross-sectional view illustrating an imaging device.

FIG. 4 shows an example in which a thin film PIN photodiode is used as the photoelectric conversion element 60. In the photodiode, an n-type semiconductor layer 65, an i-type semiconductor layer 64, and a p-type semiconductor layer 63 are stacked in this order. The i-type semiconductor layer 64 is preferably formed of amorphous silicon. The p-type semiconductor layer 63 and the n-type semiconductor layer 65 can each be formed of amorphous silicon, microcrystalline silicon, or the like which includes a dopant imparting the corresponding conductivity type. A photodiode in which a photoelectric conversion layer is formed of amorphous silicon has high sensitivity in a visible light wavelength region, and therefore can easily sense weak visible light.

In the photoelectric conversion element 60 illustrated in FIG. 4, the n-type semiconductor layer 65 functioning as a cathode is electrically connected to the electrode 66 which is electrically connected to the transistor 51. Furthermore, the p-type semiconductor layer 63 functioning as an anode is electrically connected to the wiring 77 through the conductor 81.

Note that as for the connection configuration of the photoelectric conversion element 60 with electrode layers, and wirings in the circuit 91, what the anode of the photoelectric conversion element 60 is connected to and what the cathode thereof is connected to may be reversed from those in FIG. 1B.

In any case, the photoelectric conversion element 60 is preferably formed so that the p-type semiconductor layer 63 serves as a light-receiving surface. By making the p-type semiconductor layer 63 serve as a light-receiving surface, the output current of the photoelectric conversion element 60 can be increased.

Any of examples shown in FIGS. 5A to 5F may be applied to the structure of the photoelectric conversion element 60 having a configuration of a thin film PIN photodiode and the connection configuration among the photoelectric conversion element 60 and the wirings. Note that the structure of the photoelectric conversion element 60 and the connection configuration between the photoelectric conversion element 60 and the wirings are not limited thereto and other configurations may be applied.

Figure 5A:
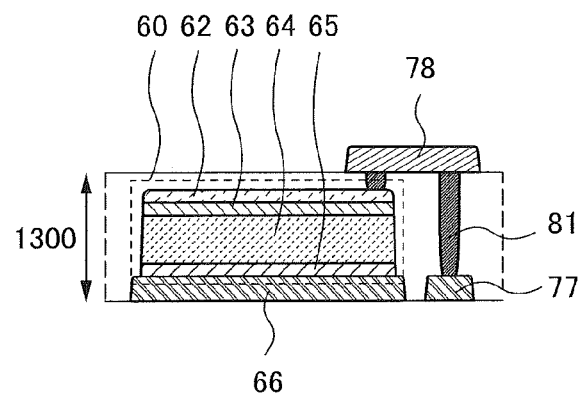
FIGS. 5A to 5F are cross-sectional views each illustrating a connection configuration of a photoelectric conversion element.

FIG. 5A illustrates a configuration provided with the light-transmitting conductive layer 62 in contact with the p-type semiconductor layer 63 of the photoelectric conversion element 60. The light-transmitting conductive layer 62 functions as an electrode and can increase the output current of the photoelectric conversion element 60.

For the light-transmitting conductive layer 62, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 62 is not limited to a single layer, and may be a stacked layer of different films.

Figure 5B:
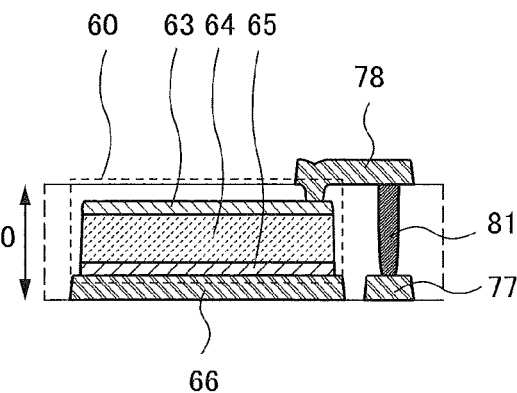

FIG. 5B illustrates a configuration in which the p-type semiconductor layer 63 of the photoelectric conversion element 60 is electrically connected directly to the wiring 78.

Figure 5C:
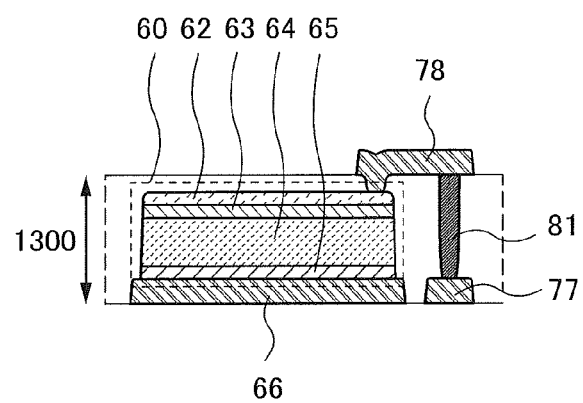

FIG. 5C illustrates a configuration in which the light-transmitting conductive layer 62 in contact with the p-type semiconductor layer 63 of the photoelectric conversion element 60 is provided, and the wiring 78 is electrically connected to the light-transmitting conductive layer 62.

Figure 5D:
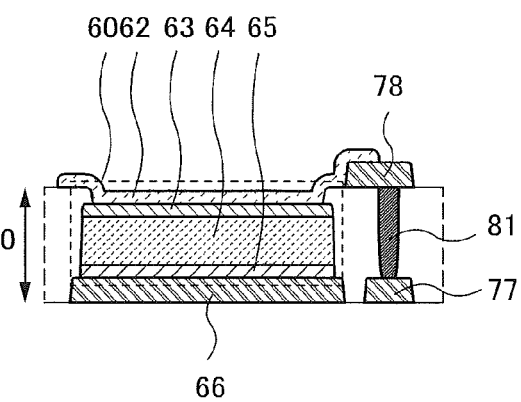

FIG. 5D illustrates a configuration in which an opening exposing the p-type semiconductor layer 63 is provided in an insulating layer covering the photoelectric conversion element 60, and the light-transmitting conductive layer 62 that covers the opening is electrically connected to the wiring 78.

Figure 5E:
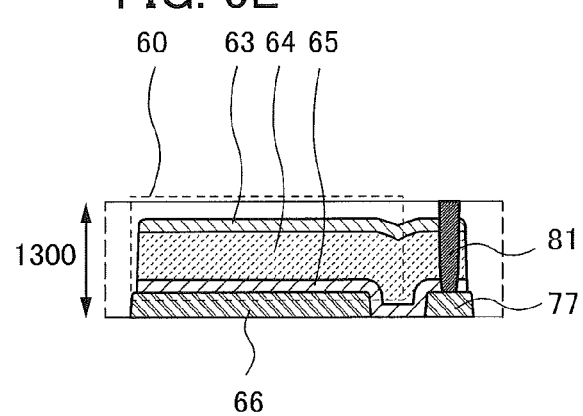

FIG. 5E illustrates a configuration provided with the conductor 81 which penetrates the photoelectric conversion element 60. In this configuration, the wiring 77 is electrically connected to the p-type semiconductor layer 63 through the conductor 81. Note that in appearance from the drawing, the electrode 66 is electrically in contact with the wiring 77 through the n-type semiconductor layer 65. However, a resistance in the lateral direction of the n-type semiconductor layer 65 is high; therefore, when an appropriate distance is provided between the wiring 77 and the above-described electrode, the resistance between the wiring 77 and the electrode is extremely high. Thus, the photoelectric conversion element 60 can have diode characteristics without a short circuit between the anode and the cathode. Note that two or more conductors 81 may be electrically connected to the p-type semiconductor layer 63.

Figure 5F:
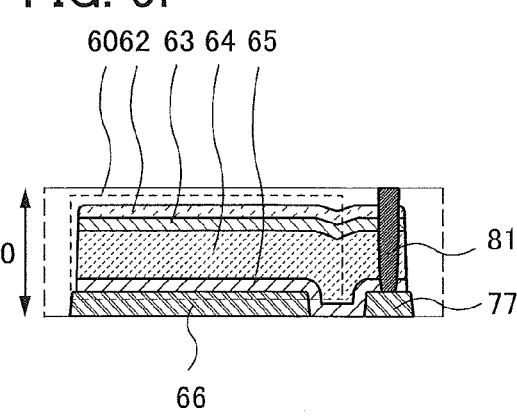

FIG. 5F illustrates a configuration in which the photoelectric conversion element 60 in FIG. 5E is provided with the light-transmitting conductive layer 62 in contact with the p-type semiconductor layer 63.

Note that each of the photoelectric conversion elements 60 illustrated in FIGS. 5D to 5F has an advantage of having a large light-receiving area because wirings and the like do not overlap a light-receiving region.

The photoelectric conversion element 60 formed using the above-described selenium-based material, amorphous silicon, or the like can be formed through general semiconductor manufacturing processes such as a deposition process, a lithography process, and an etching process. Furthermore, the resistance of the selenium-based material is high; thus, a structure in which the photoelectric conversion layer 61 is not divided between the circuits as illustrated in FIG. 2A can be employed. Therefore, the imaging device of one embodiment of the present invention can be manufactured with a high yield at low cost. Meanwhile, to form a photodiode in which the photoelectric conversion layer 61 is formed using crystalline silicon, processes with high difficulty such as a polishing process and a bonding process are necessary.

In the imaging devices illustrated in FIG. 2A and FIG. 4, the layer 1400 where the transistors 55 and 56 whose active regions are in the silicon substrate 40 are provided can overlap with the pixel circuit formed in the layers 1100 to 1300.

Figure 2B:
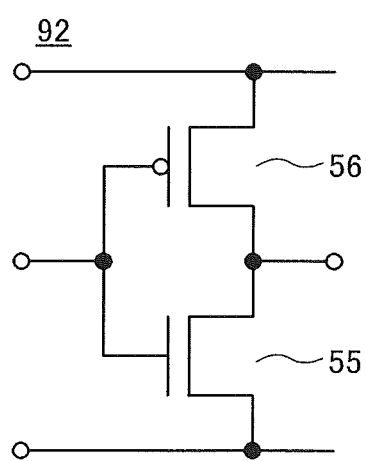

A circuit formed on the silicon substrate 40 can have a function of reading out a signal output from the pixel circuit or a function of processing the conversion of the signal, and can include a CMOS inverter such as a circuit 92 illustrated in FIG. 2B, for example. A gate of the transistor 55 (n-channel) is electrically connected to a gate of the transistor 56 (p-channel). One of a source and a drain of one transistor is electrically connected to one of a source and a drain of the other transistor. The other of the source and the drain of the one transistor is electrically connected to a wiring and the other of the source and the drain of the other transistor is electrically connected to another wiring.

The silicon substrate 40 is not limited to a bulk silicon substrate and can be a substrate made of germanium, silicon germanium, silicon carbide, gallium arsenide, aluminum gallium arsenide, indium phosphide, gallium nitride, or an organic semiconductor.

Figure 2C:
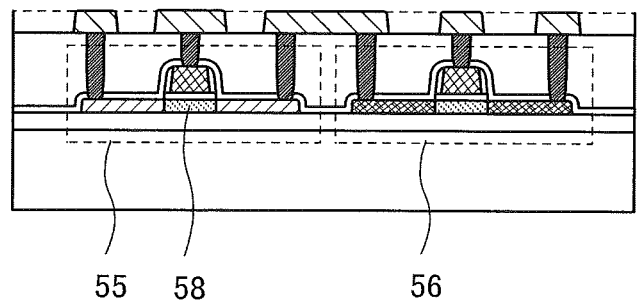

As illustrated in FIG. 2C, the transistors 55 and 56 may each be a transistor including an active layer 58 formed of a silicon thin film. The active layer 58 can be formed using polycrystalline silicon or single crystal silicon of a silicon-on-insulator (SOI) structure.

As illustrated in FIG. 1A, FIG. 2A, FIG. 4, and the like, an insulating layer 80 is provided between a region where the transistors including an oxide semiconductor are formed and the region where Si transistors (a Si photodiode in FIGS. 1A and 1B) are formed.

For example, dangling bonds of silicon are terminated with hydrogen in insulating layers provided in the vicinities of the active regions of the transistors 55 and 56. Therefore, the hydrogen has an effect of improving the reliability of the transistors 55 and 56. Meanwhile, hydrogen in insulating layers which are provided in the vicinity of the oxide semiconductor layer that is the active layer of the transistor 53 or the like causes generation of carriers in the oxide semiconductor layer. Therefore, the hydrogen may reduce the reliability of the transistor 53 or the like. Therefore, in the case where one layer including the transistors using a silicon-based semiconductor material and the other layer including the transistors using an oxide semiconductor are stacked, it is preferable that the insulating layer 80 having a function of preventing diffusion of hydrogen be provided between the layers. Hydrogen is confined in the one layer by the insulating layer 80, whereby the reliability of the transistors 55 and 56 can be improved. Furthermore, diffusion of hydrogen from the one layer to the other layer is inhibited, whereby the reliability of the transistor 53 or the like can also be increased.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In the structures illustrated in FIG. 2A and FIG. 4, the circuit formed in the silicon substrate 40 (e.g., a driver circuit), the transistor 51 and the like, and the photoelectric conversion element 60 can overlap with one another; thus, the degree of integration of pixels can be increased. In other words, the resolution of the imaging device can be increased. For example, these structures can be suitably employed for a 4K2K, 8K4K, or 16K8K imaging device.

In the imaging devices in FIG. 2A and FIG. 4, no photoelectric conversion element is provided in the silicon substrate 40. Therefore, an optical path for the photoelectric conversion element 60 can be secured without being influenced by the transistors or wirings, and thus, a pixel with a high aperture ratio can be formed.

Note that in the imaging devices in FIG. 2A and FIG. 4, the layer 1300, the layer 1100, the layer 1200, and the layer 1400 can be arranged in this order in the height direction as illustrated in FIG. 2A, FIG. 4, and FIG. 8C. Alternatively, they can be arranged in an order of the layer 1300, the layer 1200, the layer 1100, and the layer 1400 in the height direction as illustrated in FIG. 8D. Furthermore, another layer may be included in the stacked-layer structure. Furthermore, one or more of the layers in the stacked-layer structure may be omitted.

Figure 6:
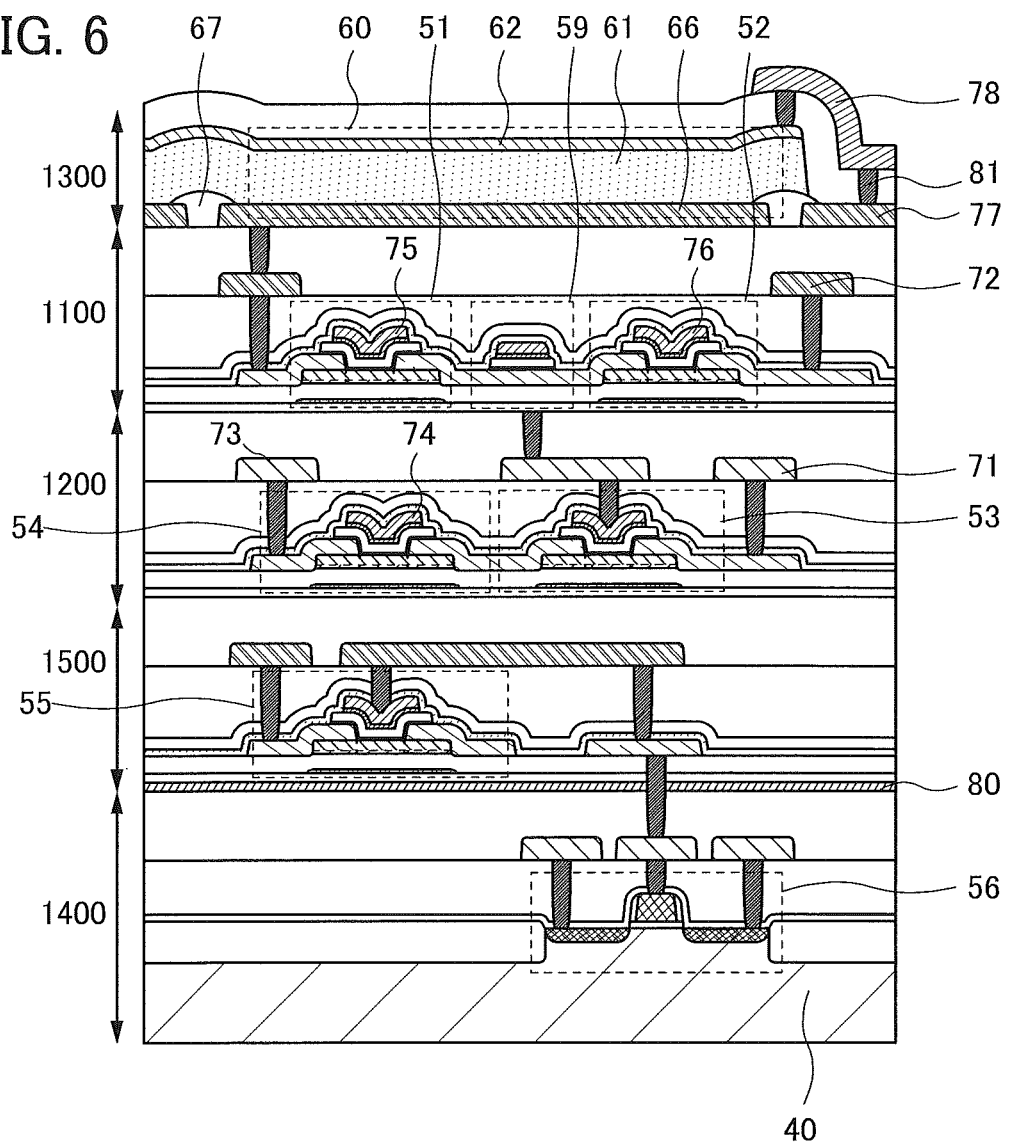
FIG. 6 is a cross-sectional view illustrating an imaging device.

Furthermore, the imaging device of one embodiment of the present invention can have a structure illustrated in FIG. 6.

The imaging device illustrated in FIG. 6 is a variation of the imaging device illustrated in FIG. 2A, where an OS transistor and a Si transistor constitute a CMOS inverter.

Here, the transistor 56 which is a Si transistor provided in the layer 1400 is of p-channel type, and the transistor 55 which is an OS transistor provided in a layer 1500 is of an n-channel type. By providing only the p-channel transistor in the silicon substrate 40, steps for forming a well, an n-type impurity layer, or the like can be eliminated.

The transistor 55 provided in the layer 1500 preferably has a high on-state current and can have a structure similar to that of the transistors provided in the layer 1200.

Although selenium is used in the photoelectric conversion element 60 in the example of the imaging device illustrated in FIG. 6, a thin film PIN photodiode may also be used in the same manner as that of FIG. 4.

Note that in the imaging device illustrated in FIG. 6, the layer 1300, the layer 1100, the layer 1200, the layer 1500, and the layer 1400 can be arranged in this order in the height direction as illustrated in FIG. 6 and FIG. 8E. Alternatively, they can be arranged in an order of the layer 1300, the layer 1200, the layer 1100, the layer 1500, and the layer 1400 in the height direction as illustrated in FIG. 8F. Furthermore, another layer may be included in the stacked-layer structure. Furthermore, one or more of the layers in the stacked-layer structure may be omitted.

Figure 7:
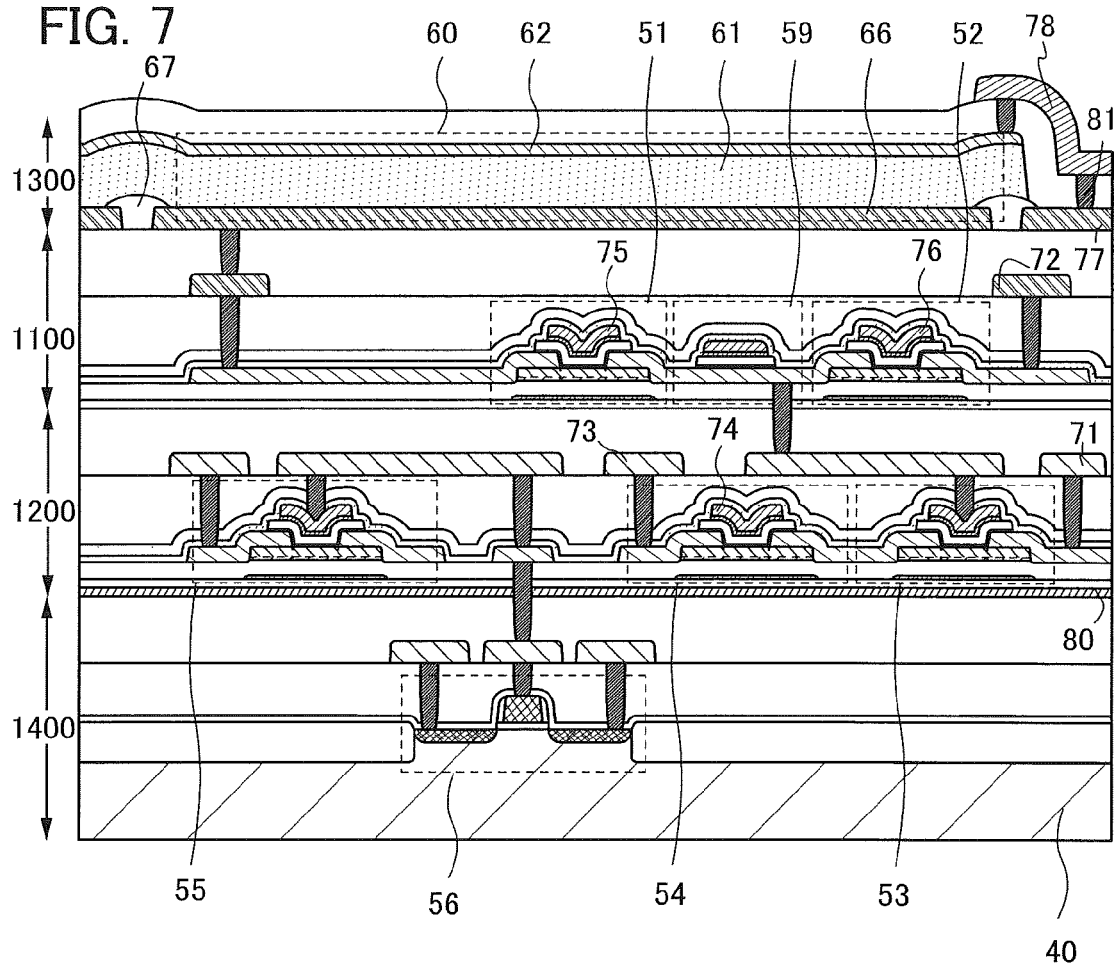
FIG. 7 is a cross-sectional view illustrating an imaging device.

Furthermore, the imaging device of one embodiment of the present invention can have a structure illustrated in FIG. 7.

The imaging device illustrated in FIG. 7 includes a CMOS inverter formed of an OS transistor and a Si transistor in the same manner as that of the imaging device illustrated in FIG. 6, but is different from the imaging device illustrated in FIG. 6 in eliminating the layer 1500 by providing the transistor 55 in the layer 1200.

In the imaging device illustrated in FIG. 7, the transistor 55 can be formed in the same process as that for the transistors 53 and 54 which are formed in the layer 1200. Thus, the manufacturing process of the imaging device can be simplified.

Since a transistor having a high on-state current is formed as the transistor 55 provided in the layer 1200 in the same manner as that of the transistors 53 and 54, the transistor 55 has characteristics enough as a constituent of the CMOS inverter.

In the imaging device illustrated in FIG. 7, the layer 1300, the layer 1100, the layer 1200, and the layer 1400 can be arranged in this order in the height direction as illustrated in FIG. 7 and FIG. 8C. Alternatively, they can be arranged in an order of the layer 1300, the layer 1200, the layer 1100, and the layer 1400 in the height direction as illustrated in FIG. 8D. Furthermore, another layer may be included in the stacked-layer structure. Furthermore, one or more of the layers in the stacked-layer structure may be omitted.

Note that the structures of the transistors and the photoelectric conversion element included in each of the imaging devices described in this embodiment are only an example. Therefore, for example, any one or more of the transistors 51 to 54 may be a transistor in which an active region or an active layer includes silicon or the like. Furthermore, both the transistor 55 and the transistor 56 may be a transistor including an oxide semiconductor layer as an active layer.

Since one circuit included in the imaging device of one embodiment of the present invention has a stacked-layer structure where transistors and the like have an overlapping region, the imaging device can be downsized. Moreover, a configuration in which a circuit having a function of reading out a signal output from a pixel circuit or a function of processing the conversion of the signal has a region overlapping with the pixel circuit is possible, which can further promote the downsizing of the imaging device.

Figure 9A:
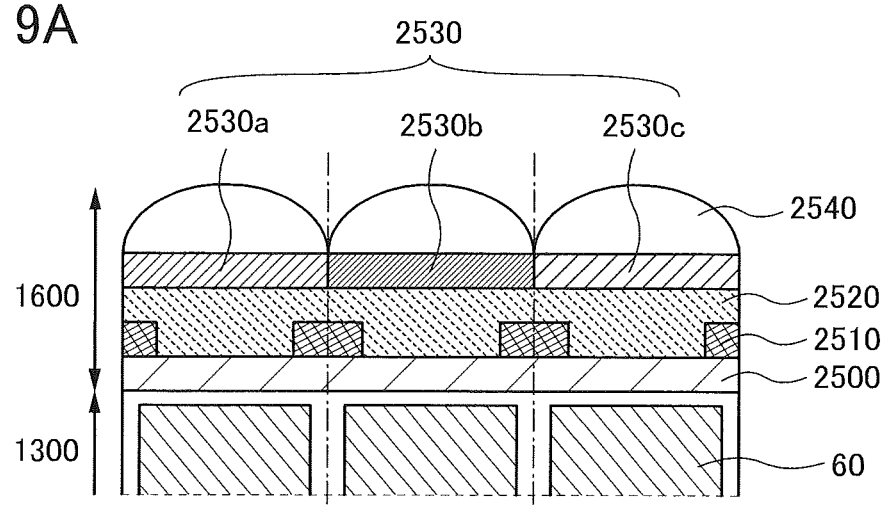
FIGS. 9A to 9C are cross-sectional views each illustrating a structure of an imaging device.

FIG. 9A is a cross-sectional view of an example of the mode in which a color filter and the like are added to the imaging device described with reference to FIG. 1A to FIG. 8F, illustrating part of a region including pixel circuits for three pixels. An insulating layer 2500 is formed over the layer 1300 in which the photoelectric conversion element 60 is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 is formed in each pixel. For example, color filters 2530a, 2530b, and 2530c have any of colors of R (red), G (green), B (blue), Y (yellow), C (cyan), M (magenta), and the like, whereby a color image can be obtained.

Figure 9B:
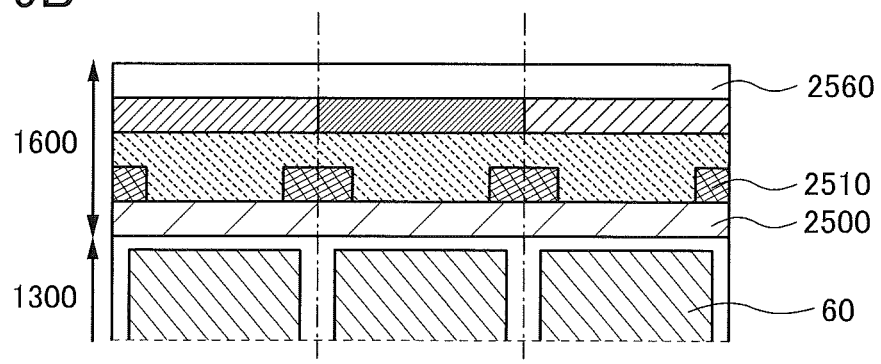

A microlens array 2540 is provided over the color filters 2530a, 2530b, and 2530c. Thus, light penetrating lenses included in the microlens array 2540 go through the color filters positioned therebelow to reach the photoelectric conversion element. Note that as illustrated in FIG. 9B, a structure that is not provided with the microlens array 2540 may be employed. In this case, a light-transmitting insulating layer 2560 or the like can be provided over the color filters.

Figure 9C:
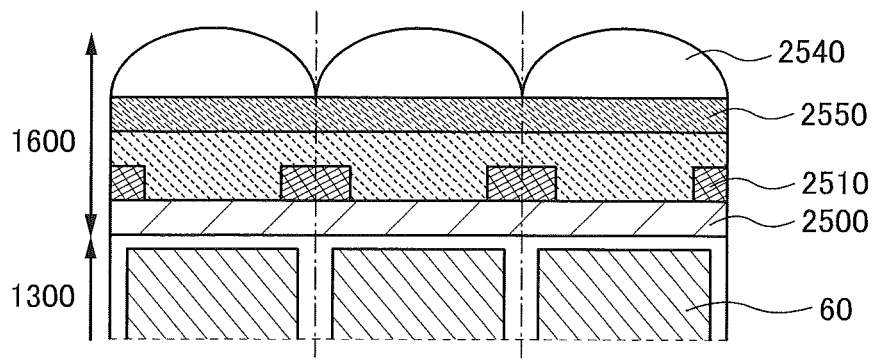

Furthermore, as illustrated in FIG. 9C, an optical conversion layer 2550 may be used instead of the color filters 2530a, 2530b, and 2530c. Such a structure enables the imaging device to take images in various wavelength regions. In addition, the imaging device illustrated in FIG. 9C can have a structure not provided with the microlens array 2540 as in the structure illustrated in FIG. 9B.

For example, when a filter which blocks light having a wavelength shorter than or equal to that of visible light is used as the optical conversion layer 2550, an infrared imaging device can be obtained. When a filter which blocks light having a wavelength shorter than or equal to that of near-infrared light is used as the optical conversion layer 2550, a far-infrared imaging device can be obtained. When a filter which blocks light having a wavelength longer than or equal to that of visible light is used as the optical conversion layer 2550, an ultraviolet imaging device can be obtained.

Furthermore, when a scintillator is used as the optical conversion layer 2550, an imaging device which takes an image visualizing the intensity of radiation and is used as an X-ray imaging device, for example, can be obtained. Radiation such as X-rays passes through a subject to enter a scintillator, and then is converted into light (fluorescence) such as visible light or ultraviolet light owing to a phenomenon known as photoluminescence. Then, the photoelectric conversion element 60 detects the light to obtain image data. The imaging device having such a structure may be used in a radiation detector or the like.

A scintillator is formed of a substance that, when irradiated with radiation such as X-rays or gamma-rays, absorbs energy of the radiation to emit visible light or ultraviolet light, or a material including such a substance. For example, a material such as $Gd_2O_2S{:}Tb$, $Gd_2O_2S{:}Pr$, $Gd_2O_2S{:}Eu$, $BaFCl{:}Eu$, $NaI$, $CsI$, $CaF_2$, $BaF_2$, $CeF_3$, $LiF$, $LiI$, or $ZnO$ or a resin or ceramics in which any of the materials is dispersed can be used.

Note that in the photoelectric conversion element 60 using a selenium-based material, radiation such as X-rays can be directly converted into electrical charges; thus, the scintillator is not necessarily used.

When the region other than the layer 1300 in FIGS. 9A to 9C is referred to as a layer 1600, the layer 1600 can be combined with the structure of the imaging device described with reference to FIGS. 1A to 8F in the ways as illustrated in FIGS. 10A to 10F.

Figure 43:
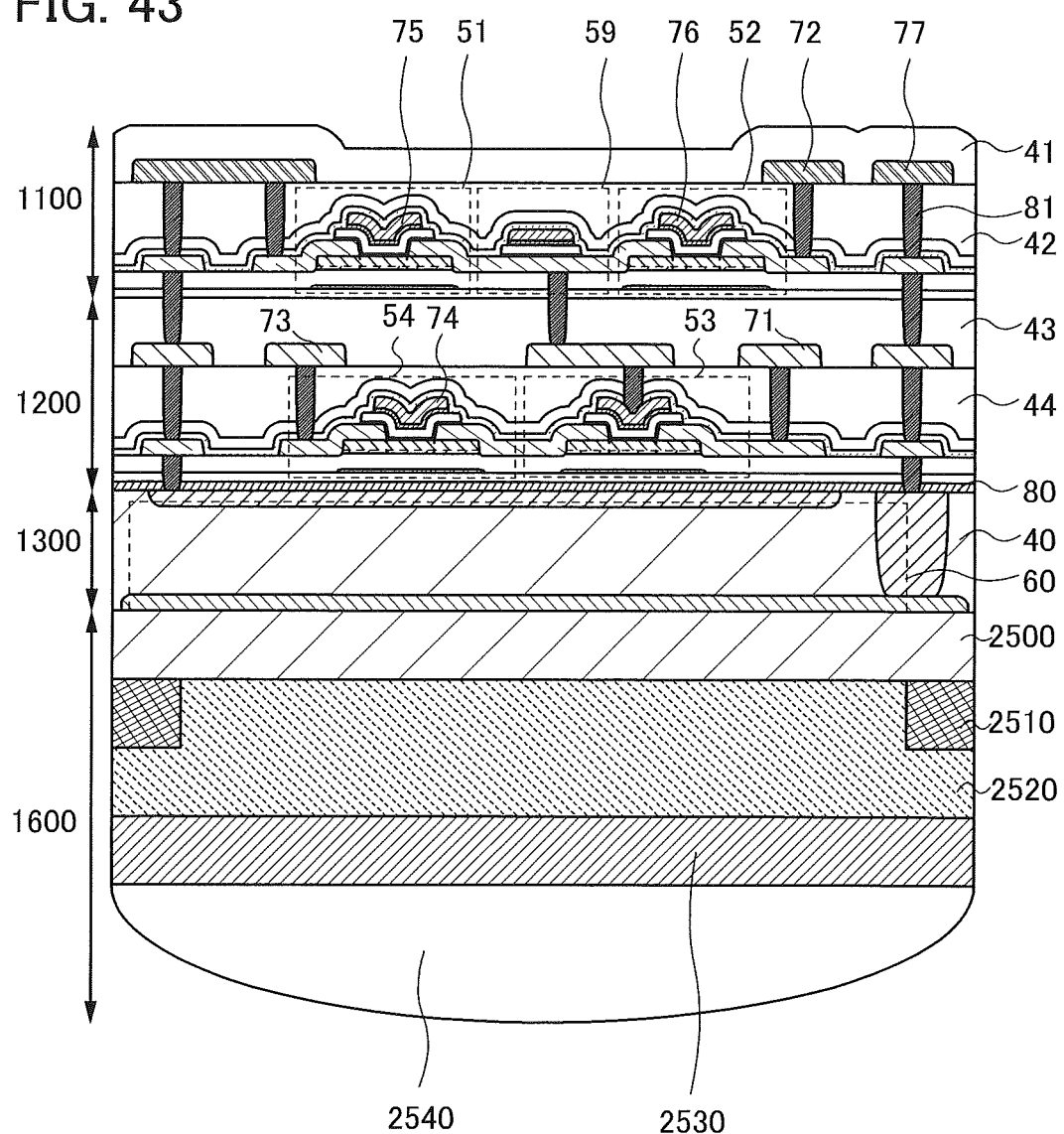
FIG. 43 is a cross-sectional view illustrating a structure of an imaging device.
Figure 44:
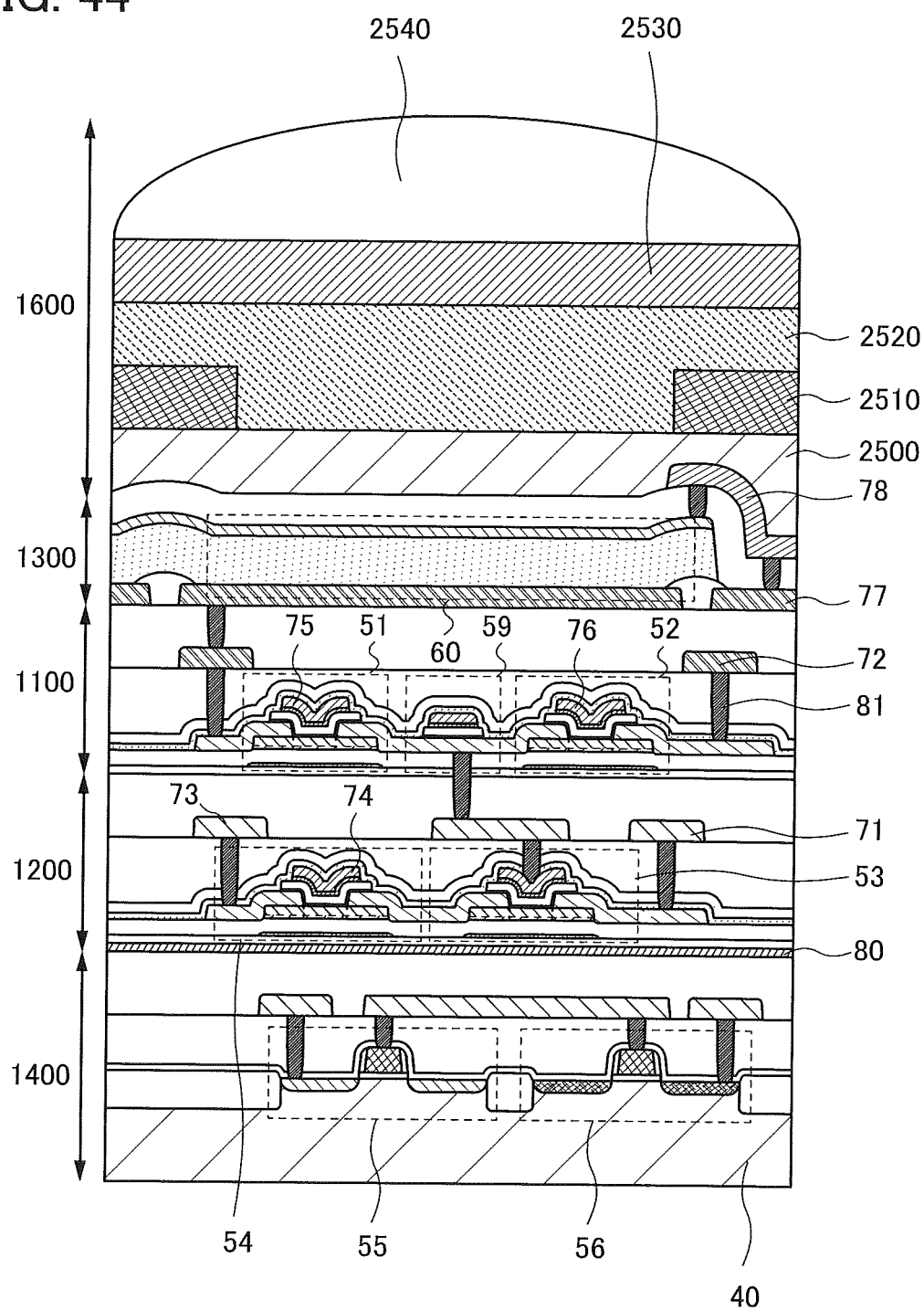
FIG. 44 is a cross-sectional view illustrating a structure of an imaging device.

A specific structure of the imaging device illustrated in FIG. 10A is illustrated in FIG. 43. Further, a specific structure of the imaging device illustrated in FIG. 10C is illustrated in FIG. 44.

As illustrated in FIGS. 11A1 and 11B1, the imaging device may be bent. FIG. 11A1 illustrates a state in which the imaging device is bent in the direction of dashed-two dotted line X1-X2. FIG. 11A2 is a cross-sectional view illustrating a portion indicated by dashed-two dotted line X1-X2 in FIG. 11A1. FIG. 11A3 is a cross-sectional view illustrating a portion indicated by dashed-two dotted line Y1-Y2 in FIG. 11A1.

FIG. 11B1 illustrates a state where the imaging device is bent in the direction of dashed-two dotted line X3-X4 and the direction of dashed-two dotted line Y3-Y4. FIG. 11B2 is a cross-sectional view illustrating a portion indicated by dashed-two dotted line X3-X4 in FIG. 11B1. FIG. 11B3 is a cross-sectional view illustrating a portion indicated by dashed-two dotted line Y3-Y4 in FIG. 11B1.

Bending the imaging device can reduce field curvature and astigmatism. Thus, the optical design of lens and the like, which are used in combination with the imaging device, can be facilitated. For example, the number of lenses used for aberration correction can be reduced; accordingly, the size or weight of semiconductor devices including the imaging device can be easily reduced. In addition, the quality of a captured image can be improved.

In this embodiment, one embodiment of the present invention has been described. Other embodiments of the present invention are described in the other embodiments. Note that one embodiment of the present invention is not limited to the above examples. Although examples in which one embodiment of the present invention is applied to an imaging device have been described, one embodiment of the present invention is not limited thereto. Depending on circumstances or conditions, one embodiment of the present invention is not necessarily applied to an imaging device. For example, one embodiment of the present invention may be applied to a semiconductor device having another function.

This embodiment can be implemented in appropriate combination with any of the structures described in the other embodiments.

Embodiment 2

In this embodiment, the pixel circuit described in Embodiment 1 is described.

Figure 12A:
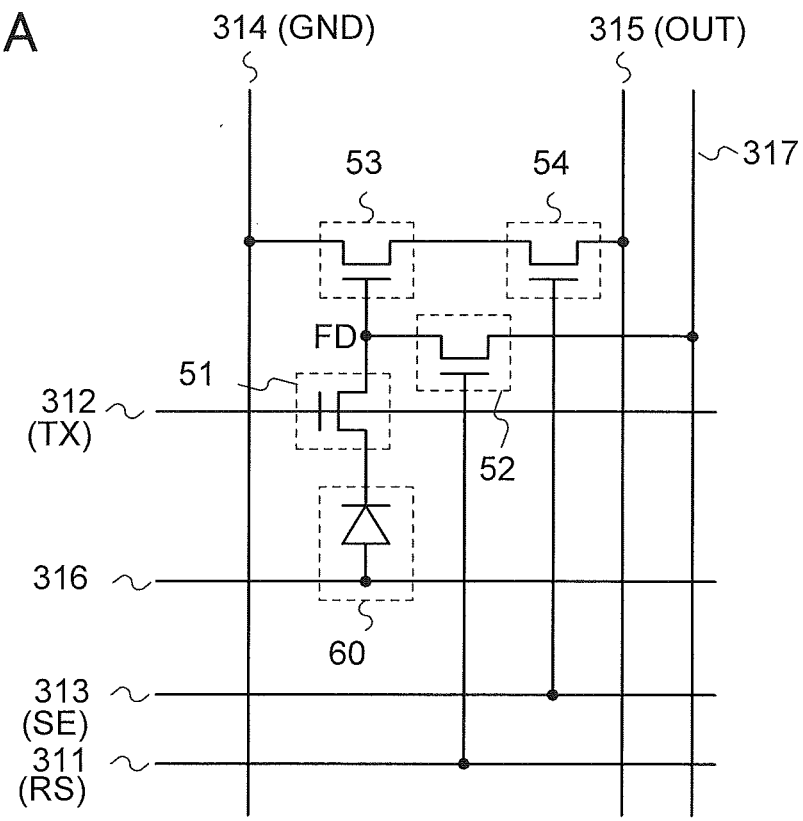
FIGS. 12A and 12B each illustrate a configuration of a pixel circuit.

FIG. 12A shows details of connections between the pixel circuit (the circuit 91) in FIG. 1B and a variety of wirings. The circuit in FIG. 12A includes the photoelectric conversion element 60, the transistor 51, the transistor 52, the transistor 53, and a transistor 54.

The anode of the photoelectric conversion element 60 is electrically connected to a wiring 316, and the cathode of the photoelectric conversion element 60 is electrically connected to one of the source and the drain of the transistor 51. The other of the source and the drain of the transistor 51 is electrically connected to the charge storage portion (FD), and a gate of the transistor 51 is electrically connected to a wiring 312 (TX). One of the source and the drain of the transistor 52 is electrically connected to the charge storage portion (FD), the other of the source and the drain of the transistor 52 is electrically connected to a wiring 317, and a gate of the transistor 52 is electrically connected to a wiring 311 (RS). One of a source and a drain of the transistor 53 is electrically connected to a wiring 314 (GND), the other of the source and the drain of the transistor 53 is electrically connected to one of a source and a drain of the transistor 54, and the gate of the transistor 53 is electrically connected to the charge storage portion (FD). The other of the source and the drain of the transistor 54 is electrically connected to a wiring 315 (OUT), and a gate of the transistor 54 is electrically connected to a wiring 313 (SE). Note that all the above connections are electrical connections.

A potential such as GND, VSS, or VDD may be supplied to the wiring 314. Here, a potential or a voltage has a relative value. Therefore, the potential GND is not necessarily 0 V.

The photoelectric conversion element 60 is a light-receiving element and has a function of generating current corresponding to the amount of light incident on the pixel circuit. The transistor 51 has a function of controlling supply of charges from the photoelectric conversion element 60 to the charge storage portion (FD). The transistor 52 has a function of resetting the potential of the charge storage portion (FD). The transistor 53 has a function of outputting a signal which corresponds to the potential of the charge storage portion (FD). The transistor 54 has a function of controlling selection of the pixel circuit at the time of reading.

Note that the charge storage portion (FD) is a charge retention node and retains charges, the number of which is changed depending on the amount of light received by the photoelectric conversion element 60.

Note that the transistor 53 and the transistor 54 are connected in series between the wiring 315 and the wiring 314. Hence, the wiring 314, the transistor 53, the transistor 54, and the wiring 315 may be arranged in order, or the wiring 314, the transistor 54, the transistor 53, and the wiring 315 may be arranged in order.

The wiring 311 (RS) functions as a signal line for controlling the transistor 52. The wiring 312 (TX) functions as a signal line for controlling the transistor 51. The wiring 313 (SE) functions as a signal line for controlling the transistor 54. The wiring 314 (GND) functions as a signal line for supplying a reference potential (e.g., GND). The wiring 315 (OUT) functions as a signal line for reading a signal output from the transistor 53. The wiring 316 functions as a signal line for outputting charge from the charge storage portion (FD) through the photoelectric conversion element 60 and is a low-potential line in the circuit in FIG. 12A. The wiring 317 functions as a signal line for resetting the potential of the charge storage portion (FD) and is a high-potential line in the circuit in FIG. 12A.

Here, the relations with the wirings illustrated in FIG. 1B are as follows. The wiring 76 corresponds to the wiring 311 (RS). The wiring 75 corresponds to the wiring 312 (TX). The wiring 74 corresponds to the wiring 313 (SE). The wiring 71 corresponds to the wiring 314 (GND). The wiring 73 corresponds to the wiring 315 (OUT). The wiring 77 corresponds to the wiring 316. The wiring 72 corresponds to the wiring 317.

Figure 12B:
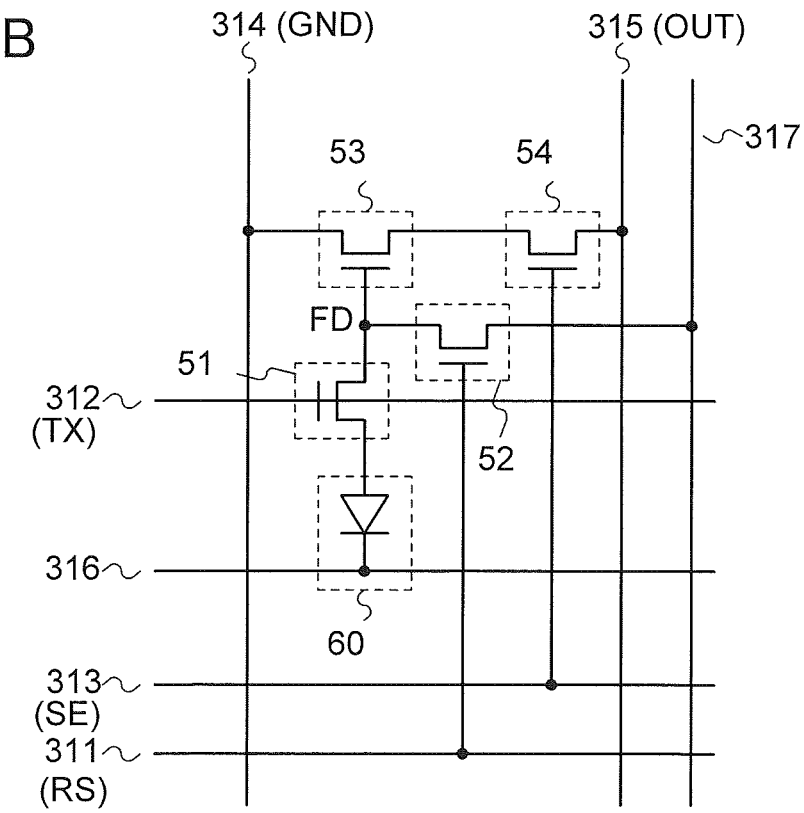

The pixel circuit of one embodiment of the present invention may have a configuration illustrated in FIG. 12B. The circuit illustrated in FIG. 12B includes the same components as those in the circuit in FIG. 12A but is different from the circuit in that the anode of the photoelectric conversion element 60 is electrically connected to one of the source and the drain of the transistor 52 and the cathode of the photoelectric conversion element 60 is electrically connected to the wiring 316. In this case, the wiring 316 functions as a signal line for supplying charges to the charge storage portion (FD) through the photoelectric conversion element 60 and is a high-potential line in the circuit in FIG. 12B. Furthermore, the wiring 317 is a low-potential line.

Next, a structure of each component illustrated in FIGS. 12A and 12B is described.

As described in Embodiment 1, an element formed using a selenium-based material and a conductive layer or an element in which a PIN junction is formed using a silicon layer can be used as the photoelectric conversion element 60.

Although a silicon semiconductor such as amorphous silicon, microcrystalline silicon, polycrystalline silicon, or single crystal silicon can be used to form the transistor 51, the transistor 52, the transistor 53, and the transistor 54, an oxide semiconductor is preferably used to form the transistors. A transistor in which a channel formation region is formed of an oxide semiconductor has an extremely low off-state current.

In particular, when the transistors 51 and 52 connected to the charge storage portion (FD) have a high leakage current, charges accumulated in the charge storage portion (FD) cannot be retained for a sufficiently long time. The use of an oxide semiconductor for the transistors 51 and 52 prevents unwanted output of charges from the charge storage portion (FD).

Unwanted output of charges also occurs in the wiring 314 or the wiring 315 when the transistor 53 and the transistor 54 have a large leakage current; thus, transistors in which a channel formation region is formed of an oxide semiconductor are preferably used as these transistors.

An example of the operation of the circuit in FIG. 12A is described using a timing chart shown in FIG. 13A.

In FIG. 13A, a potential of each wiring is denoted as a signal which varies between two levels for simplicity. However, because each potential is an analog signal, the potential can, in practice, have various levels in accordance with situations without being limited to two levels. In the drawing, a signal 701 corresponds to the potential of the wiring 311 (RS); a signal 702, the potential of the wiring 312 (TX); a signal 703, the potential of the wiring 313 (SE); a signal 704, the potential of the charge storage portion (FD); and a signal 705, the potential of the wiring 315 (OUT). Note that the potential of the wiring 316 is always at low level, and the potential of the wiring 317 is always at high level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (high level), and reset operation is started. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photoelectric conversion element 60, whereby the potential of the charge storage portion (FD) (signal 704) starts to decrease due to a reverse current. Since irradiation of the photoelectric conversion element 60 with light increases the reverse current, the rate of decrease in the potential of the charge storage portion (FD) (signal 704) changes depending on the amount of the light irradiation. In other words, channel resistance between the source and the drain of the transistor 53 changes depending on the amount of light emitted to the photoelectric conversion element 60.

At time C, the potential of the wiring 312 (signal 702) is set to low level to terminate the accumulation operation, so that the potential of the charge storage portion (FD) (signal 704) becomes constant. Here, the potential is determined by the amount of electrical charges generated by the photoelectric conversion element 60 during the accumulation operation. That is, the potential changes depending on the amount of light emitted to the photoelectric conversion element 60. Furthermore, since the transistor 51 and the transistor 52 are each a transistor which includes a channel formation region formed of an oxide semiconductor layer and which has an extremely low off-state current, the potential of the charge storage portion (FD) can be kept constant until a subsequent selection operation (read operation) is performed.

Note that when the potential of the wiring 312 (signal 702) is set at low level, the potential of the charge storage portion (FD) might change owing to parasitic capacitance between the wiring 312 and the charge storage portion (FD). In the case where this potential change is large, the amount of electrical charges generated by the photoelectric conversion element 60 during the accumulation operation cannot be obtained accurately. Examples of effective measures to reduce the amount of potential change include reducing the capacitance between the gate and the source (or between the gate and the drain) of the transistor 51, increasing the gate capacitance of the transistor 53, and providing a storage capacitor to connect the charge storage portion (FD). Note that in this embodiment, the potential change can be ignored by the adoption of these measures.

At time D, the potential of the wiring 313 (signal 703) is set at high level to turn on the transistor 54, whereby selection operation starts and the wiring 314 and the wiring 315 are electrically connected to each other through the transistor 53 and the transistor 54. Also, the potential of the wiring 315 (signal 705) starts to decrease. Note that precharge of the wiring 315 is terminated before the time D. Here, the rate at which the potential of the wiring 315 (signal 705) decreases depends on the current between the source and the drain of the transistor 53. That is, the potential of the wiring 315 (signal 705) changes depending on the amount of light emitted to the photoelectric conversion element 60 during the accumulation operation.

At time E, the potential of the wiring 313 (signal 703) is set at low level to turn off the transistor 54, so that the selection operation is terminated and the potential of the wiring 315 (signal 705) becomes a constant value. Here, the constant value changes depending on the amount of light emitted to the photoelectric conversion element 60. Therefore, the amount of light emitted to the photoelectric conversion element 60 during the accumulation operation can be determined by measuring the potential of the wiring 315.

Specifically, when the photoelectric conversion element 60 is irradiated with light with high intensity, the potential of the charge storage portion (FD), that is, the gate voltage of the transistor 53 is low. Therefore, current flowing between the source and the drain of the transistor 54 becomes small; as a result, the potential of the wiring 315 (signal 705) is gradually lowered. Thus, a relatively high potential can be read from the wiring 315.

In contrast, when the photoelectric conversion element 60 is irradiated with light with low intensity, the potential of the charge storage portion (FD), that is, the gate voltage of the transistor 54 is high. Therefore, the current flowing between the source and the drain of the transistor 53 becomes large; thus, the potential of the wiring 315 (signal 705) rapidly decreases. Thus, a relatively low potential can be read from the wiring 315.

Next, an example of the operation of the circuit in FIG. 12B is described with reference to a timing chart in FIG. 13B. Note that the wiring 316 is always at high level, and the potential of the wiring 317 is always at low level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (low level), and reset operation is started. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photoelectric conversion element 60, whereby the potential of the charge storage portion (FD) (signal 704) starts to increase due to a reverse current.

The description of the timing chart of FIG. 13A can be referred to for operations at and after the time C. The amount of light emitted to the photoelectric conversion element 60 during the accumulation operation can be determined by measuring the potential of the wiring 315 at time E.

Figure 17:
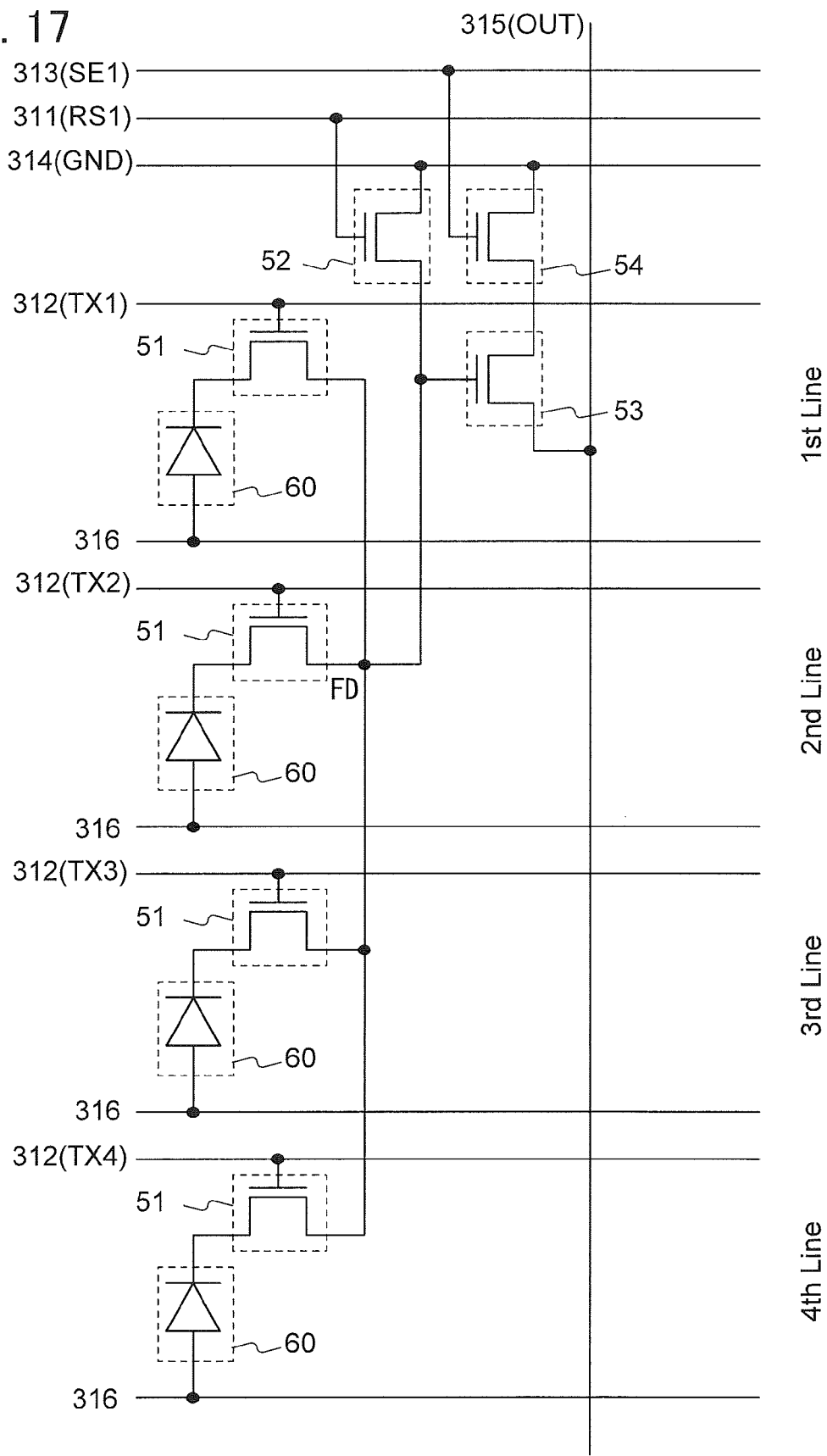
FIG. 17 illustrates a configuration of a pixel circuit.

Note that the pixel circuit in FIG. 12A may have a configuration in which the transistors 52 to 54 are shared among a plurality of pixels as illustrated in FIG. 17. FIG. 17 illustrates a configuration in which the transistors 52 to 54 are shared among a plurality of pixels in the perpendicular direction; however, the transistors 52 to 57 may be shared among a plurality of pixels in the horizontal direction or in the horizontal and perpendicular direction. With such a structure, the number of transistors included in one pixel can be reduced. FIG. 17 illustrates a configuration in which the transistors 52 to 54 are shared among four pixels; however, the transistors 52 to 54 may be shared among two pixels, three pixels, five pixels or more. Furthermore, the pixel circuit in FIG. 12B can have a configuration similar to that of the pixel circuit in FIG. 17.

Figure 14A:
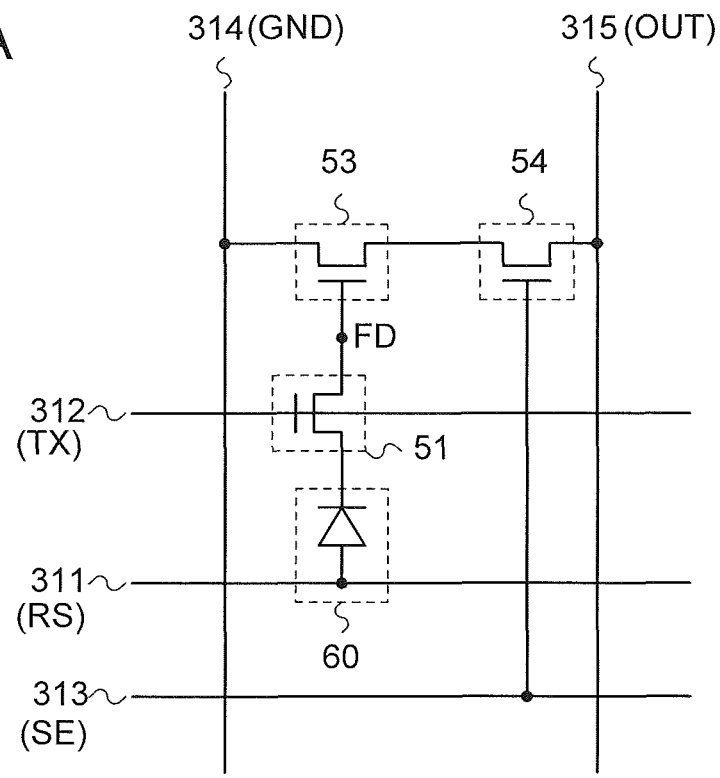
FIGS. 14A and 14B each illustrate a configuration of a pixel circuit.
Figure 14B:
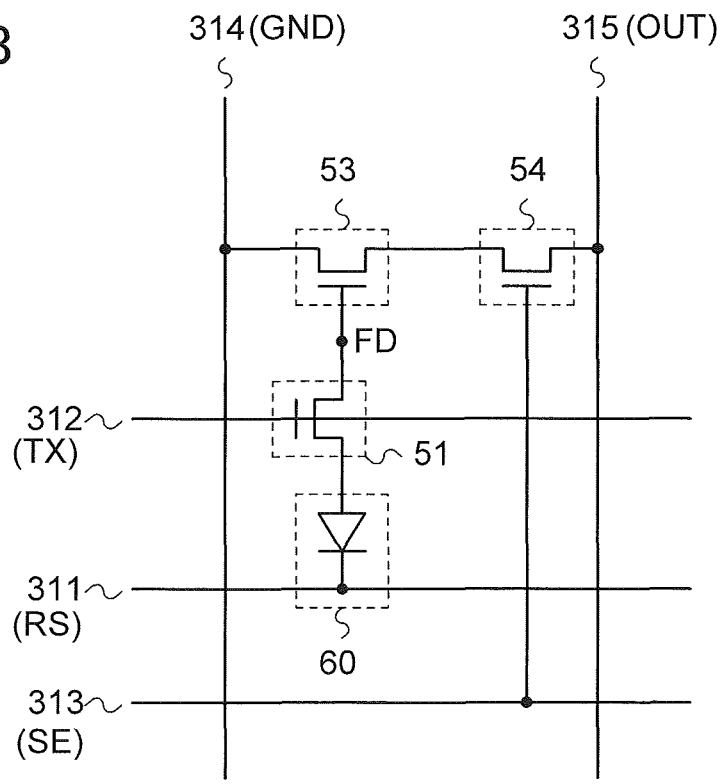

The pixel circuit of one embodiment of the present invention may have any of configurations illustrated in FIGS. 14A and 14B.

The configuration of a circuit in FIG. 14A is different from that of the circuit in FIG. 12A in that the transistor 52, the wiring 316, and the wiring 317 are not provided, and the wiring 311 (RS) is electrically connected to the anode of the photoelectric conversion element 60. The other structures are the same as those in the circuit in FIG. 12A.

The circuit in FIG. 14B includes the same components as those in the circuit in FIG. 14A but is different from the circuit in that the anode of the photoelectric conversion element 60 is electrically connected to one of the source and the drain of the transistor 51 and the cathode of the photoelectric conversion element 60 is electrically connected to the wiring 311 (RS).

Like the circuit in FIG. 12A, the circuit in FIG. 14A can be operated in accordance with the timing chart shown in FIG. 13A.

At time A, the potential of the wiring 311 (signal 701) is set at high level and the potential of the wiring 312 (signal 702) is set at high level, whereby a forward bias is applied to the photoelectric conversion element 60 and the potential of the charge storage portion (FD) (signal 704) is set at high level. In other words, the potential of the charge storage portion (FD) is initialized to the potential of the wiring 311 (RS) (high level) and brought into a reset state. The above is the start of the reset operation. Note that the potential of the wiring 315 (signal 705) is precharged to high level.

At time B, the potential of the wiring 311 (signal 701) is set at low level, whereby the reset operation is terminated to start accumulation operation. Here, a reverse bias is applied to the photoelectric conversion element 60, whereby the potential of the charge storage portion (FD) (signal 704) starts to decrease due to a reverse current.

The description of the circuit configuration of FIG. 12A can be referred to for operations at and after time C. The amount of light emitted to the photoelectric conversion element 60 during the accumulation operation can be determined by measuring the potential of the wiring 315 at time E.

The circuit in FIG. 14B can be operated in accordance with the timing chart shown in FIG. 13C.

At time A, the potential of the wiring 311 (signal 701) is set at low level and the potential of the wiring 312 (signal 702) is set at high level, whereby a forward bias is applied to the photoelectric conversion element 60 and the potential of the charge storage portion (FD) (signal 704) is set at low level to be in a reset state. The above is the start of the reset operation. Note that the potential of the wiring 315 (signal 705) is precharged to high level.

At time B, the potential of the wiring 311 (signal 701) is set at high level, whereby the reset operation is terminated to start accumulation operation. Here, a reverse bias is applied to the photoelectric conversion element 60, whereby the potential of the charge storage portion (FD) (signal 704) starts to increase due to a reverse current.

The description of the circuit configuration of FIG. 12A can be referred to for operations at and after time C. The amount of light emitted to the photoelectric conversion element 60 during the accumulation operation can be determined by measuring the potential of the wiring 315 at time E.

Figure 18:
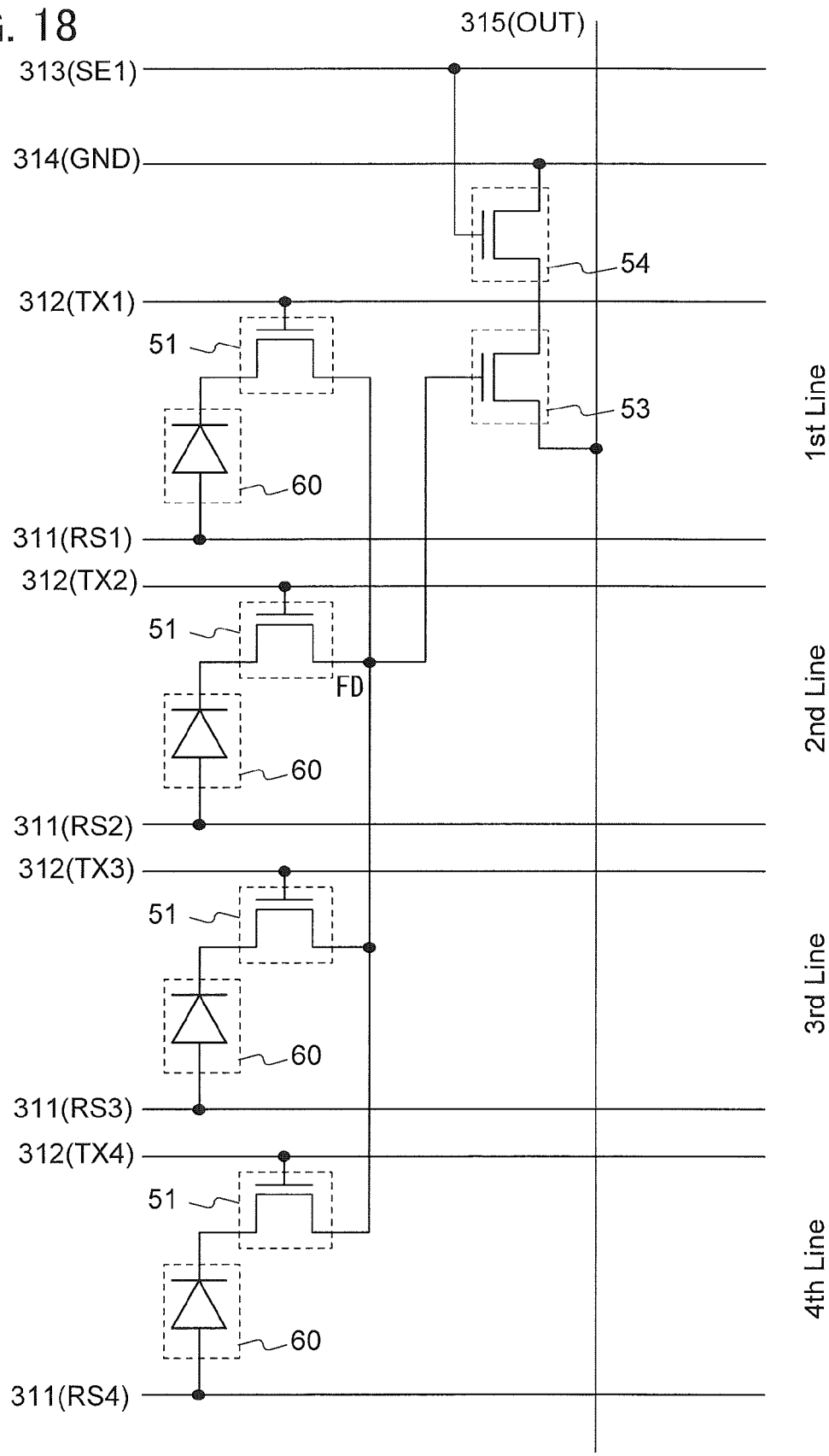
FIG. 18 illustrates a configuration of a pixel circuit.

Note that the pixel circuit in FIG. 14A may have a configuration in which the transistors 53 and 54 are shared among a plurality of pixels as illustrated in FIG. 18. FIG. 18 illustrates a configuration in which the transistors 53 and 54 are shared among a plurality of pixels in the perpendicular direction; however, the transistors 53 and 54 may be shared among a plurality of pixels in the horizontal direction or in the horizontal and perpendicular direction. FIG. 18 illustrates a configuration in which the transistors 53 and 54 are shared among four pixels; however, the transistors 53 and 54 may be shared among two pixels, three pixels, five pixels or more. Furthermore, the pixel circuit in FIG. 14B can have a configuration similar to that of the pixel circuit in FIG. 18.

Figure 15A:
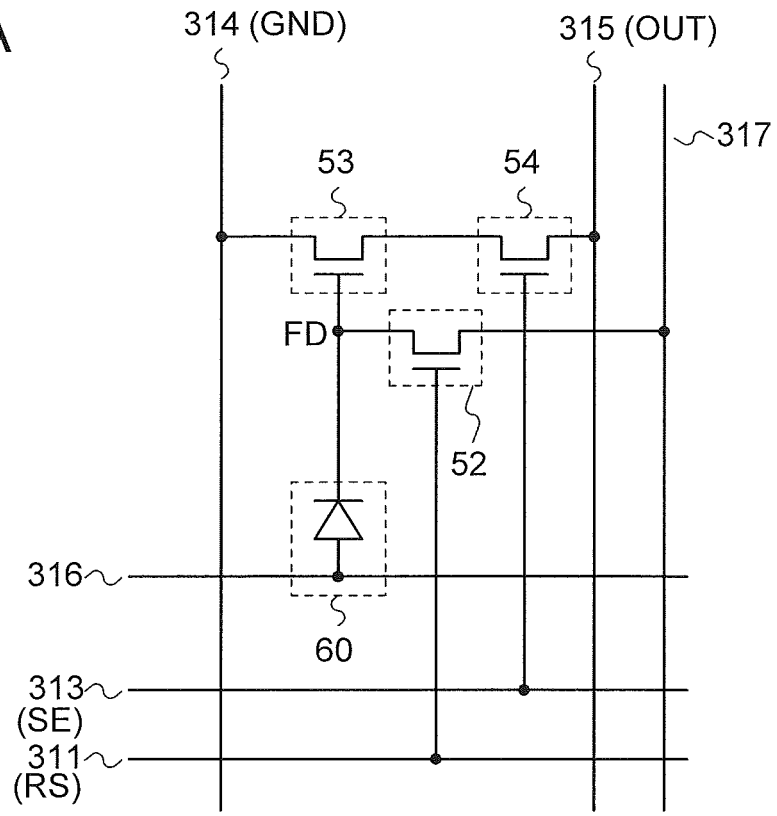
FIGS. 15A and 15B each illustrate a configuration of a pixel circuit.
Figure 15B:
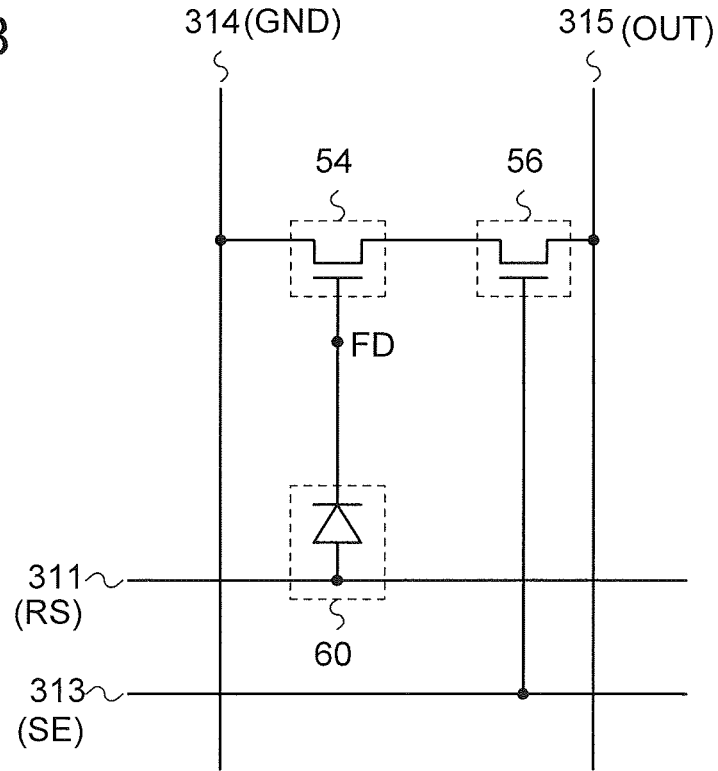

Note that FIGS. 12A and 12B and FIGS. 14A and 14B each show the example in which the transistor 51 is provided; however, one embodiment of the present invention is not limited thereto. As shown in FIGS. 15A and 15B, the transistor 51 may be omitted.

Figure 16A:
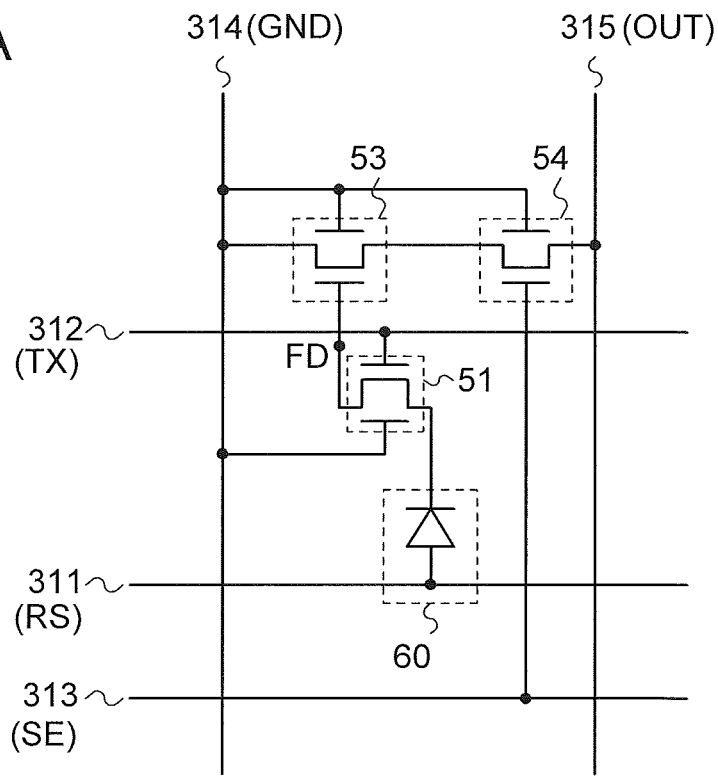
FIGS. 16A and 16B each illustrate a configuration of a pixel circuit.
Figure 16B:
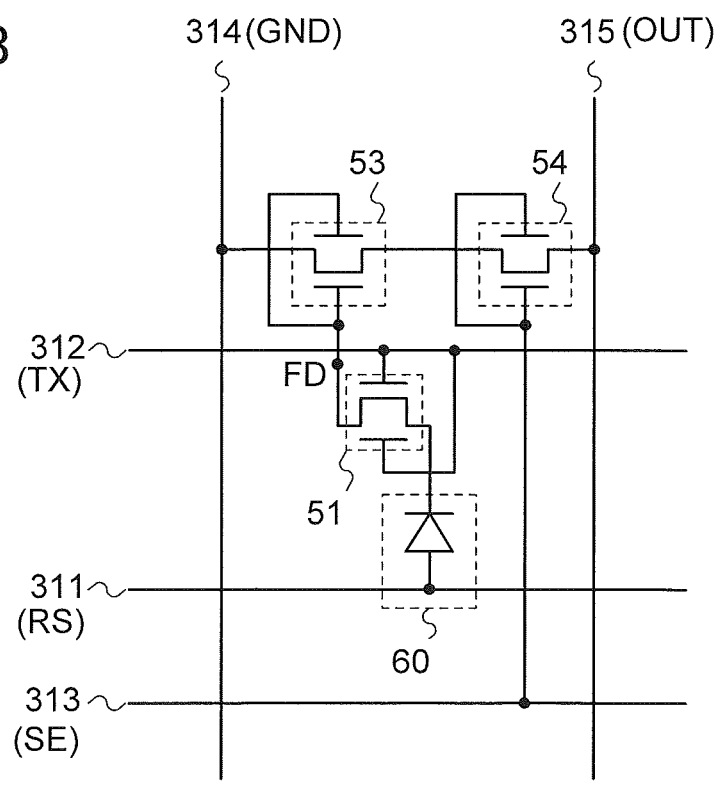

The transistor 51, the transistor 53, and the transistor 54 in the pixel circuit may each have a back gate as illustrated in FIGS. 16A and 16B. FIG. 16A illustrates a configuration of applying a constant potential to the back gates, which enables control of the threshold voltages. FIG. 16B illustrates a configuration in which the back gates are supplied with the same potential as their respective front gates, which enables an increase in on-state current. Although the back gates are electrically connected to the wiring 314 (GND) in FIG. 16A, they may be electrically connected to a different wiring to which a constant potential is supplied. Furthermore, although FIGS. 16A and 16B each illustrate an example in which back gates are provided in the transistors of the circuit in FIG. 14A, the circuits in FIGS. 12A and 12B, FIG. 14B, and FIGS. 15A and 15B may have a similar configuration. Moreover, a configuration of applying the same potential to a front gate and a back gate, a configuration of applying a constant potential to a back gate, and a configuration without a back gate may be arbitrarily combined as necessary for the transistors in one circuit.

Figure 19:
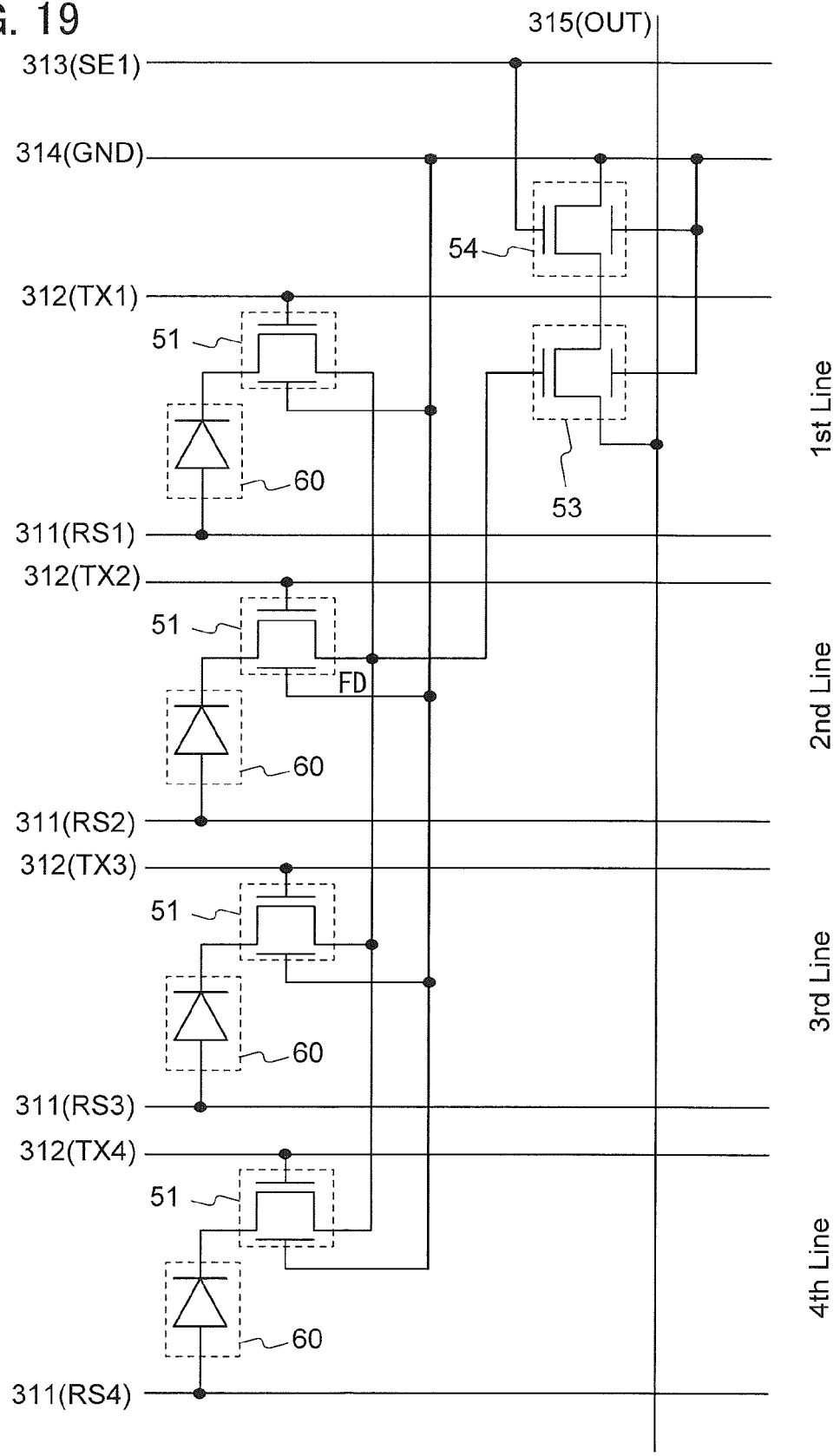
FIG. 19 illustrates a configuration of a pixel circuit.
Figure 20:
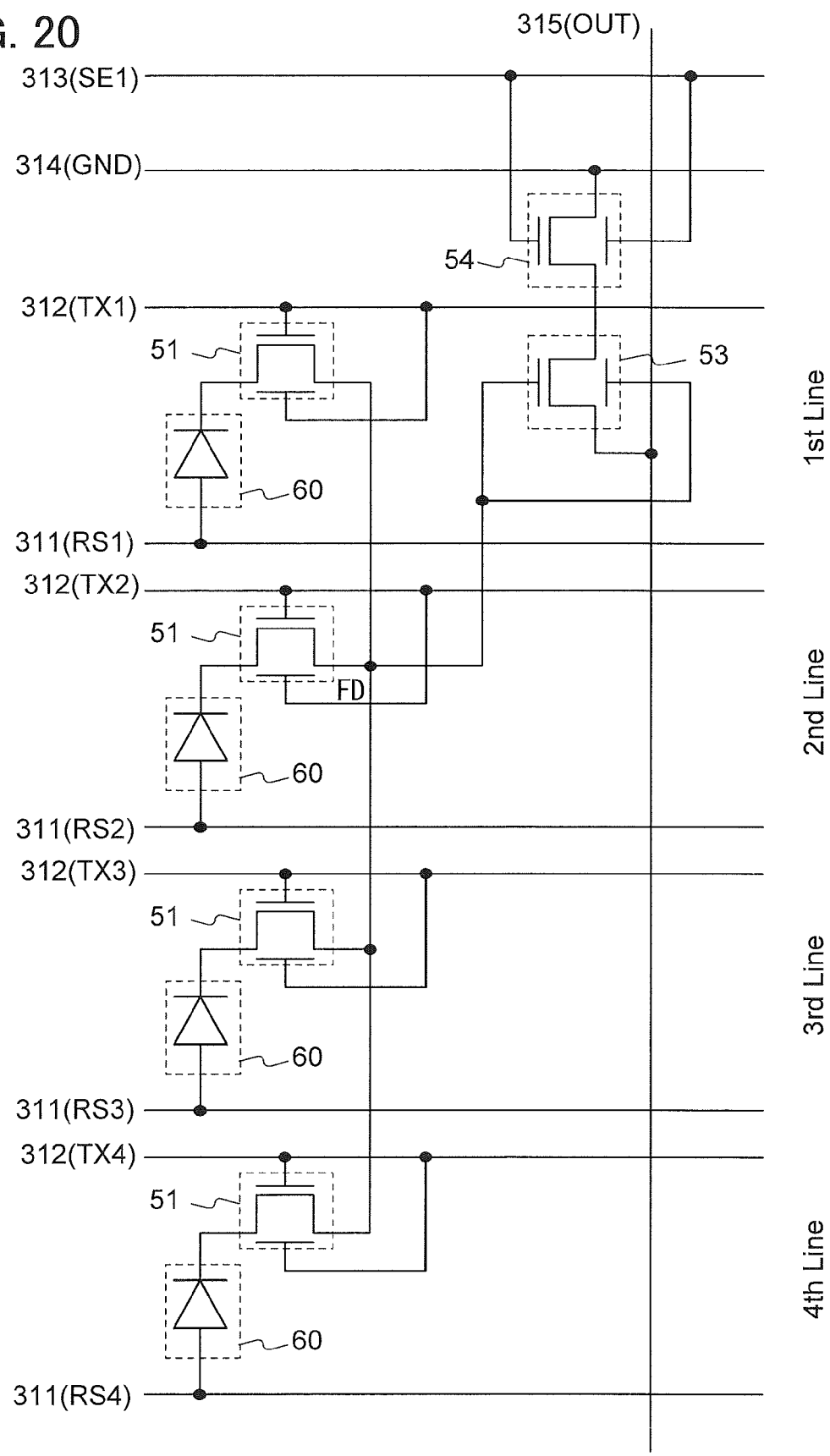
FIG. 20 illustrates a configuration of a pixel circuit.

Note that the pixel circuit in FIG. 16A may have a configuration in which the transistors 53 and 54 are shared among a plurality of pixels as illustrated in FIG. 19. Furthermore, the pixel circuit in FIG. 16B may have a configuration in which the transistors 53 and 54 are shared among a plurality of pixels as illustrated in FIG. 20.

This embodiment can be implemented in an appropriate combination with any of the structures described in the other embodiments.

Embodiment 3

In this embodiment, an example of a driving method of a pixel circuit is described.

As described in Embodiment 2, the operation of the pixel circuit is repetition of the reset operation, the accumulation operation, and the selection operation. As imaging modes in which the whole pixel matrix is controlled, a global shutter system and a rolling shutter system are known.

Figure 21A:
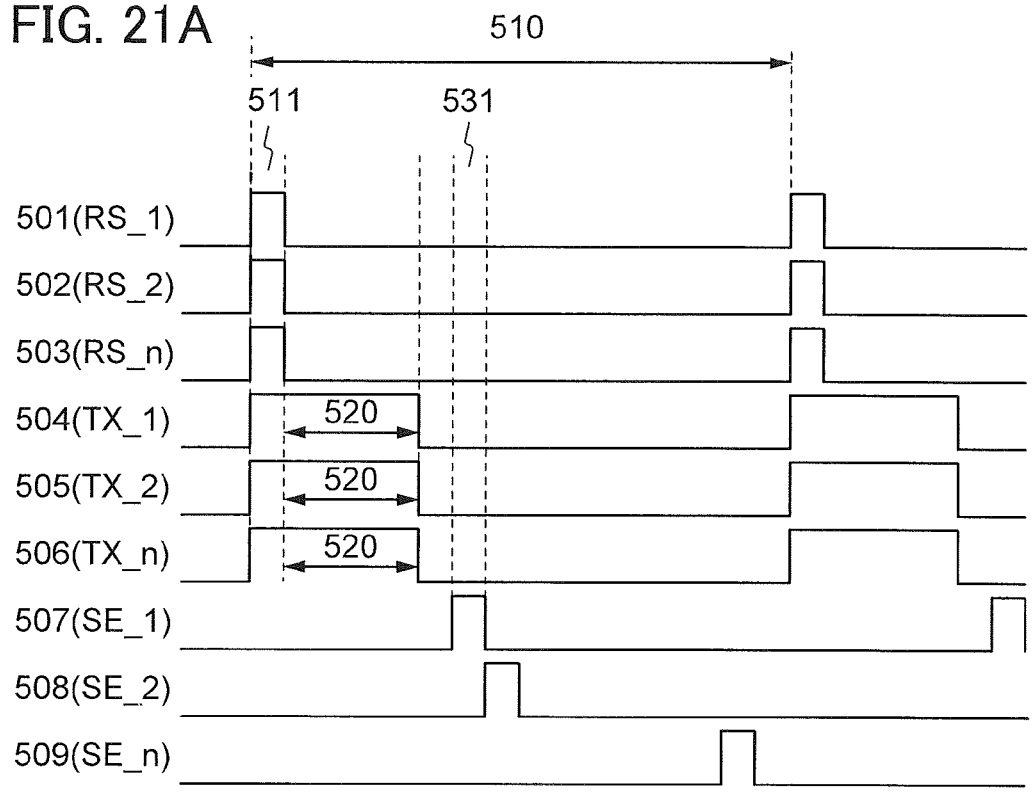
FIGS. 21A and 21B are timing charts illustrating the operations in a global shutter system and a rolling shutter system, respectively.

FIG. 21A shows a timing chart in a global shutter system. FIG. 21A shows operations of an imaging device in which a plurality of pixel circuits illustrated in FIG. 12A are arranged in a matrix. Specifically, FIG. 21A shows operations of the pixel circuits from the first row to the n-th row (n is a natural number of three or more). The following description for operation can be applied to any of the circuits in FIG. 12B, FIGS. 14A and 14B, and FIGS. 15A and 15B.

In FIG. 12A, a signal 501, a signal 502, and a signal 503 are input to the wirings 311 (RS) connected to the pixel circuits in the first row, the second row, and the n-th row, respectively. A signal 504, a signal 505, and a signal 506 are input to the wirings 312 (TX) connected to the pixel circuits in the first row, the second row, and the n-th row, respectively. A signal 507, a signal 508, and a signal 509 are input to the wirings 313 (SE) connected to the pixel circuits in the first row, the second row, and the n-th row, respectively.

A period 510 is a period required for one imaging. In a period 511, the pixel circuits in each row perform the reset operation at the same time. In a period 520, the pixel circuits in each row perform the accumulation operation at the same time. Note that the selection operation is sequentially performed in the pixel circuits on the row basis. For example, in a period 531, the selection operation is performed in the pixel circuits in the first row. As described above, in the global shutter system, the reset operation is performed in all the pixel circuits substantially at the same time, the accumulation operation is performed in all the pixel circuits substantially at the same time, and then the read operation is sequentially performed on the row basis.

That is, in the global shutter system, since the accumulation operation is performed in all the pixel circuits substantially at the same time, imaging is simultaneously performed in the pixel circuits in all the rows. Therefore, an image with little distortion can be obtained even in the case of a moving object.

Figure 21B:
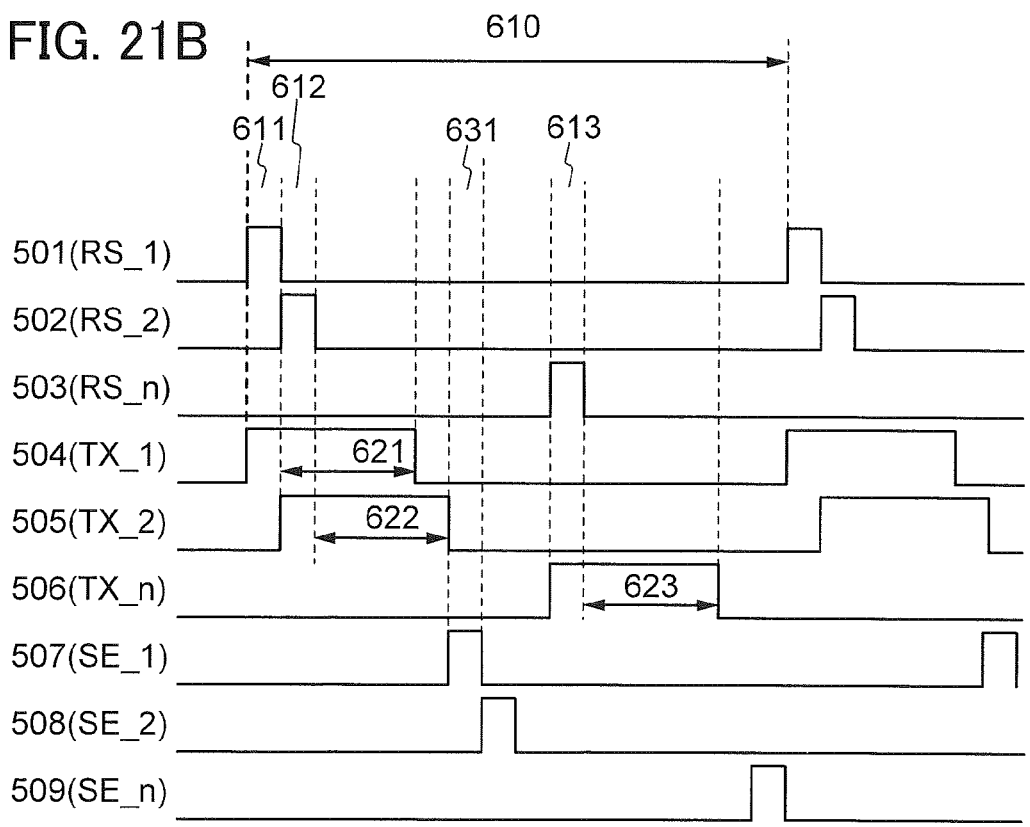

FIG. 21B is a timing chart of the case where a rolling shutter system is used. The description of FIG. 21A can be referred to for the signals 501 to 509. A period 610 is the time taken for one imaging. A period 611, a period 612, and a period 613 are reset periods in the first row, the second row, and the n-th row, respectively. A period 621, a period 622, and a period 623 are accumulation operation periods in the first row, the second row, and the n-th row, respectively. In a period 631, the selection operation is performed in the pixel circuits in the first row. As described above, in the rolling shutter system, the accumulation operation is not performed at the same time in all the pixel circuits but is sequentially performed on the row basis; thus, imaging is not simultaneously performed in the pixel circuits in all the rows. Therefore, the timing of imaging in the first row is different from that of imaging in the last row, and thus an image with large distortion is obtained in the case of a moving object.

To perform the global shutter system, the potential of the charge storage portion (FD) in each pixel circuit needs to be kept for a long time until sequential reading of signals from the pixels is terminated. When a transistor including a channel formation region formed of an oxide semiconductor and having an extremely low off-state current is used as the transistor 51 and the like, the potential of the charge storage portion (FD) can be kept for a long time. In the case where a transistor including a channel formation region formed of silicon or the like is used as the transistor 51 and the like, the potential of the charge storage portion (FD) cannot be kept for a long time because of a high off-state current, which makes it difficult to use the global shutter system.

The use of transistors including a channel formation region formed of an oxide semiconductor in the pixel circuits makes it easy to perform the global shutter system.

This embodiment can be implemented in an appropriate combination with any of the structures described in the other embodiments.

Embodiment 4

In this embodiment, a transistor including an oxide semiconductor that can be used in one embodiment of the present invention is described with reference to drawings. In the drawings in this embodiment, some components are enlarged, reduced in size, or omitted for easy understanding.

Figure 22A:
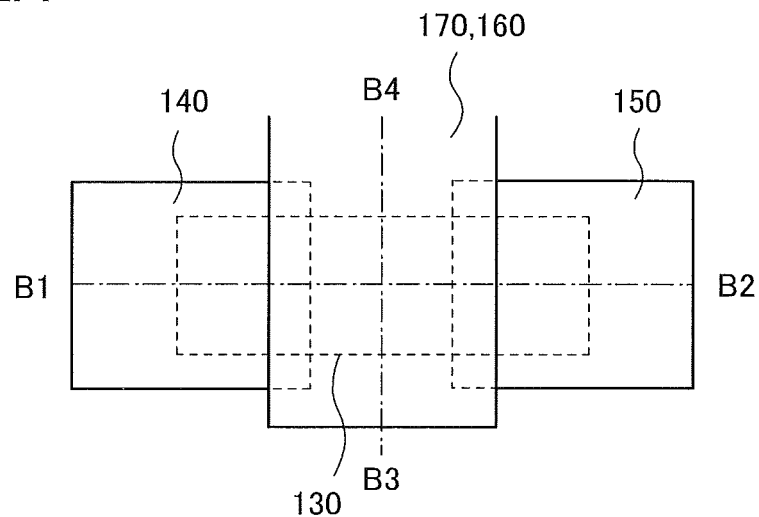
FIGS. 22A and 22B are a plan view and a cross-sectional view of a transistor.
Figure 22B:
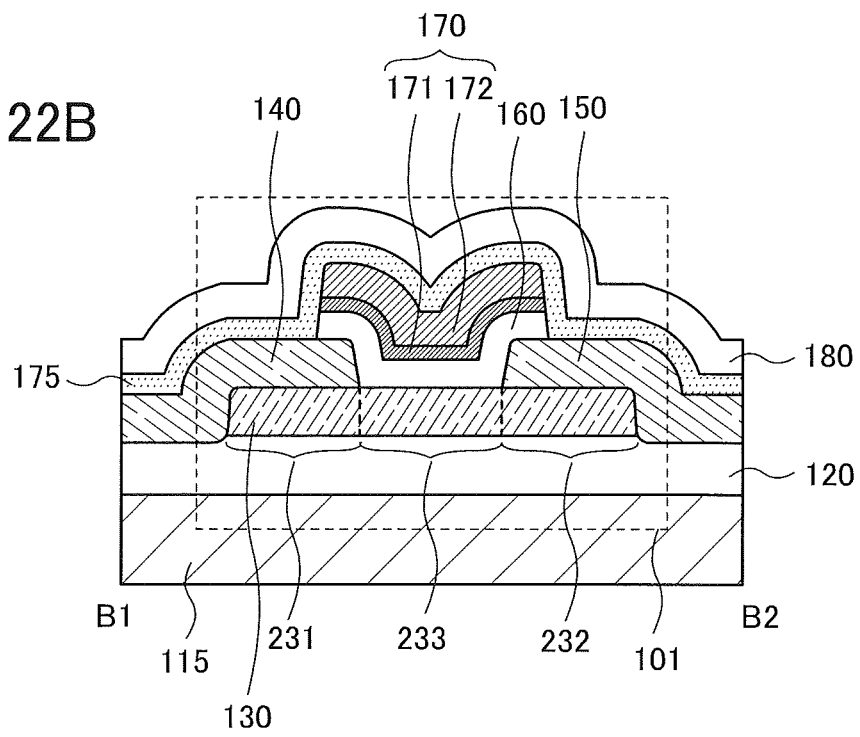
Figure 28A:
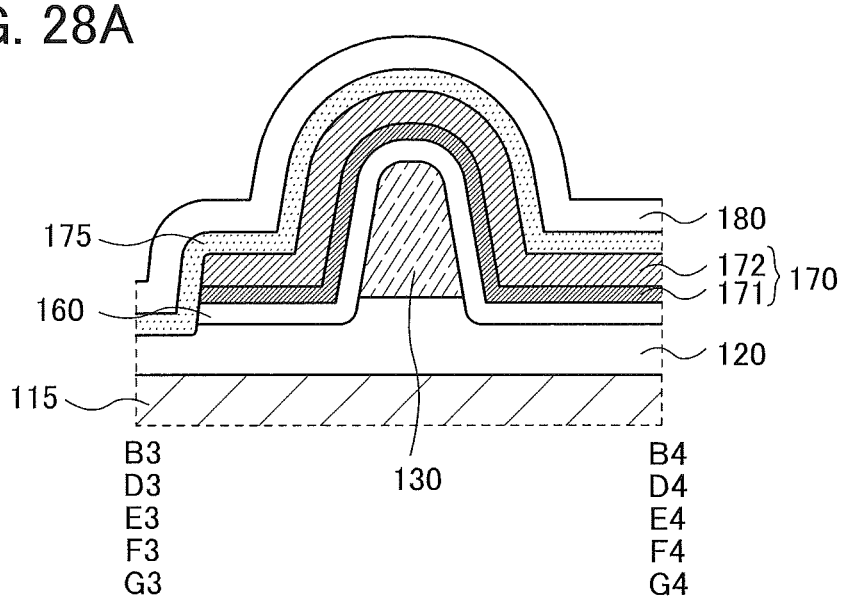
FIGS. 28A to 28D each illustrate a cross section of a transistor in the channel width direction.

FIGS. 22A and 22B are a top view and a cross-sectional view illustrating a transistor 101 in one embodiment of the present invention. FIG. 22A is the top view, and FIG. 22B illustrates a cross section taken along dashed-dotted line B1-B2 in FIG. 22A. A cross section in the direction of dashed-dotted line B3-B4 in FIG. 22A is illustrated in FIG. 28A. Note that the direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. A function of a planarization film may be added to the insulating layer 180 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 22B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring".

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 23A:
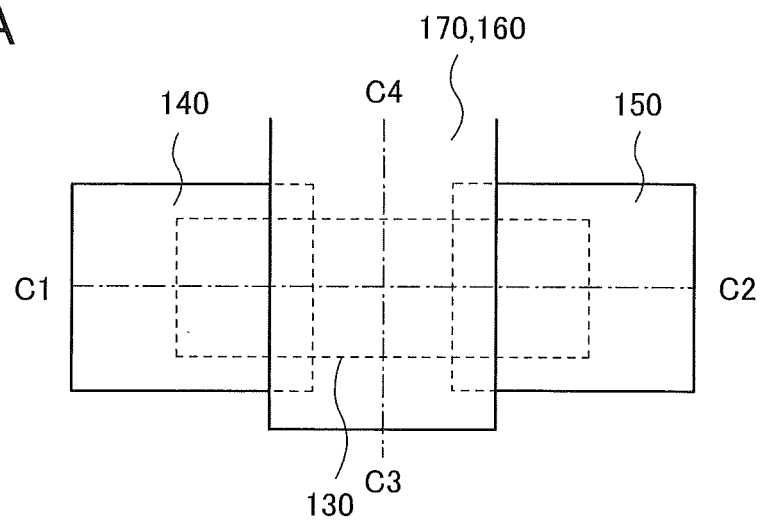
FIGS. 23A and 23B are a plan view and a cross-sectional view of a transistor.
Figure 23B:
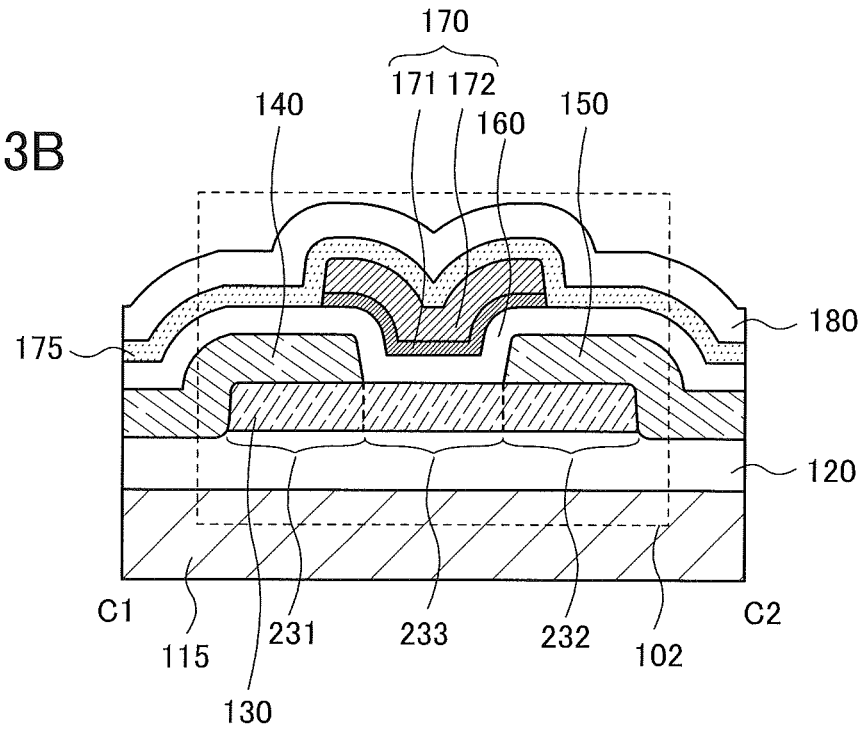
Figure 28B:
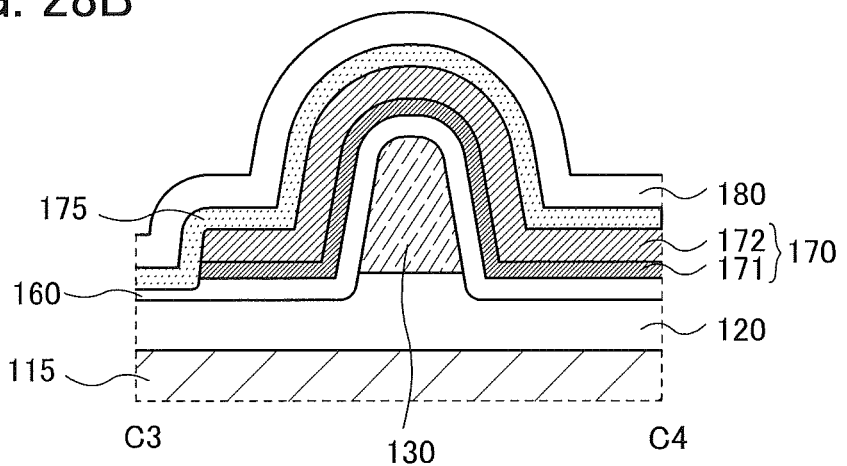

The transistor in one embodiment of the present invention may have a structure illustrated in FIGS. 23A and 23B. FIG. 23A is a top view of a transistor 102. A cross section in the direction of dashed-dotted line C1-C2 in FIG. 23A is illustrated in FIG. 23B. A cross section in the direction of dashed-dotted line C3-C4 in FIG. 23A is illustrated in FIG. 28B. Note that the direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 24A:
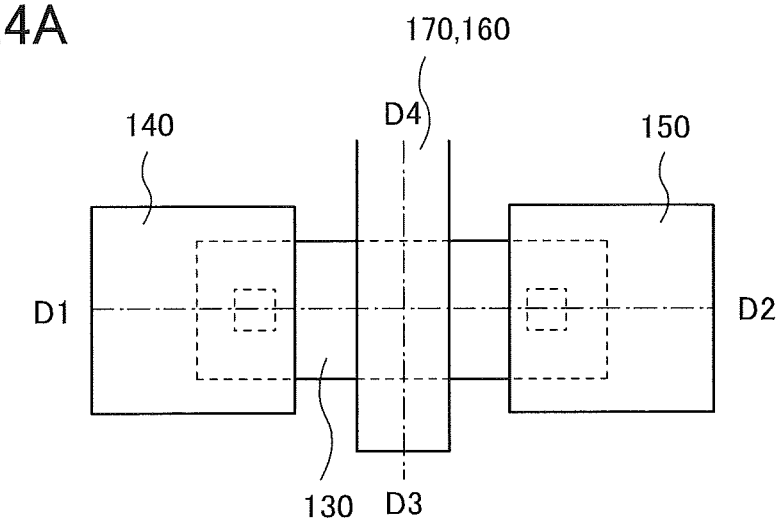
FIGS. 24A and 24B are a plan view and a cross-sectional view of a transistor.
Figure 24B:
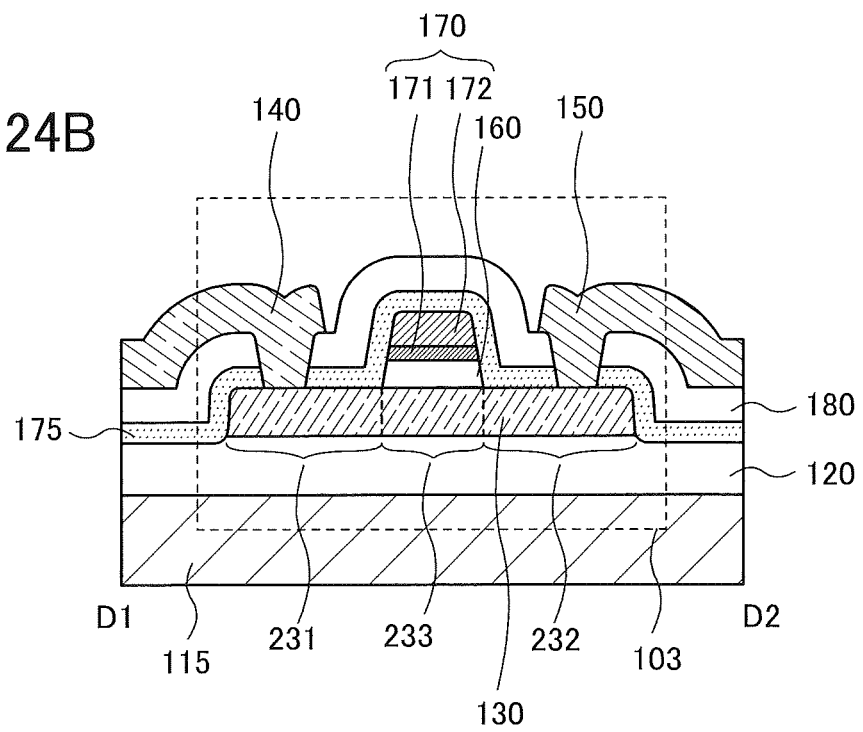

The transistor in one embodiment of the present invention may have a structure illustrated in FIGS. 24A and 24B. FIG. 24A is a top view of a transistor 103. A cross section in the direction of dashed-dotted line D1-D2 in FIG. 24A is illustrated in FIG. 24B. A cross section in the direction of dashed-dotted line D3-D4 in FIG. 24A is illustrated in FIG. 28A. Note that the direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 24B can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 25A:
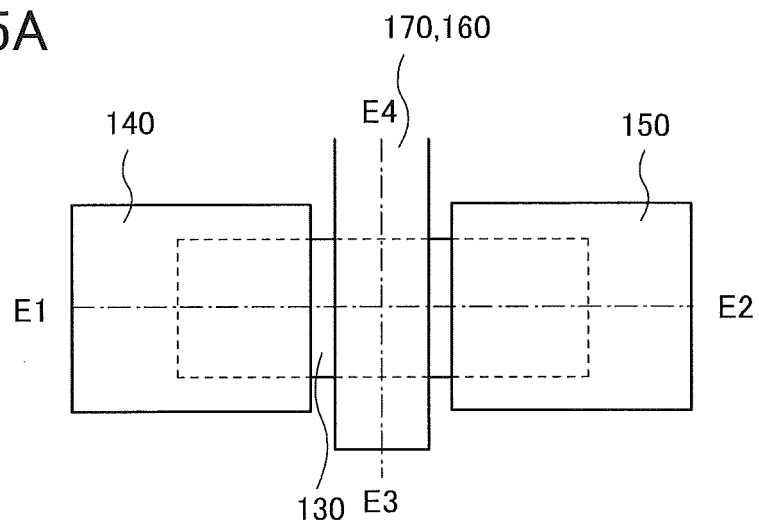
FIGS. 25A and 25B are a plan view and a cross-sectional view of a transistor.
Figure 25B:
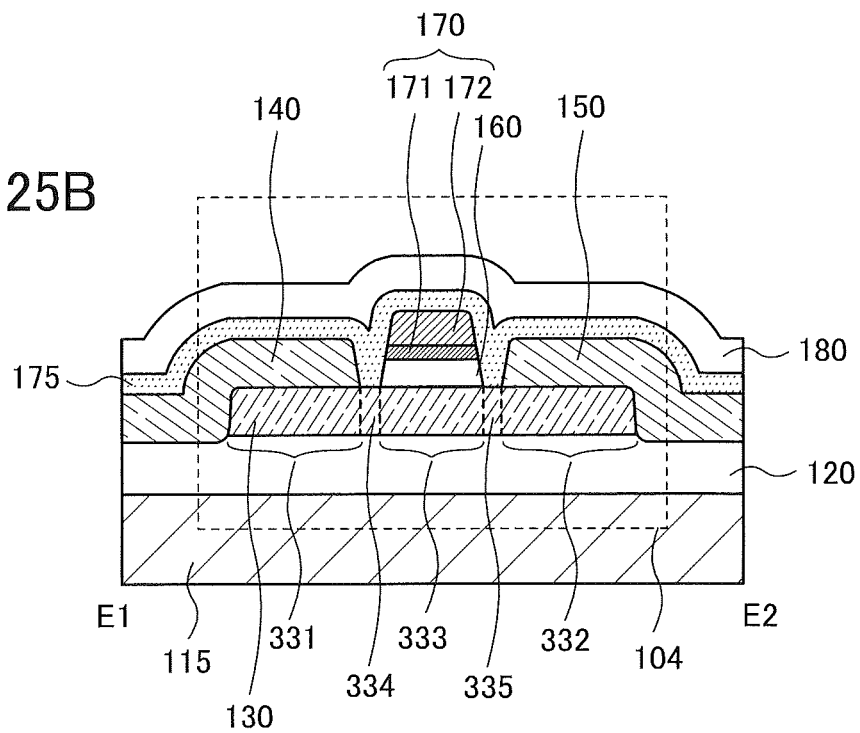

The transistor in one embodiment of the present invention may have a structure illustrated in FIGS. 25A and 25B. FIG. 25A is a top view of a transistor 104. A cross section in the direction of dashed-dotted line E1-E2 in FIG. 25A is illustrated in FIG. 25B. A cross section in the direction of dashed-dotted line E3-E4 in FIG. 25A is illustrated in FIG. 28A. Note that the direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer.

In FIG. 25B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, the above-described structure for reducing the resistance is not employed for the regions 334 and 335 in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 26A:
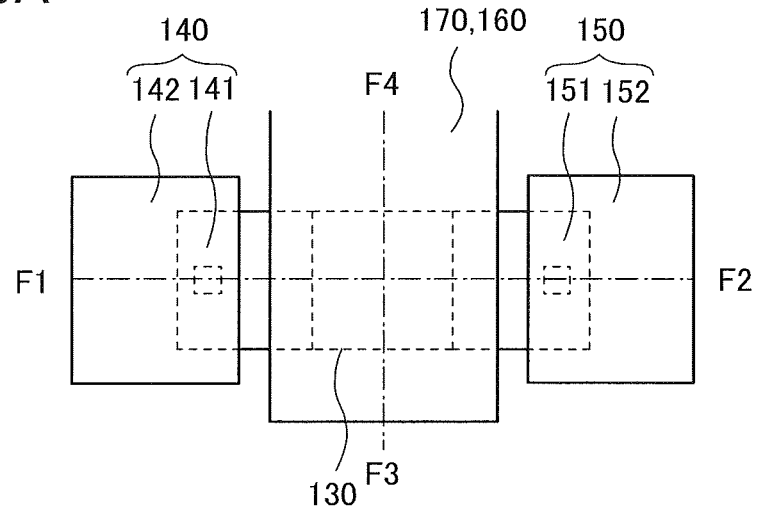
FIGS. 26A and 26B are a plan view and a cross-sectional view of a transistor.
Figure 26B:
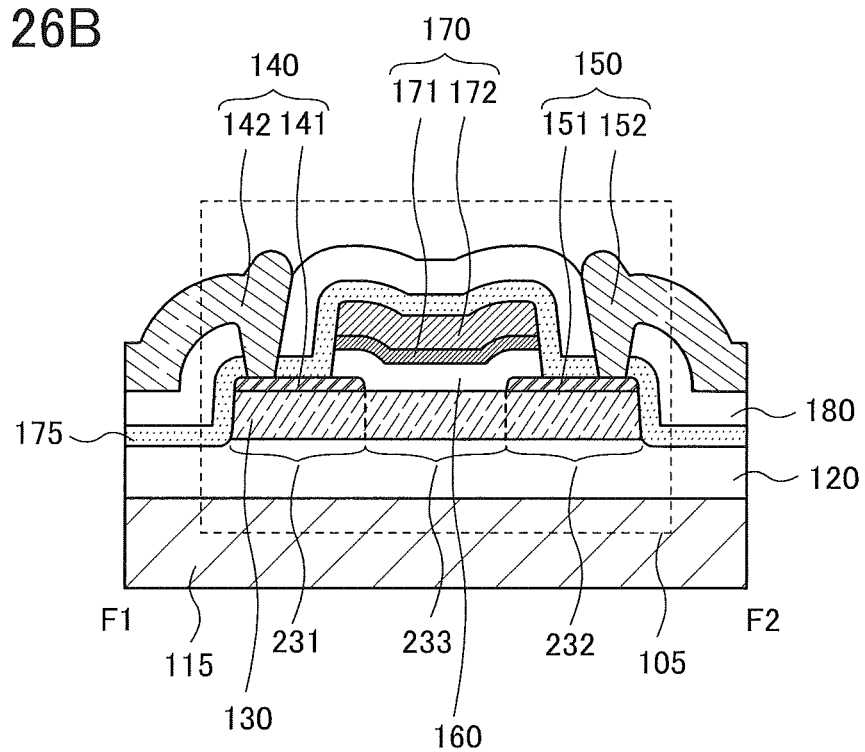

The transistor in one embodiment of the present invention may have a structure illustrated in FIGS. 26A and 26B. FIG. 26A is a top view of a transistor 105. A cross section in the direction of dashed-dotted line F1-F2 in FIG. 26A is illustrated in FIG. 26B. A cross section in the direction of dashed-dotted line F3-F4 in FIG. 26A is illustrated in FIG. 28A. Note that the direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 27A:
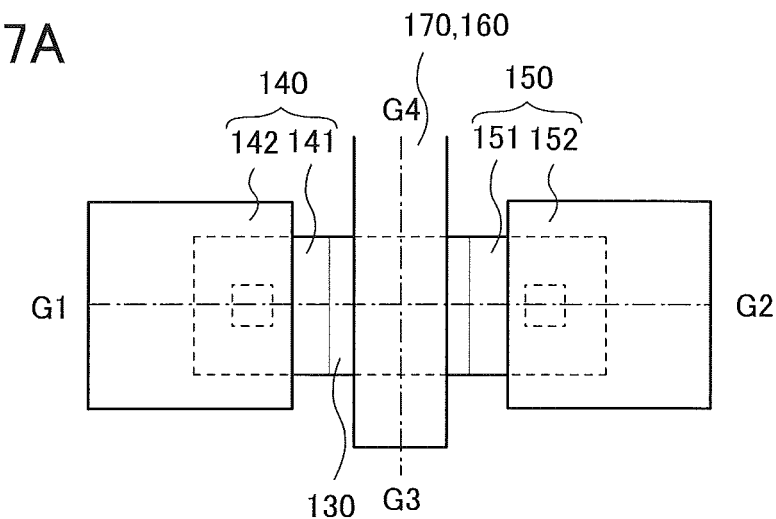
FIGS. 27A and 27B are a plan view and a cross-sectional view of a transistor.
Figure 27B:
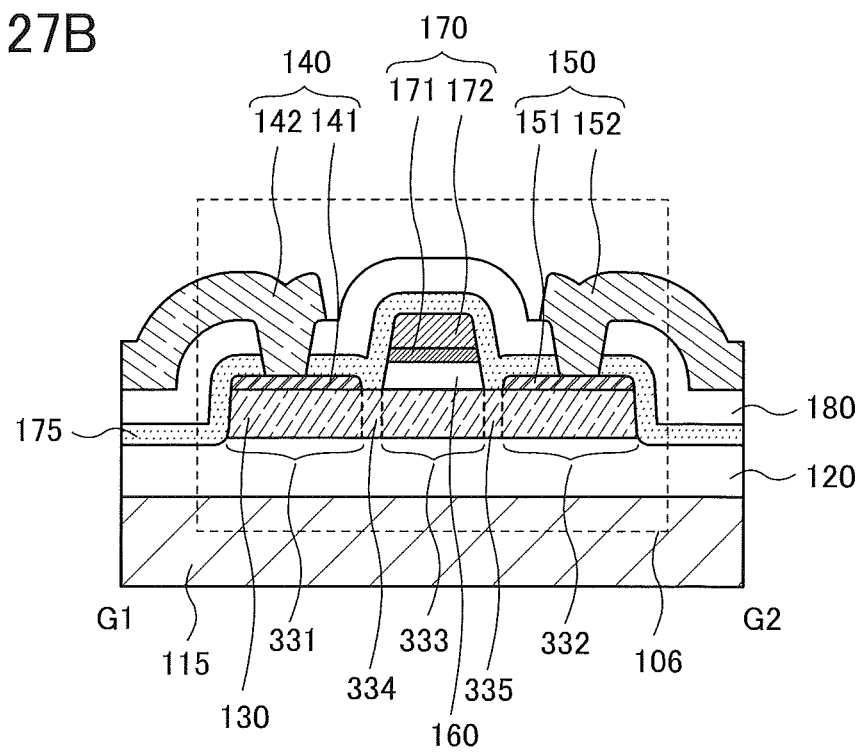

The transistor in one embodiment of the present invention may have a structure illustrated in FIGS. 27A and 27B. FIG. 27A is a top view of a transistor 106. A cross section in the direction of dashed-dotted line G1-G2 in FIG. 27A is illustrated in FIG. 27B. A cross section in the direction of dashed-dotted line G3-G4 in FIG. 27A is illustrated in FIG. 28A. Note that the direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 28C:
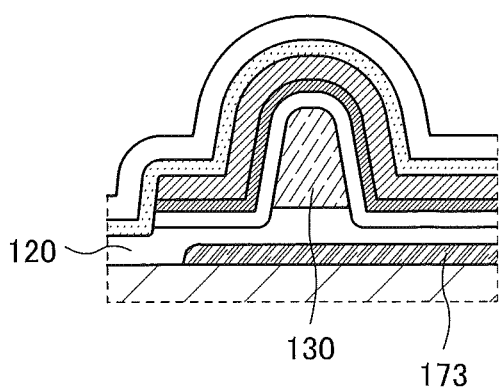
Figure 28D:
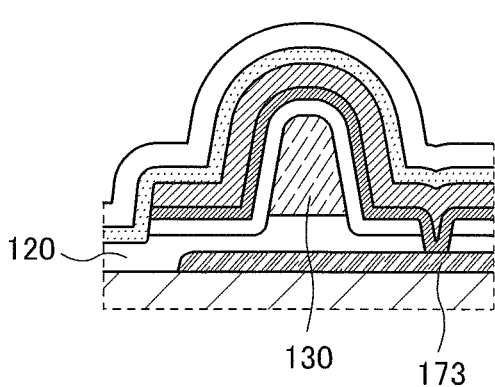
Figure 29A:
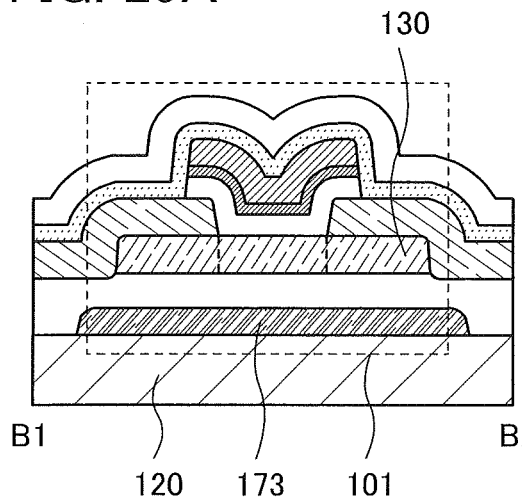
FIGS. 29A to 29F each illustrate a cross section of a transistor in the channel length direction.
Figure 29B:
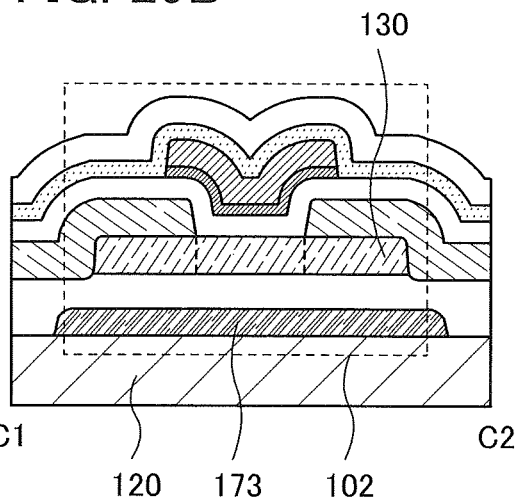
Figure 29C:
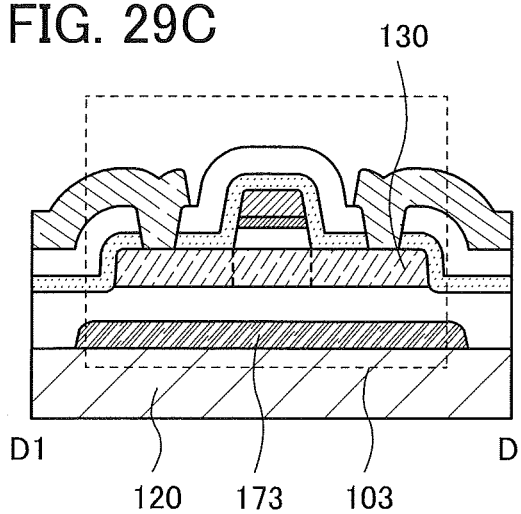
Figure 29D:
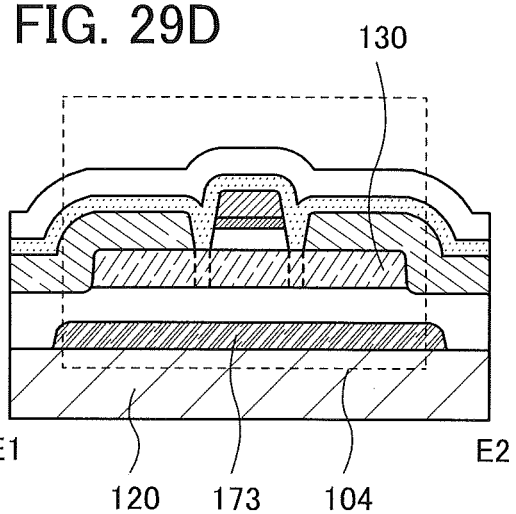
Figure 29E:
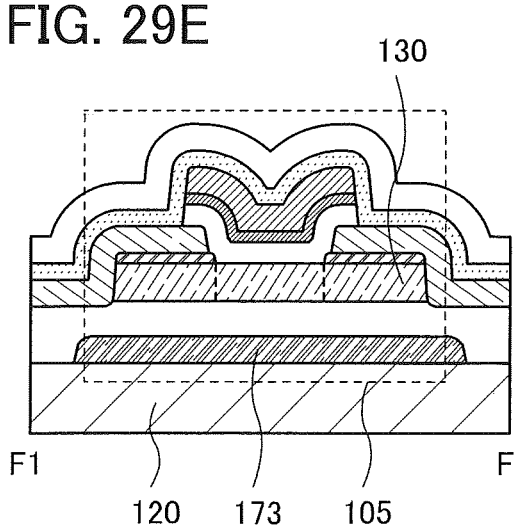
Figure 29F:
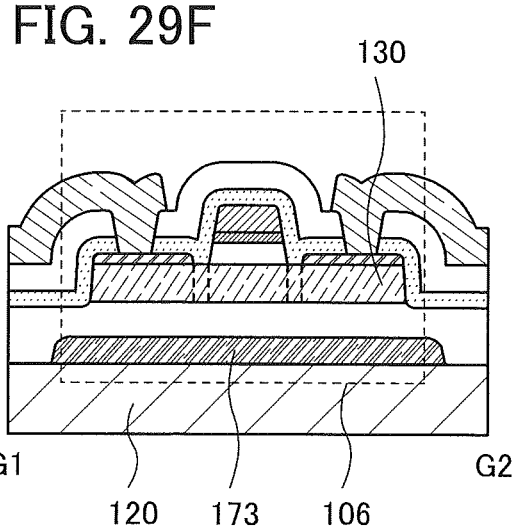

The transistor in one embodiment of the present invention may include a conductive layer 173 between the oxide semiconductor layer 130 and the substrate 115 as illustrated in cross-sectional views in the channel length direction in FIGS. 29A to 29F and cross-sectional views in the channel width direction in FIGS. 28C and 28D. When the conductive layer is used as a second gate electrode layer (back gate), the on-state current can be increased or the threshold voltage can be controlled. In the cross-sectional views in FIGS. 29A to 29F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 28D, the conductive layers 170 and 173 may be electrically connected to each other through a contact hole.

Although the transistors 101 to 106 in FIGS. 22A and 22B, FIGS. 23A and 23B, FIGS. 24A and 24B, FIGS. 25A and 25B, FIGS. 26A and 26B, and FIGS. 27A and 27B are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIG. 30B, 30C, 30D, or 30E.

Figure 30A:
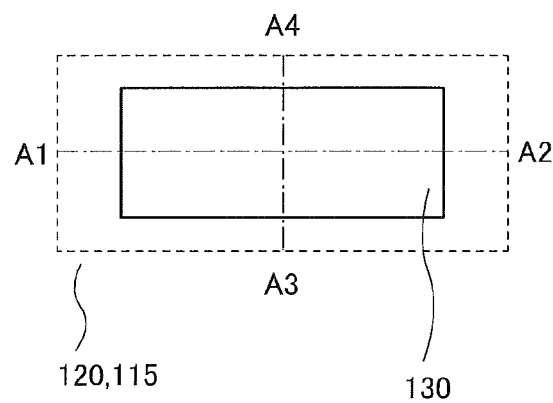
FIGS. 30A to 30E are a plan view and cross-sectional views each illustrating a semiconductor layer.
Figure 30B:
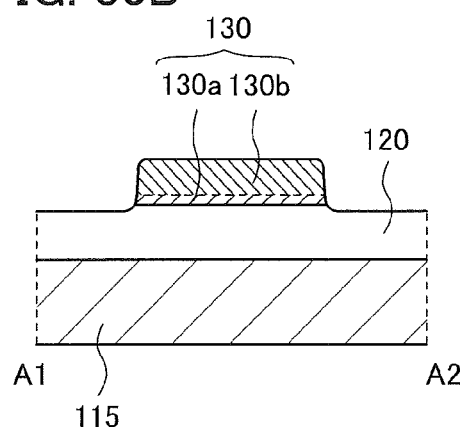
Figure 30D:
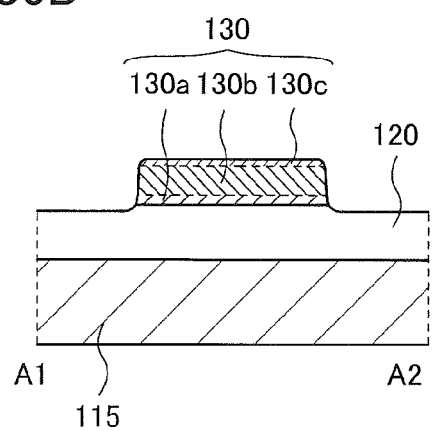
Figure 30C:
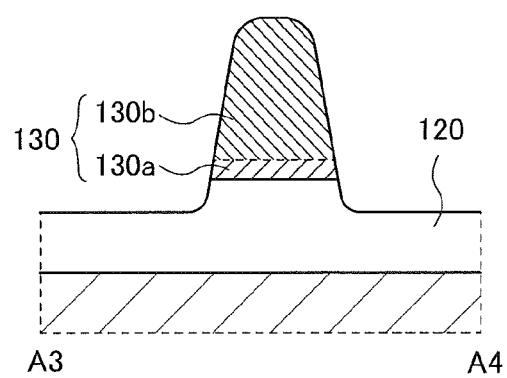
Figure 30E:
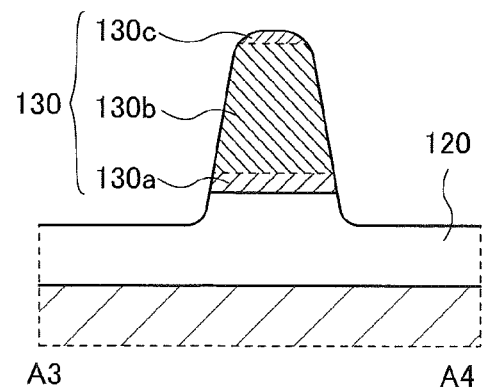

FIG. 30A is a top view of the oxide semiconductor layer 130, and FIGS. 30B and 30C are cross-sectional views of the oxide semiconductor layer 130 with a two-layer structure. FIGS. 30D and 30E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 31A:
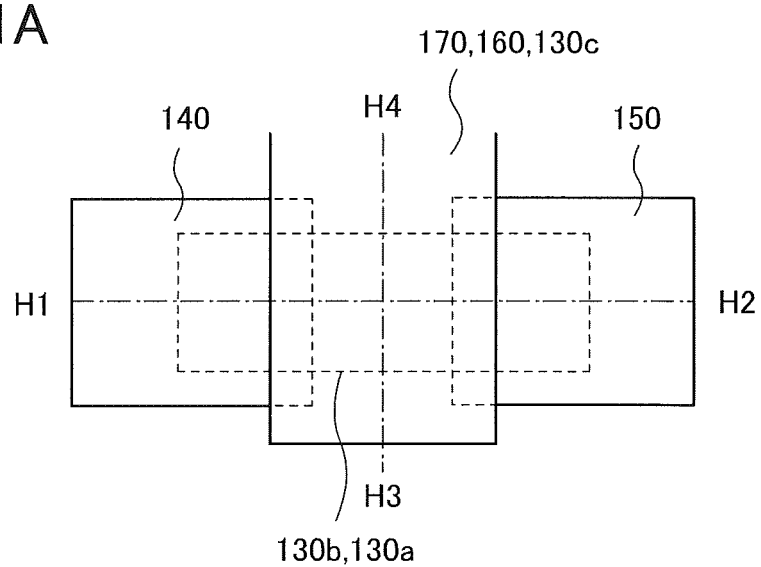
FIGS. 31A and 31B are a plan view and a cross-sectional view of a transistor.
Figure 31B:
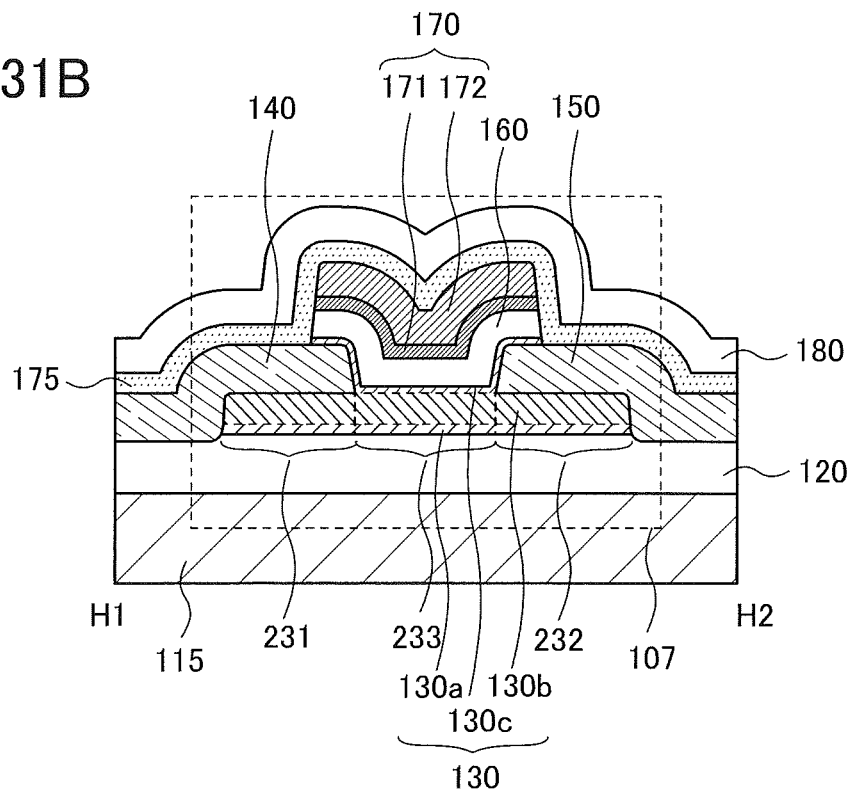
Figure 37A:
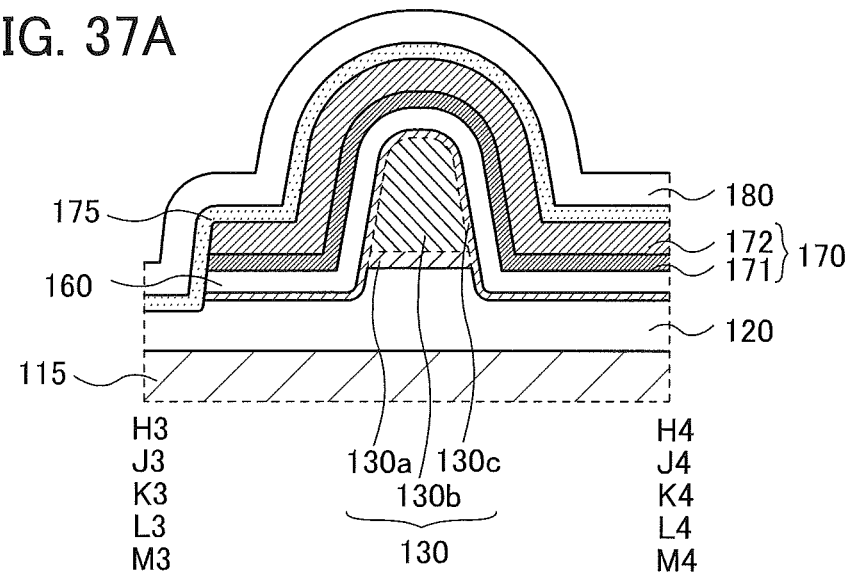
FIGS. 37A to 37D each illustrate a cross section of a transistor in the channel width direction.

The transistor in one embodiment of the present invention may have a structure illustrated in FIGS. 31A and 31B. FIG. 31A is a top view of a transistor 107. A cross section in the direction of dashed-dotted line H1-H2 in FIG. 31A is illustrated in FIG. 31B. A cross section in the direction of dashed-dotted line H3-H4 in FIG. 31A is illustrated in FIG. 37A. Note that the direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. A function of a planarization film may be added to the insulating layer 180 as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 32A:
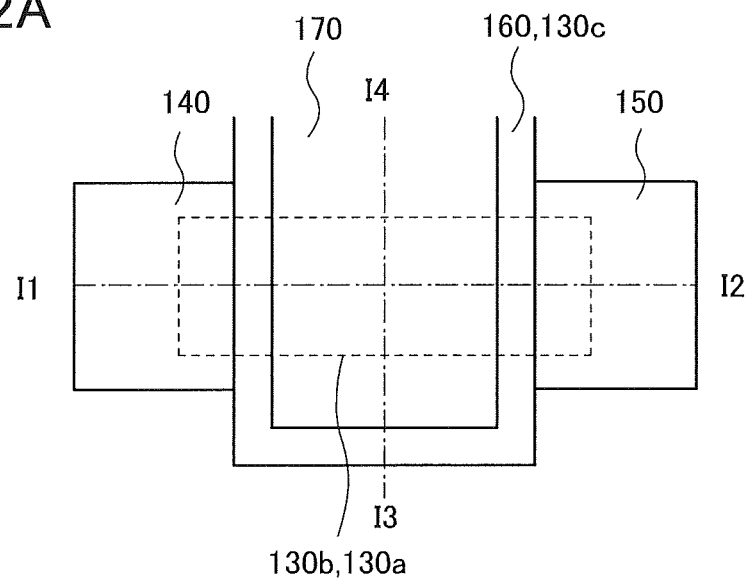
FIGS. 32A and 32B are a plan view and a cross-sectional view of a transistor.
Figure 32B:
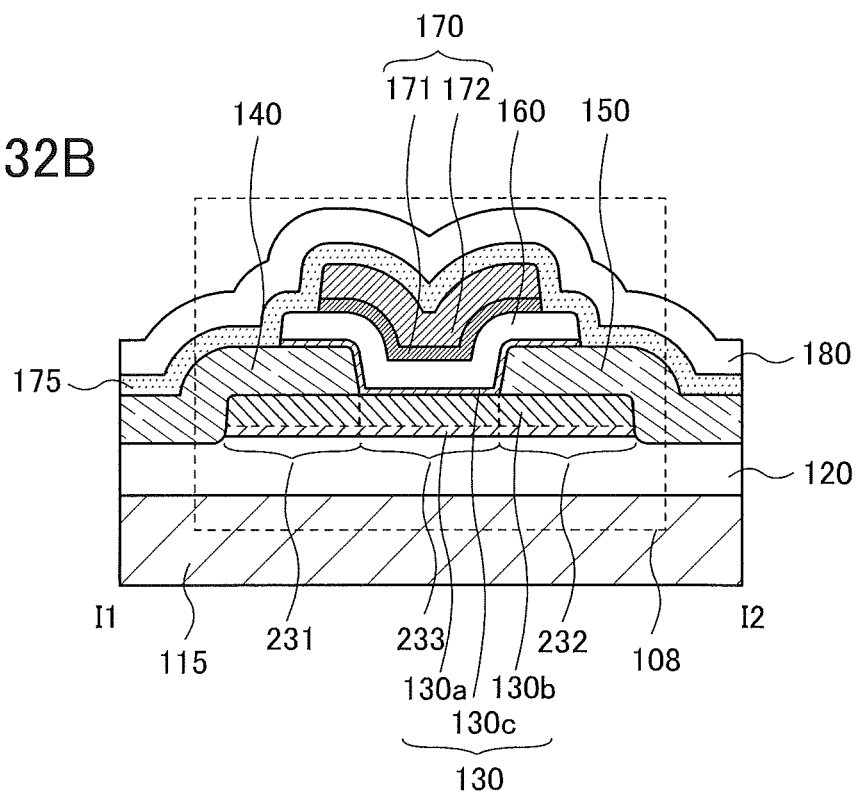
Figure 37B:
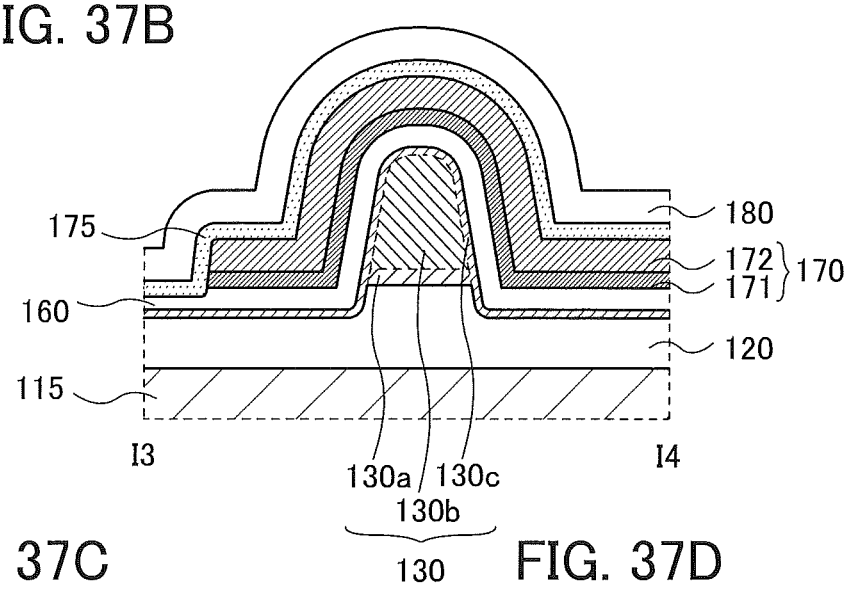

The transistor in one embodiment of the present invention may have a structure illustrated in FIGS. 32A and 32B. FIG. 32A is a top view of a transistor 108. A cross section in the direction of dashed-dotted line 11-12 in FIG. 32A is illustrated in FIG. 32B. A cross section in the direction of dashed-dotted line 13-14 in FIG. 32A is illustrated in FIG. 37B. In some cases, the direction of dashed-dotted line 11-12 is referred to as a channel length direction, and the direction of dashed-dotted line 13-14 is referred to as a channel width direction.

The transistor 108 is different from the transistor 107 in that end portions of the insulating layer 160 and the oxide semiconductor layer 130c are not aligned with the end portion of the conductive layer 170.

Figure 33A:
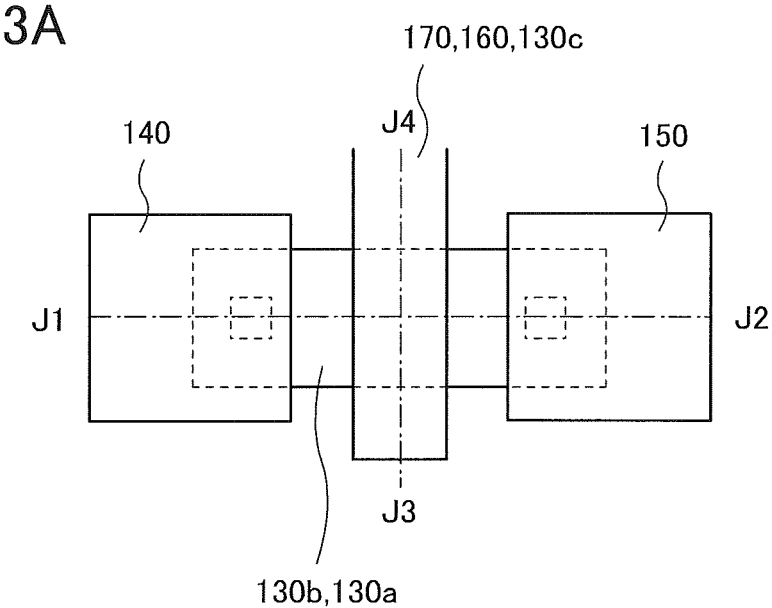
FIGS. 33A and 33B are a plan view and a cross-sectional view of a transistor.
Figure 33B:
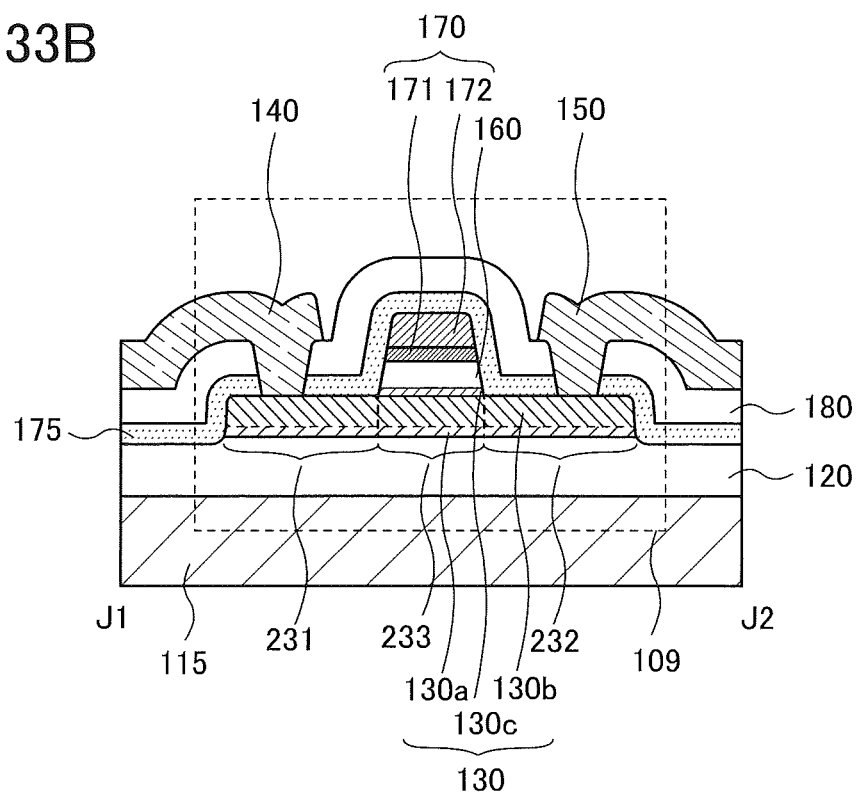

The transistor in one embodiment of the present invention may have a structure illustrated in FIGS. 33A and 33B. FIG. 33A is a top view of a transistor 109. A cross section in the direction of dashed-dotted line J1-J2 in FIG. 33A is illustrated in FIG. 33B. A cross section in the direction of dashed-dotted line J3-J4 in FIG. 33A is illustrated in FIG. 37A. Note that the direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 34A:
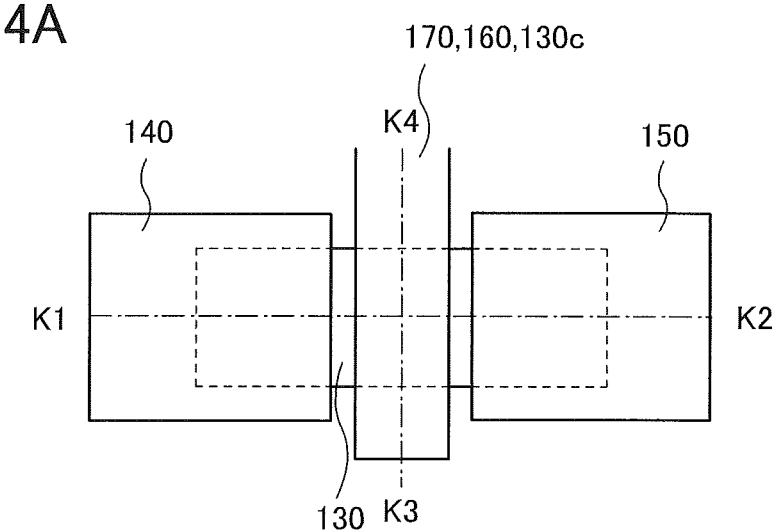
FIGS. 34A and 34B are a plan view and a cross-sectional view of a transistor.
Figure 34B:
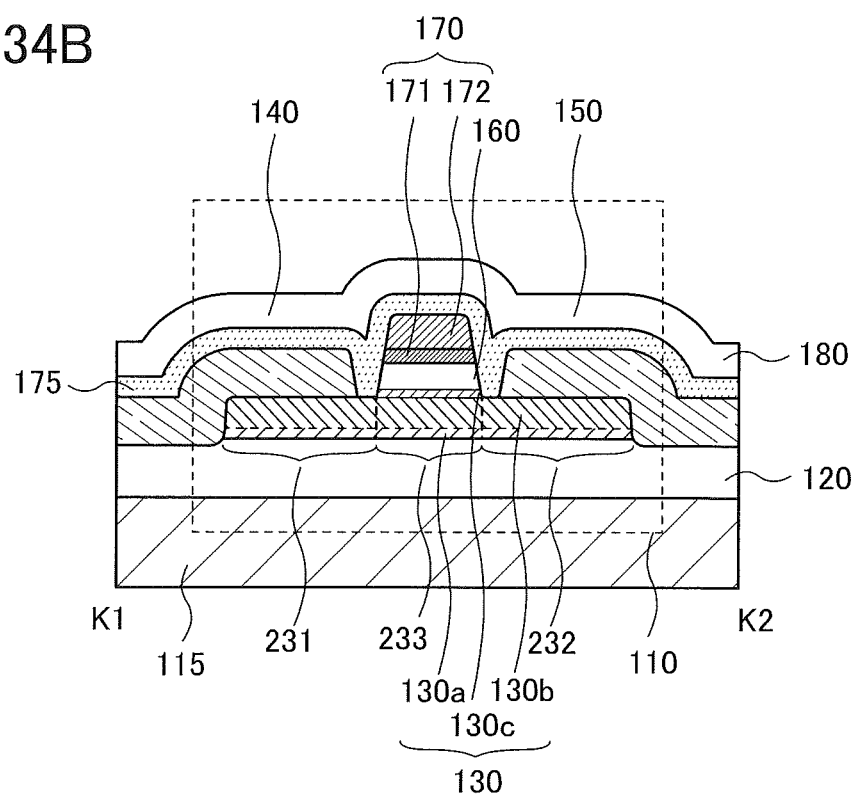

The transistor in one embodiment of the present invention may have a structure illustrated in FIGS. 34A and 34B. FIG. 34A is a top view of a transistor 110. A cross section in the direction of dashed-dotted line K1-K2 in FIG. 34A is illustrated in FIG. 34B. A cross section in the direction of dashed-dotted line K3-K4 in FIG. 34A is illustrated in FIG. 37A. Note that the direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 35A:
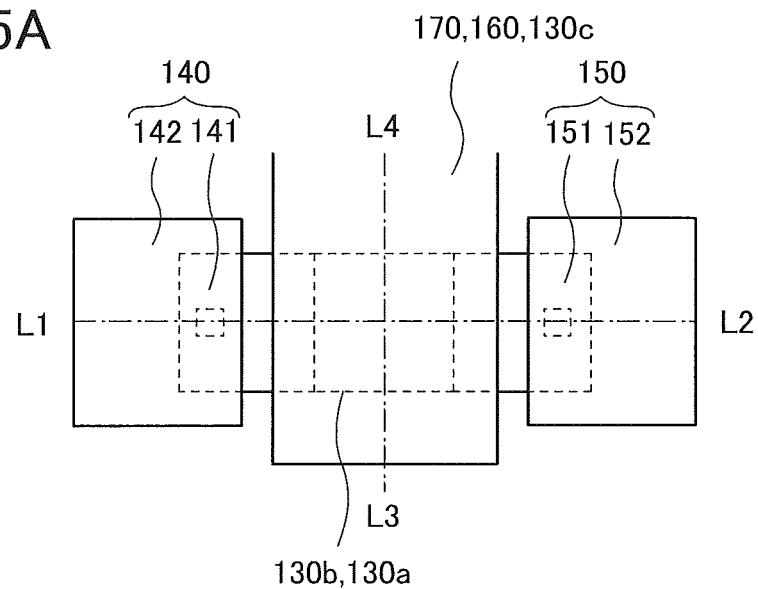
FIGS. 35A and 35B are a plan view and a cross-sectional view of a transistor.
Figure 35B:
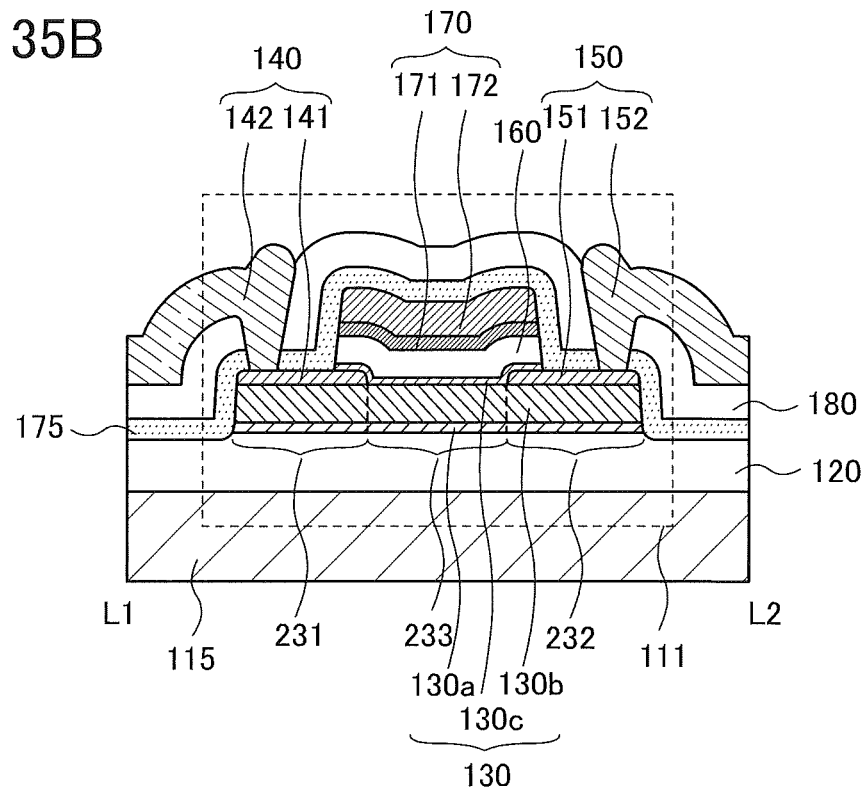

The transistor in one embodiment of the present invention may have a structure illustrated in FIGS. 35A and 35B. FIG. 35A is a top view of a transistor 111. A cross section in the direction of dashed-dotted line L1-L2 in FIG. 35A is illustrated in FIG. 35B. A cross section in the direction of dashed-dotted line L3-L4 in FIG. 35A is illustrated in FIG. 37A. Note that the direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 36A:
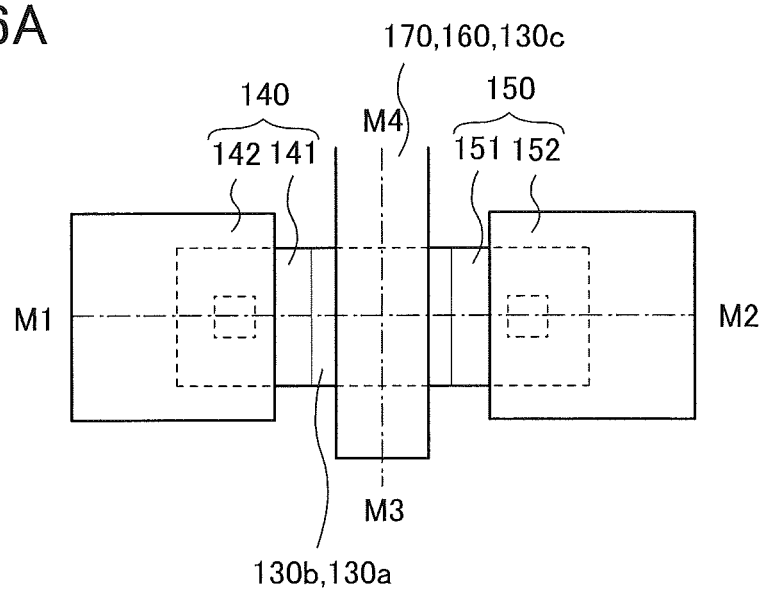
FIGS. 36A and 36B are a plan view and a cross-sectional view of a transistor.
Figure 36B:
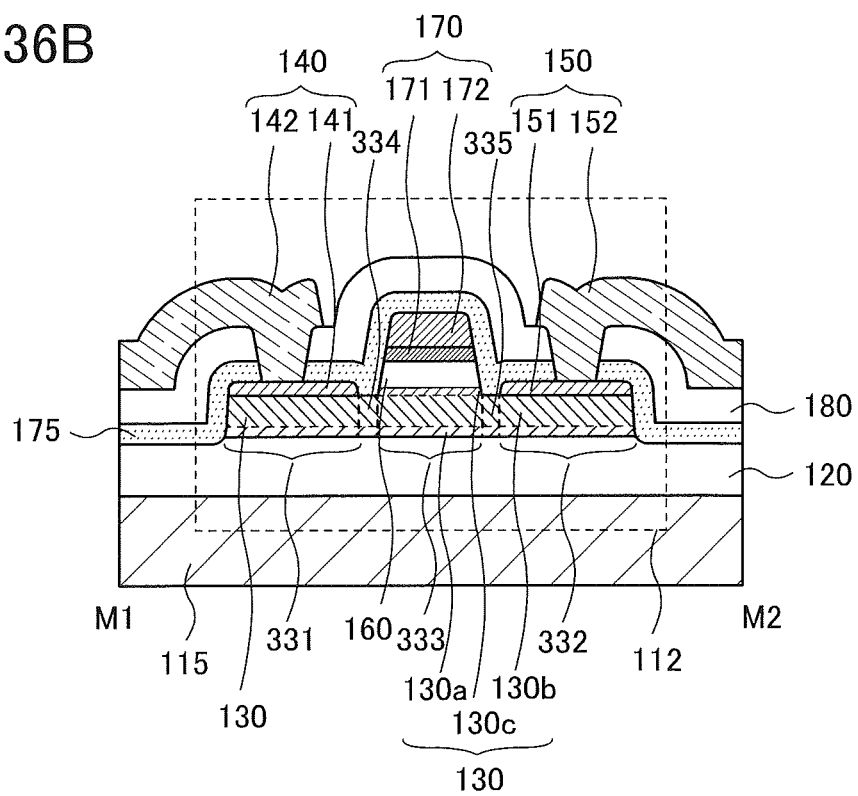

The transistor in one embodiment of the present invention may have a structure illustrated in FIGS. 36A and 36B. FIG. 36A is a top view of a transistor 112. A cross section in the direction of dashed-dotted line M1-M2 in FIG. 36A is illustrated in FIG. 36B. A cross section in the direction of dashed-dotted line M3-M4 in FIG. 36A is illustrated in FIG. 37A. Note that the direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 37C:
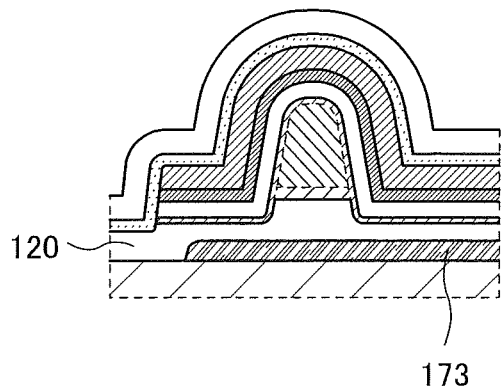
Figure 37D:
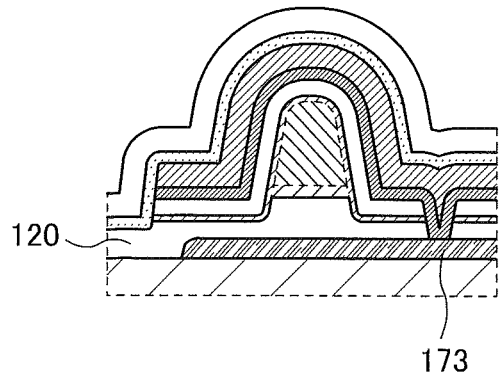
Figure 38A:
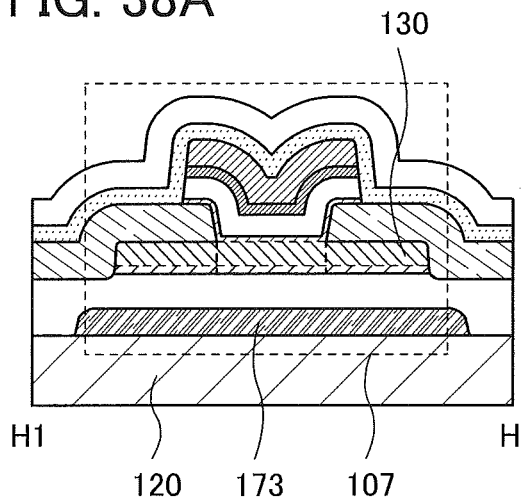
FIGS. 38A to 38F each illustrate a cross section of a transistor in the channel length direction.
Figure 38B:
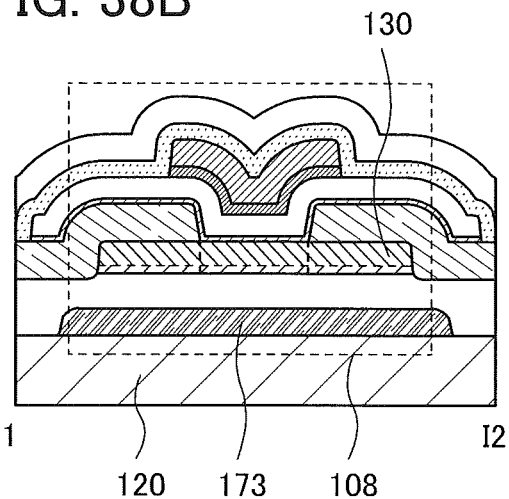
Figure 38C:
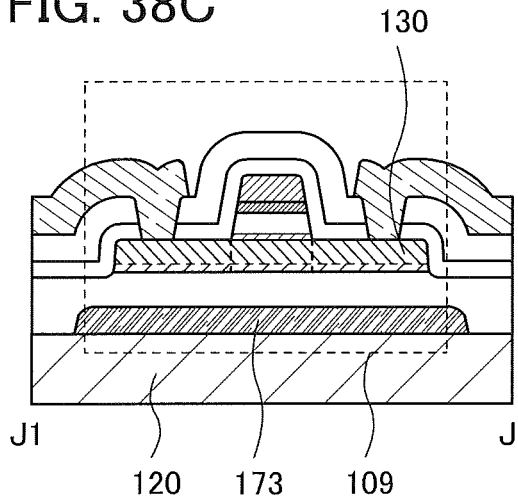
Figure 38D:
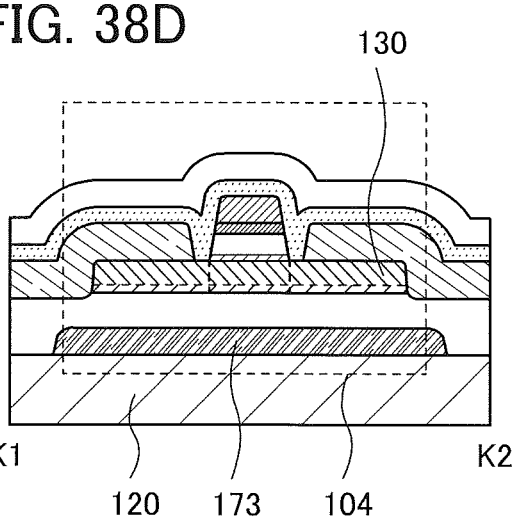
Figure 38E:
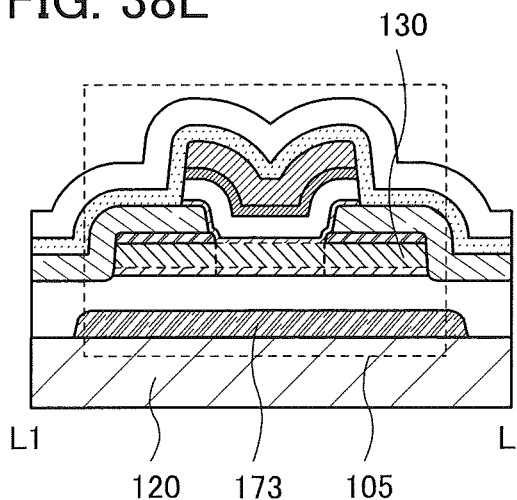
Figure 38F:
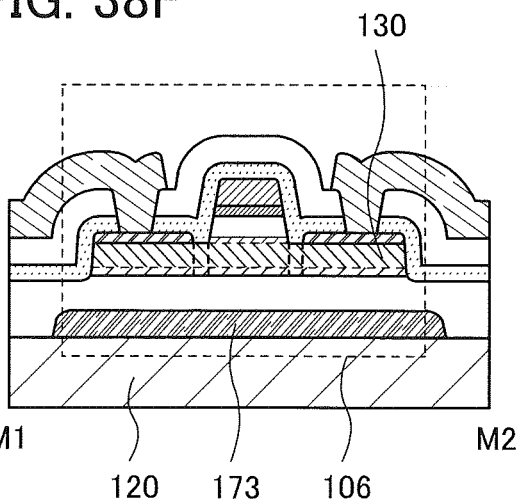

The transistor in one embodiment of the present invention may include the conductive layer 173 between the oxide semiconductor layer 130 and the substrate 115 as illustrated in cross-sectional views in the channel length direction in FIGS. 38A to 38F and cross-sectional views in the channel width direction in FIGS. 37C and 37D. When the conductive layer is used as a second gate electrode layer (back gate), the on-state current can be increased or the threshold voltage can be controlled. In the cross-sectional views in FIGS. 38A to 38F, the width of the conductive layer 173 may be shorter than that of the oxide semiconductor layer 130. Moreover, the width of the conductive layer 173 may be shorter than that of the conductive layer 170.

Figure 39A:
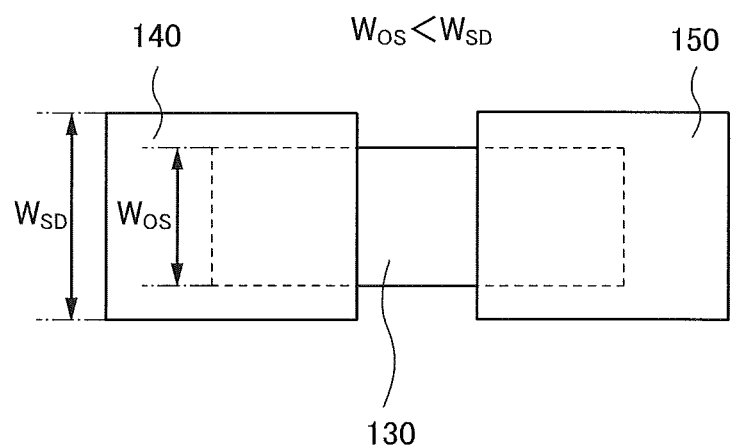
FIGS. 39A and 39B are each a plan view illustrating a transistor.
Figure 39B:
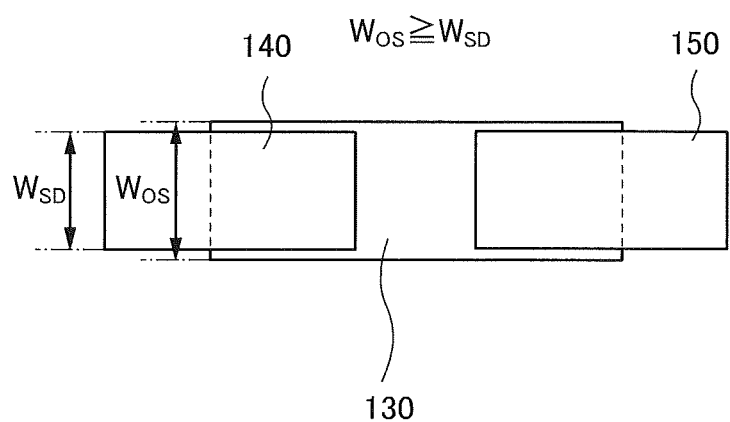

Furthermore, as shown in the top views in FIGS. 39A and 39B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor in one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow through the oxide semiconductor layer 130b. Since current flows through the oxide semiconductor layer 130b, the current is hardly influenced by interface scattering, leading to high on-state current. Note that increasing the thickness of the oxide semiconductor layer 130b can increase the on-state current. The thickness of the oxide semiconductor layer 130b may be, for example, 100 nm to 200 nm.

A semiconductor device including a transistor with any of the above structures can have favorable electrical characteristics.

The structure described above in this embodiment can be combined with any of the structures described in the other embodiments as appropriate.

Embodiment 5

In this embodiment, components of the transistors described in Embodiment 4 are described in detail.

As the substrate 115, a glass substrate, a quartz substrate, a semiconductor substrate, a ceramic substrate, a metal substrate whose surface is subjected to insulation treatment, or the like can be used. Alternatively, a silicon substrate provided with a transistor or a photodiode, which may be further provided with an insulating layer, a wiring, a conductor functioning as a contact plug, or the like over the silicon substrate, can be used. Note that when p-channel transistors are formed using the silicon substrate, a silicon substrate with n$^-$-type conductivity is preferably used. Alternatively, an SOI substrate including an n$^-$-type or i-type silicon layer may be used. In the case where a p-channel transistor is formed on the silicon substrate, it is preferable that a plane where the transistor is formed have a (110) plane orientation. Forming a p-channel transistor on the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen when converted into oxygen atoms is $1.0 \times 10^{19}$ atoms/cm$^3$ or more in thermal desorption spectroscopy (TDS) analysis performed such that the surface temperature is higher than or equal to 100° C. and lower than or equal to 700° C., preferably higher than or equal to 100° C. and lower than or equal to 500° C. In the case where the substrate 115 is provided with another device as described above, the insulating layer 120 also has a function of an interlayer insulating film In that case, the insulating layer 120 is preferably subjected to planarization treatment such as CMP treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are sequentially stacked from the insulating layer 120 side described in this embodiment is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, further preferably 3 times or more as large as that in the oxide semiconductor layer 130b. Any of the above metal elements is strongly bonded to oxygen and thus has a function of suppressing generation of an oxygen vacancy in the oxide semiconductor layers. That is, an oxygen vacancy is less likely to be generated in the oxide semiconductor layers 130a and 130c than in the oxide semiconductor layer 130b.

Oxide semiconductors that can be used for the oxide semiconductor layers 130a to 130c preferably contain at least In or Zn. Both In and Zn are preferably contained. In order to reduce variations in electrical characteristics of the transistor including the oxide semiconductors, a stabilizer is preferably contained in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where in is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 130a to 130c is an In-M-Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when y2 is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, further preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layer 130a.

Note that in order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, further preferably lower than $1\times10^{18}$ atoms/cm$^3$. In addition, the oxide semiconductor layer is controlled to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. In addition, the oxide semiconductor layer is controlled to have a region in which the concentration of nitrogen is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, further preferably lower than $1\times10^{18}$ atoms/cm$^3$.

A transistor in which a highly purified oxide semiconductor film is used for a channel formation region exhibits extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor in one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from this viewpoint, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is forming such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, or 3:1:2 can be used for the oxide semiconductor layer 130b. In the case where the oxide semiconductor layers 130a, 130b, and 130c are formed using the above-described oxides as sputtering targets, the atomic ratios of the oxide semiconductor layers are not necessarily consistent with those of their respective sputtering targets and may vary from those of the sputtering targets within a range of ±20%.

The oxide semiconductor layer 130b of the oxide semiconductor layer 130 serves as a well, so that a channel is formed in the oxide semiconductor layer 130b in the transistor including the oxide semiconductor layer 130. Note that since the conduction band minimums are continuous, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in a positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus makes subsequent process temperatures comparatively high. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor layer that is in contact with any of the above materials, oxygen is released from the oxide semiconductor film and an oxygen vacancy is formed. Hydrogen slightly contained in the film and the oxygen vacancies are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, by using hafnium oxide or aluminum oxide, the thickness of the insulating layer 160 can be larger than silicon oxide; thus, leakage current due to tunnel current can be low. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer as the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 4, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 4. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an effect of making an interface state less likely to be formed is obtained. In the transistor in one embodiment of the present invention in which the oxide semiconductor layer 130 has a three-layer structure, since the oxide semiconductor layer 130b is positioned at the middle of the three-layer structure, an effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may b e performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas, together with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust the thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide or a hafnium amide such as tetrakis(dimethylamide)hafnium DMAH, $Hf[N(CH_3)_2]_4$) or tetrakis(ethylmethylamide)hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film, is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

The structure described above in this embodiment can be combined with any of the structures described in the other embodiments as appropriate.

Embodiment 6

The structure of an oxide semiconductor film that can be used for one embodiment of the present invention is described below.

In this specification, the term "parallel" indicates that the angle formed between two straight lines is greater than or equal to $-10°$ and less than or equal to $10°$, and accordingly includes the case where the angle is greater than or equal to $-5°$ and less than or equal to $5°$. The term "perpendicular" indicates that an angle formed between two straight lines is greater than or equal to $80°$ and less than or equal to $100°$, and accordingly includes the case where the angle is greater than or equal to $85°$ and less than or equal to $95°$.

In this specification, the trigonal and rhombohedral crystal systems are included in the hexagonal crystal system.

An oxide semiconductor film is roughly classified into a non-single-crystal oxide semiconductor film and a single-crystal oxide semiconductor film. The non-single-crystal oxide semiconductor film means any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film In a high-resolution TEM image, a crystal grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization occurs by a slight amount of electron beam used for TEM observation and growth of the crystal part is sometimes found. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers consisting of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Note that an oxide semiconductor film may be a stacked film including two or more films of an amorphous oxide semiconductor film, an a-like OS film, a microcrystalline oxide semiconductor film, and a CAAC-OS film, for example.

The structure described in this embodiment can be combined with any of the structures described in the other embodiments as appropriate.

Embodiment 7

An imaging device in one embodiment of the present invention and a semiconductor device including the imaging device can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the imaging device in one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 40A to 40F illustrate specific examples of these electronic devices.

Figure 40A:
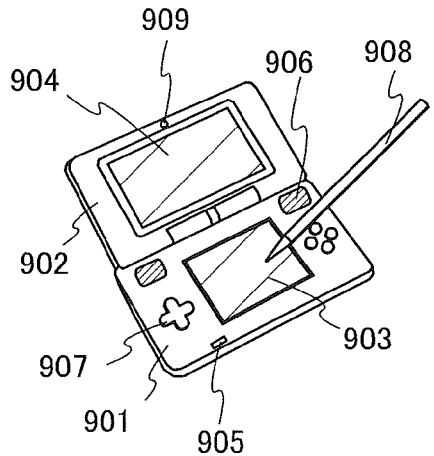
FIGS. 40A to 40F each illustrate an electronic device.

FIG. 40A illustrates a portable game machine, which includes housings 901 and 902, display portions 903 and 904, a microphone 905, speakers 906, an operation key 907, a stylus 908, a camera 909, and the like. Although the portable game machine in FIG. 40A has the two display portions 903 and 904, the number of display portions included in the portable game machine is not limited to this. The imaging device in one embodiment of the present invention can be used for the camera 909.

Figure 40B:
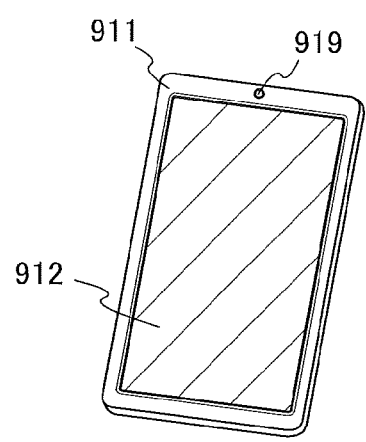

FIG. 40B illustrates a portable data terminal, which includes a housing 911, a display portion 912, a camera 919, and the like. The touch panel function of the display portion 912 enables input and output of information. The imaging device in one embodiment of the present invention can be used for the camera 919.

Figure 40C:
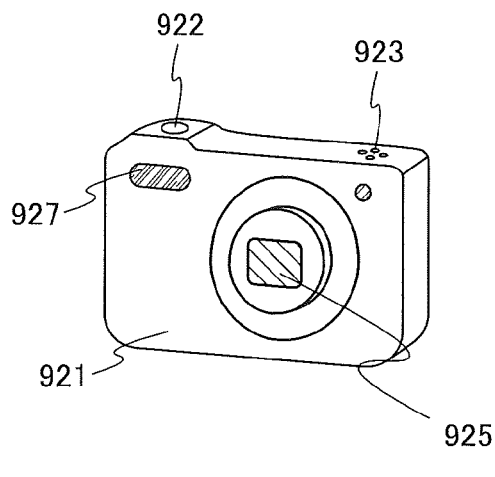

FIG. 40C illustrates a digital camera, which includes a housing 921, a shutter button 922, a microphone 923, a light-emitting portion 927, a lens 925, and the like. The imaging device in one embodiment of the present invention can be provided in a focus position of the lens 925.

Figure 40D:
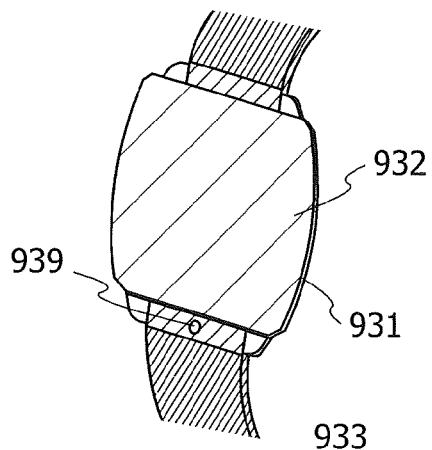

FIG. 40D illustrates a wrist-watch-type information terminal, which includes a housing 931, a display portion 932, a wristband 933, a camera 939, and the like. The display portion 932 may be a touch panel. The imaging device in one embodiment of the present invention can be used for the camera 939.

Figure 40E:
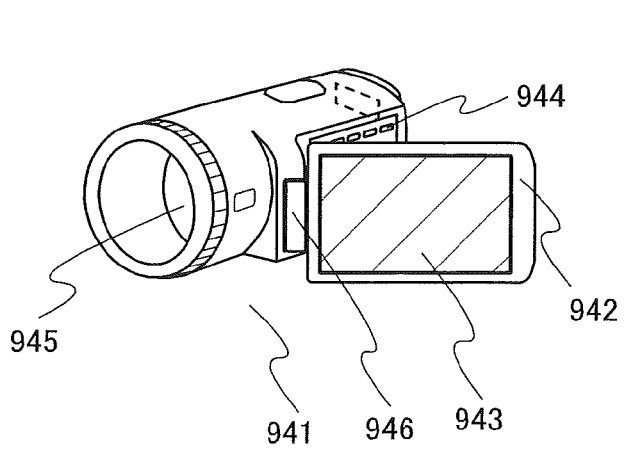

FIG. 40E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and an angle between the first housing 941 and the second housing 942 can be changed with the joint 946. An image displayed on the display portion 943 may be switched in accordance with the angle between the first housing 941 and the second housing 942 at the joint 946. The imaging device in one embodiment of the present invention can be provided in a focus position of the lens 945.

Figure 40F:
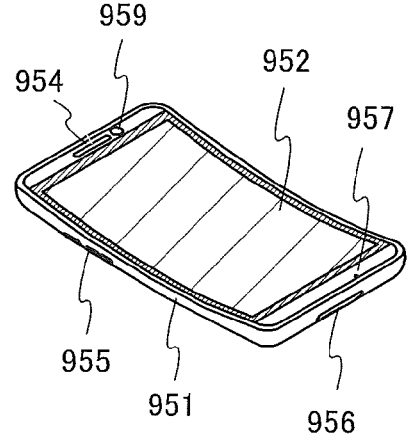

FIG. 40F illustrates a cellular phone, which includes a display portion 952, a microphone 957, a speaker 954, a camera 959, an input/output terminal 956, an operation button 955, and the like in a housing 951. The imaging device in one embodiment of the present invention can be used for the camera 959.

Note that this embodiment can be combined with any of the other embodiments described in this specification as appropriate.

This application is based on Japanese Patent Application serial no. 2014-217221 filed with Japan Patent Office on Oct. 24, 2014, the entire contents of which are hereby incorporated by reference.

What is claimed is:

1. An imaging device comprising:
a first layer;
a second layer; and
a third layer,
wherein the first layer, the second layer, and the third layer overlap with one another,
wherein the first layer includes a first transistor and a second transistor,
wherein the second layer includes a third transistor and a fourth transistor,
wherein each of active layers of the first transistor, the second transistor, the third transistor, and the fourth transistor includes an oxide semiconductor,
wherein the third layer includes a photoelectric conversion element, wherein one of a source and a drain of the first transistor is electrically connected to one of a source and a drain of the second transistor,
wherein the one of the source and the drain of the second transistor is electrically connected to a gate of the third transistor,
wherein one of a source and a drain of the third transistor is electrically connected to one of a source and a drain of the fourth transistor,
wherein one electrode of the photoelectric conversion element is electrically connected to the other one of the source and the drain of the first transistor,
wherein off-state currents of the first transistor and the second transistor are lower than those of the third transistor and the fourth transistor, and
wherein field-effect mobilities of the third transistor and the fourth transistor are higher than those of the first transistor and the second transistor.

2. The imaging device according to claim 1,
wherein the first layer, the second layer, and the third layer are arranged in an order of the first layer, the second layer, and the third layer in a height direction or in an order of the second layer, the first layer, and the third layer in a height direction.

3. The imaging device according to claim 1,
wherein the active layers of the first transistor and the second transistor have larger bandgaps than the active layers of the third transistor and the fourth transistor.

4. The imaging device according to claim 1,
wherein the active layers of the third transistor and the fourth transistor are thicker than the active layers of the first transistor and the second transistor.

5. The imaging device according to claim 1,
wherein one of a source and a drain of the first transistor is electrically connected to one electrode of a capacitor.

6. The imaging device according to claim 1,
wherein the oxide semiconductor includes In, Zn, and M, and
wherein M is Al, Ti, Ga, Sn, Y, Zr, La, Ce, Nd, or Hf.

7. The imaging device according to claim 1,
wherein the photoelectric conversion element includes a photoelectric conversion layer including selenium or a compound containing selenium.

8. An electronic device comprising:
the imaging device according to claim 1; and
a display device.

9. An imaging device comprising:
a first layer;
a second layer;
a third layer; and
a fourth layer,
wherein the first layer, the second layer, the third layer, and the fourth layer overlap with one another,
wherein the first layer includes a photoelectric conversion element,
wherein the second layer includes a first transistor and a second transistor,
wherein the third layer includes a third transistor and a fourth transistor,
wherein the fourth layer includes a fifth transistor,
wherein each of active layers of the first transistor, the second transistor, the third transistor, and the fourth transistor includes an oxide semiconductor,
wherein an active region of the fifth transistor or an active layer of the fifth transistor includes silicon,
wherein the first transistor, the second transistor, the third transistor, and the fourth transistor form a first circuit,
wherein the fifth transistor forms a second circuit,
wherein one of a source and a drain of the first transistor is electrically connected to one of a source and a drain of the second transistor,
wherein the one of the source and the drain of the second transistor is electrically connected to a gate of the third transistor,
wherein one of a source and a drain of the third transistor is electrically connected to one of a source and a drain of the fourth transistor,
wherein one electrode of the photoelectric conversion element is electrically connected to the other one of the source and the drain of the first transistor,
wherein off-state currents of the first transistor and the second transistor are lower than those of the third transistor and the fourth transistor, and
wherein field-effect mobilities of the third transistor and the fourth transistor are higher than those of the first transistor and the second transistor.

10. The imaging device according to claim 9,
wherein the first layer, the second layer, the third layer, and the fourth layer are arranged in an order of the first layer, the second layer, the third layer, and the fourth layer in a height direction or in an order of the first layer, the third layer, the second layer, and the fourth layer in a height direction.

11. The imaging device according to claim 9,
wherein the active layers of the first transistor and the second transistor have larger bandgaps than the active layers of the third transistor and the fourth transistor.

12. The imaging device according to claim 9,
wherein the active layers of the third transistor and the fourth transistor are thicker than the active layers of the first transistor and the second transistor.

13. The imaging device according to claim 9,
wherein one of a source and a drain of the first transistor is electrically connected to one electrode of a capacitor.

14. The imaging device according to claim 9,
wherein the oxide semiconductor includes In, Zn, and M, and
wherein M is Al, Ti, Ga, Sn, Y, Zr, La, Ce, Nd, or Hf.

15. The imaging device according to claim 9,
wherein the photoelectric conversion element includes a photoelectric conversion layer including selenium or a compound containing selenium.

16. An imaging device comprising a stack, the stack comprising:
a first layer;
a second layer;
a third layer; and
a fourth layer,
wherein the first layer, the second layer, the third layer, and the fourth layer overlap with one another,
wherein the first layer includes a photoelectric conversion element,
wherein the second layer includes a first transistor and a second transistor,
wherein the third layer includes a third transistor, a fourth transistor, and a fifth transistor,
wherein the fourth layer includes a sixth transistor,
wherein each of active layers of the first transistor, the second transistor, the third transistor, the fourth transistor, and the fifth transistor includes an oxide semiconductor,
wherein an active region of the sixth transistor or an active layer of the sixth transistor includes silicon, wherein the first transistor, the second transistor, the third transistor, and the fourth transistor form a first circuit, wherein the fifth transistor and the sixth transistor form a second circuit, wherein one of a source and a drain of the first transistor is electrically connected to one of a source and a drain of the second transistor, wherein the one of the source and the drain of the second transistor is electrically connected to a gate of the third transistor, wherein one of a source and a drain of the third transistor is electrically connected to one of a source and a drain of the fourth transistor, wherein one electrode of the photoelectric conversion element is electrically connected to the other one of the source and the drain of the first transistor, wherein off-state currents of the first transistor and the second transistor are lower than those of the third transistor, the fourth transistor, and the fifth transistor, and wherein field-effect mobilities of the third transistor, the fourth transistor, and the fifth transistor are higher than those of the first transistor and the second transistor.

17. The imaging device according to claim 16,
wherein the first layer, the second layer, the third layer, and the fourth layer are arranged in an order of the first layer, the second layer, the third layer, and the fourth layer in a height direction or in an order of the first layer, the third layer, the second layer, and the fourth layer in a height direction.

18. The imaging device according to claim 16,
wherein the active layers of the first transistor and the second transistor have larger bandgaps than the active layers of the third transistor, the fourth transistor, and the fifth transistor.

19. The imaging device according to claim 16,
wherein the active layers of the third transistor, the fourth transistor, and the fifth transistor are thicker than the active layers of the first transistor and the second transistor.

20. The imaging device according to claim 16,
wherein one of a source and a drain of the first transistor is electrically connected to one electrode of a capacitor.

21. The imaging device according to claim 16,
wherein the oxide semiconductor includes In, Zn, and M, and wherein M is Al, Ti, Ga, Sn, Y, Zr, La, Ce, Nd, or Hf.

22. The imaging device according to claim 16,
wherein the photoelectric conversion element includes a photoelectric conversion layer including selenium or a compound containing selenium.

* * * * *